United States Patent
Choi et al.

(10) Patent No.: US 11,682,673 B2
(45) Date of Patent: Jun. 20, 2023

(54) SEMICONDUCTOR DEVICE

(71) Applicant: SAMSUNG ELECTRONICS CO., LTD., Suwon-si (KR)

(72) Inventors: Kyungin Choi, Seoul (KR); Jinbum Kim, Seoul (KR); Haejun Yu, Osan-si (KR); Seung Hun Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 124 days.

(21) Appl. No.: 17/231,502

(22) Filed: Apr. 15, 2021

(65) Prior Publication Data

US 2022/0059534 A1 Feb. 24, 2022

(30) Foreign Application Priority Data

Aug. 18, 2020 (KR) .......................... 10-2020-0103300

(51) Int. Cl.
*H01L 27/092* (2006.01)
*H01L 29/417* (2006.01)
*H01L 29/66* (2006.01)
*H01L 29/78* (2006.01)

(52) U.S. Cl.
CPC .... *H01L 27/0924* (2013.01); *H01L 29/41791* (2013.01); *H01L 29/66553* (2013.01); *H01L 29/66795* (2013.01); *H01L 29/7851* (2013.01)

(58) Field of Classification Search
CPC .............. H01L 29/785; H01L 29/0653; H01L 29/41791; H01L 29/6656; H01L 29/66553; H01L 29/0847
See application file for complete search history.

(56) References Cited

U.S. PATENT DOCUMENTS

| | | |
|---|---|---|
| 8,735,280 B1 | 5/2014 | Yeh et al. |
| 9,324,713 B1 | 4/2016 | Yu et al. |
| 9,679,978 B2 | 6/2017 | Kim et al. |
| 9,847,224 B2 | 12/2017 | Kim et al. |
| 9,875,938 B2 | 1/2018 | Jeong et al. |
| 9,887,094 B1 | 2/2018 | Qi et al. |
| 10,256,237 B2 | 4/2019 | Lee et al. |
| 10,269,932 B1 | 4/2019 | Arya et al. |
| 10,297,690 B2 | 5/2019 | Li et al. |

(Continued)

*Primary Examiner* — Changhyun Yi
(74) *Attorney, Agent, or Firm* — F. Chau & Associates, LLC

(57) ABSTRACT

A semiconductor device includes: a first active pattern on a substrate and including a first active fin and a second active fin; a device isolation layer defining the first active pattern; a gate electrode crossing the first active pattern; a first source/drain pattern and a second source/drain pattern on the first active fin and the second active fin, respectively; an inner fin spacer between the first and second source/drain patterns; and a buffer layer between the first and second active fins, wherein the inner fin spacer includes: a first inner spacer portion contacting the first source/drain pattern; a second inner spacer portion contacting the second source/drain pattern; and an inner extended portion extending from the first and second inner spacer portions, wherein the inner extended portion is between the first and second active fins, wherein the buffer layer has a dielectric constant higher than that of the inner fin spacer.

20 Claims, 60 Drawing Sheets

(56) References Cited

U.S. PATENT DOCUMENTS

| | | |
|---|---|---|
| 10,355,105 B2 | 7/2019 | Lee et al. |
| 2001/0045666 A1* | 11/2001 | Kim ................ H01L 21/76897 |
| | | 257/E21.507 |
| 2001/0051423 A1* | 12/2001 | Kim ................ H01L 21/7682 |
| | | 438/791 |
| 2018/0151161 A1 | 5/2018 | Espeleta et al. |
| 2019/0245076 A1* | 8/2019 | Seong ............... H01L 29/7854 |

* cited by examiner

SEMICONDUCTOR DEVICE

CROSS-REFERENCE TO RELATED APPLICATION

This U.S. non-provisional patent application claims priority under 35 U.S.C. § 119 to Korean Patent Application No. 10-2020-0103300, filed on Aug. 18, 2020, in the Korean Intellectual Property Office, the disclosure of which is incorporated by reference herein in its entirety.

TECHNICAL FIELD

The present inventive concept relates to a semiconductor device, and more particularly, to a semiconductor device including a field effect transistor.

DISCUSSION OF THE RELATED ART

Due to their small-sized, multifunctional, and/or low-cost characteristics, semiconductor devices are being esteemed as useful elements in the electronic industry. The semiconductor devices may be classified, for example, into a semiconductor memory device for storing data, a semiconductor logic device for processing data, and a hybrid semiconductor device including both of memory and logic elements. As the electronic industry advances, there is an increased demand for semiconductor devices with improved characteristics. For example, there is an increasing demand for semiconductor devices with high reliability, high performance, and/or multiple functions. To meet this demand, semiconductor devices are under further development to have increased complexity and/or integration density.

SUMMARY

According to an exemplary embodiment of the present inventive concept, a semiconductor device includes: a first active pattern on a substrate, wherein the first active pattern includes a first active fin and a second active fin, which are adjacent to each other in a first direction; a device isolation layer defining the first active pattern; a gate electrode crossing the first active pattern; a first source/drain pattern and a second source/drain pattern provided on the first active fin and the second active fin, respectively; an inner fin spacer interposed between the first and second source/drain patterns; and a buffer layer provided on the device isolation layer between the first and second active fins, wherein the inner fin spacer includes: a first inner spacer portion contacting the first source/drain pattern; a second inner spacer portion contacting the second source/drain pattern; and an inner extended portion extending from the first and second inner spacer portions, wherein the inner extended portion is between the first and second active fins, wherein the buffer layer has a dielectric constant higher than that of the inner fin spacer.

According to an exemplary embodiment of the present inventive concept, a semiconductor device includes: a substrate having a first active fin and a second active fin, which are spaced apart from each other in a first direction; a device isolation layer defining the first and second active fins; a gate electrode extended in the first direction to cross the first and second active fins; first and second source/drain patterns respectively provided in upper portions of the first and second active fins, and wherein each of the first source/drain pattern and the second source/drain pattern includes a first portion and a second portion on the first portion; an inner fin spacer interposed between the first and second source/drain patterns and in contact with a first side surface of the first portion of each of the first and second source/drain patterns; and a buffer layer provided on the inner fin spacer, wherein the buffer layer has a dielectric constant higher than that of the inner fin spacer.

According to an exemplary embodiment of the present inventive concept, a semiconductor device includes: a first active pattern on a substrate, wherein the first active pattern includes a first active fin and a second active fin spaced apart from each other in a first direction and extending in a second direction crossing the first direction; a device isolation layer provided on the substrate to define the first and second active fins, wherein upper portions of the first and second active fins protrude beyond the device isolation layer; a gate electrode extended in the first direction to cross the first and second active fins; a first source/drain pattern and a second source/drain pattern respectively provided on the first and second active fins and having a same conductivity type, wherein the first and second source/drain patterns being arranged alongside portions of the gate electrode in the first direction; a gate spacer provided on the side portions of the gate electrode and extending in the first direction; a gate capping pattern on the gate electrode; an interlayer insulating layer on the gate capping pattern; an active contact provided to penetrate the interlayer insulating layer and coupled to at least one of the first source/drain pattern or the second source/drain pattern; a silicide pattern interposed between the active contact and the at least one of the first source/drain pattern or the second source/drain pattern; a gate contact penetrating the gate capping pattern and coupled to the gate electrode; an inner fin spacer interposed between the first and second source/drain patterns; a buffer layer provided on the inner fin spacer and having a dielectric constant higher than that of the inner fin spacer; a first metal layer provided on the interlayer insulating layer and electrically connected to the active contact and the gate contact; and a second metal layer provided on the first metal layer and electrically connected to the first metal layer, wherein the gate spacer and the inner fin spacer includes a same material as each other.

BRIEF DESCRIPTION OF THE DRAWINGS

The above and other features of the present inventive concept will become more apparent by describing in detail exemplary embodiments thereof, with reference to the accompanying drawings, in which.

DETAILED DESCRIPTION OF THE EMBODIMENTS

Figure 1:
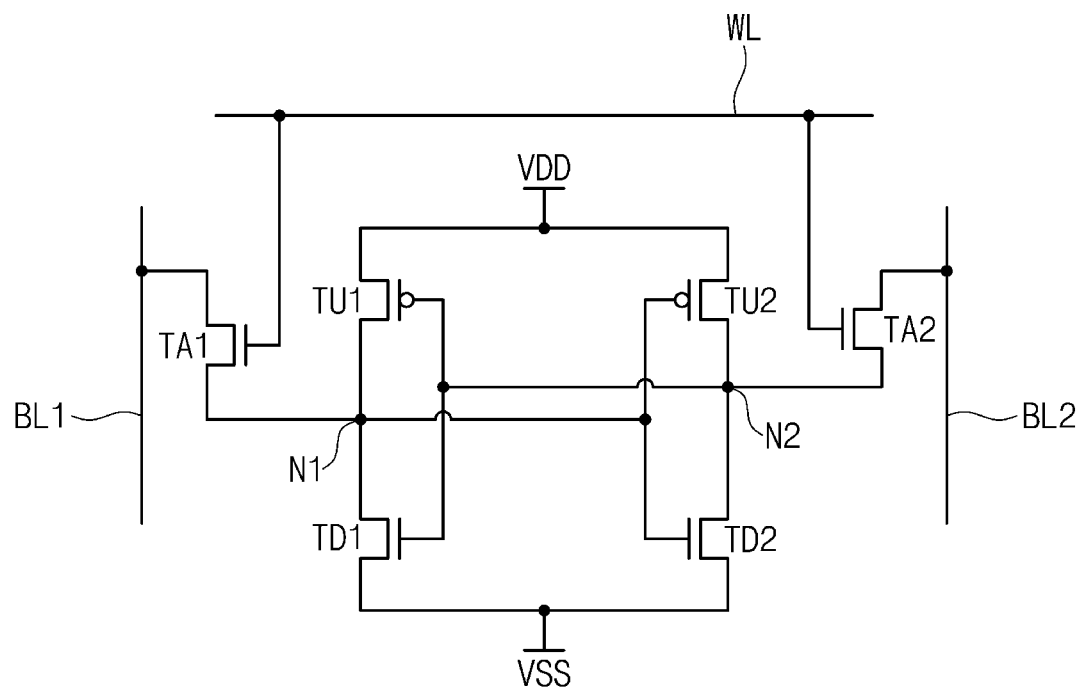
FIG. 1 is a circuit diagram illustrating a static random-access memory (SRAM) cell according to an exemplary embodiment of the present inventive concept.

FIG. 1 is a circuit diagram illustrating an SRAM cell according to an exemplary embodiment of the present inventive concept. Referring to FIG. 1, an SRAM cell according to an exemplary embodiment of the present inventive concept may include a first pull-up transistor TU1, a first pull-down transistor TD1, a second pull-up transistor TU2, a second pull-down transistor TD2, a first access transistor TA1, and a second access transistor TA2. For example, the first and second pull-up transistors TD1 and TD2 and the first and second access transistors TA1 and TA2 may be N-type metal-oxide-semiconductor (NMOS) transistors.

A first source/drain of the first pull-up transistor TU1 and a first source/drain of the first pull-down transistor TD1 may be connected to a first node N1. A second source/drain of the first pull-up transistor TU1 may be connected to a power line VDD, and a second source/drain of the first pull-down transistor TD1 may be connected to a ground line VSS. A gate of the first pull-up transistor TU1 and a gate of the first pull-down transistor TD1 may be electrically connected to each other. The first pull-up transistor TU1 and the first pull-down transistor TD1 may constitute a first inverter. The connected gates of the first pull-up and pull-down transistors TU1 and TD1 may correspond to an input terminal of the first inverter, and the first node N1 may correspond to an output terminal of the first inverter.

A first source/drain of the second pull-up transistor TU2 and a first source/drain of the second pull-down transistor TD2 may be connected to a second node N2. A second source/drain of the second pull-up transistor TU2 may be connected to the power line VDD, and a second source/drain of the second pull-down transistor TD2 may be connected to the ground line VSS. A gate of the second pull-up transistor TU2 and a gate of the second pull-down transistor TD2 may be electrically connected to each other. Thus, the second pull-up transistor TU2 and the second pull-down transistor TD2 may constitute a second inverter. The connected gates of the second pull-up and pull-down transistors TU2 and TD2 may correspond to an input terminal of the second inverter, and the second node N2 may correspond to an output terminal of the second inverter.

The first and second inverters may be combined to constitute a latch structure. For example, the gates of the first pull-up and pull-down transistors TU1 and TD1 may be electrically coupled to the second node N2, and the gates of the second pull-up and pull-down transistors TU2 and TD2 may be electrically connected to the first node N1. A first source/drain of the first access transistor TA1 may be connected to the first node N1, and a second source/drain of the first access transistor TA1 may be connected to a first bit line BL1. A first source/drain of the second access transistor TA2 may be connected to the second node N2, and a second source/drain of the second access transistor TA2 may be connected to a second bit line BL2. Gates of the first and second access transistors TA1 and TA2 may be electrically coupled to a word line WL. As a result, the SRAM cell according to an exemplary embodiment of the present inventive concept may be realized.

Figure 2:
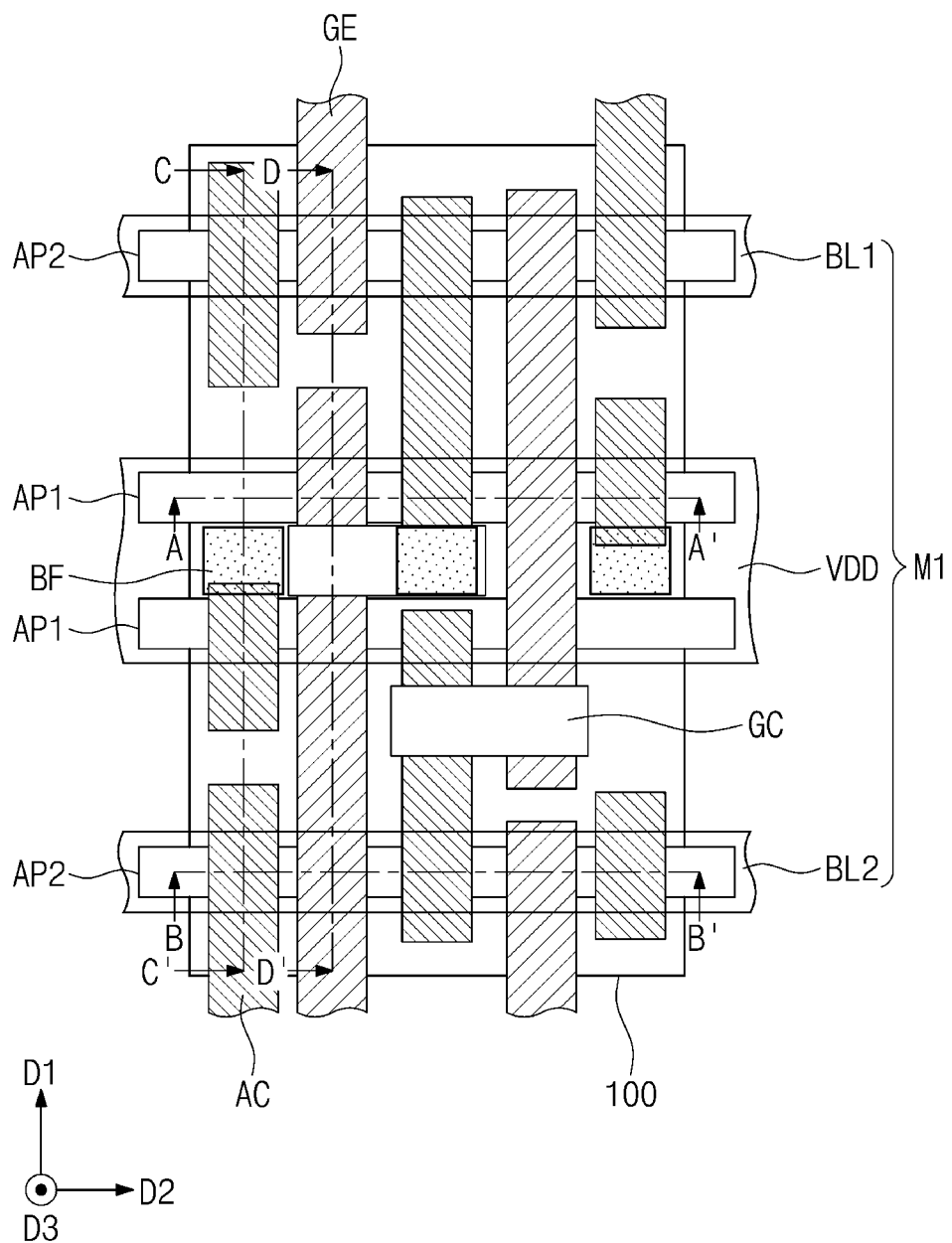
FIG. 2 is a plan view illustrating a semiconductor device according to an exemplary embodiment of the present inventive concept.

FIG. 2 is a plan view illustrating a semiconductor device according to an exemplary embodiment of the present inventive concept. FIGS. 3A to 3D are sectional views respectively taken along lines A-A', B-B', C-C', and D-D' of FIG. 2. FIGS. 4A to 4D are sectional views of a portion M of FIG. 3C. In detail, FIG. 2 is a plan view illustrating an SRAM cell according to the circuit diagram of FIG. 1.

Referring to FIGS. 2 and 3A to 3D, a device isolation layer ST may be provided on a substrate 100 to realize the SRAM cell. The device isolation layer ST may form first and second active patterns AP1 and AP2. For example, the substrate 100 may be a semiconductor substrate that is formed of or includes silicon, germanium, silicon-germanium, a compound semiconductor material, or the like. The device isolation layer ST may be formed of or include at least one of insulating materials (e.g., silicon oxide).

The first and second active patterns AP1 and AP2 may be portions of the substrate 100. Trenches TR may be formed between the first and second active patterns AP1 and AP2, which are adjacent to each other. The device isolation layer ST may be provided to fill the trenches TR. Upper portions of the first and second active patterns AP1 and AP2 may be fin-shaped patterns vertically protruding above the device isolation layer ST. For example, the first active pattern AP1 may include a first active fin AF1 and a second active fin AF2, which are spaced apart from each other in a first direction D1. When measured in the first direction D1, a width between the first and second active fins AF1 and AF2, which are adjacent to each other, may be smaller than a width between the first and second active patterns AP1 and AP2, which are adjacent to each other.

First and second source/drain patterns SD1 and SD2 may be epitaxial patterns, which are formed by a selective epitaxial growth process. As an example, top surfaces of the first and second source/drain patterns SD1 and SD2 may be located at substantially the same level as top surfaces of first and second channel patterns CH1 and CH2. As another example, the top surfaces of the first and second source/drain patterns SD1 and SD2 may be located at a level higher than the top surfaces of the first and second channel patterns CH1 and CH2.

The first and second source/drain patterns SD1 and SD2 may be formed of or include a semiconductor material that is the same as or different from the substrate 100. For example, the first source/drain patterns SD1 may contain a semiconductor material whose lattice constant is larger than a lattice constant of the semiconductor material of the substrate 100. Accordingly, the first source/drain patterns SD1 may exert a compressive stress on the first channel patterns CH1. For example, the first source/drain patterns SD1 may be formed of or include silicon-germanium (SiGe). For example, the second source/drain patterns SD2 may include the same material as the semiconductor material of the substrate 100. For example, the second source/drain patterns SD2 may be formed of or include silicon (Si).

An inner fin spacer IFS may be interposed between the first source/drain patterns SD1, which are adjacent to each other. For example, the inner fin spacer IFS may be provided between the first active fin AF1 and the second active fin AF2. The inner fin spacer IFS may be provided on the device isolation layer ST between the first and second active fins AF1 and AF2, which are adjacent to each other.

The inner fin spacer IFS may include inner spacer portions ISP1 and ISP2 and an inner extended portion IEP. The inner fin spacer IFS may include a first inner spacer portion ISP1, which is in contact with the first source/drain pattern SD1 provided on an upper portion of the first active fin AF1, and a second inner spacer portion ISP2, which is in contact with the first source/drain pattern SD1 provided on an upper portion of the second active fin AF2. In an exemplary embodiment of the present inventive concept, the first and second inner spacer portions ISP1 and ISP2 may have substantially the same shape. For example, a top surface of the first inner spacer portion ISP1 may be located at substantially the same level as a top surface of the second inner spacer portion ISP2. As another example, the first and second inner spacer portions ISP1 and ISP2 may have different shapes from each other.

The inner fin spacer IFS may further include the inner extended portion IEP, which is extended from the first and second inner spacer portions ISP1 and ISP2 to a region on the device isolation layer ST between the first and second active fins AF1 and AF2. For example, the inner extend portion IEP may be disposed between the first inner spacer portion ISP1 and the second inner spacer portion ISP2. The inner fin spacer IFS may be formed of or include the same material as a gate spacer GS, which will be described below.

An outer fin spacer OFS may be provided between the first and second active patterns AP1 and AP2, which are adjacent to each other. The outer fin spacer OFS may be interposed between the first and second source/drain patterns SD1 and SD2, which are adjacent to each other. The outer fin spacer OFS may include an outer spacer portion OSP, which is in contact with the first source/drain pattern SD1, and an outer extended portion OEP, which is extended from the outer spacer portion OSP to a region on the device isolation layer ST between the first and second active patterns AP1 and AP2. For example, the outer extended portion OEP may be disposed between adjacent outer spacer portions OSP. The outer fin spacer OFS may be formed of or include the same material as a gate spacer GS, which will be described below. A distance between the first and second active fins AF1 and AF2 may be smaller than a distance between the second active fin AF2 and the second active pattern AP2. In addition, the distance between the first and second active fins AF1 and AF2 may be smaller than a distance between the first active fin AF1 and the second active pattern AP2. Thus, a width of the inner fin spacer IFS in the first direction D1 may be smaller than a width of the outer fin spacer OFS in the first direction D1.

Since the inner extended portion IEP and the outer extended portion OEP are extended on the regions on the device isolation layer ST, the device isolation layer ST may be prevented from being recessed. For example, the inner extended portion IEP and the outer extended portion OEP may prevent the device isolation layer ST from being recessed in a pre-cleaning process. Thus, it may be possible to reduce parasitic capacitance of the semiconductor device and thereby to improve operation characteristics (e.g., an operation speed) of the semiconductor device.

A buffer layer BF may be provided on the inner fin spacer IFS. When viewed in a plan view, the buffer layer BF may be adjacent to gate electrodes GE, which will be described below. For example, the buffer layer BF may be provided on the inner extended portion IEP and may be interposed between the first and second inner spacer portions ISP1 and ISP2.

The buffer layer BF may be formed of or include a material whose dielectric constant is higher than that of the inner fin spacer IFS. The buffer layer BF may be formed of or include at least one of materials, which are highly resistant to a dry etching process and are lowly resistant to a wet etching process. As an example, the buffer layer BF may be formed of or include aluminum oxide ($Al_2O_3$). As another example, the buffer layer BF may be formed of or include aluminum oxide ($Al_2O_3$) doped with at least one of yttrium (Y), hafnium (Hf), zirconium (Zr), or manganese (Mn). As other example, the buffer layer BF may be formed of or include yttrium oxide ($Y_2O_3$) doped with at least one of hafnium (Hf), zirconium (Zr), or manganese (Mn).

A top surface of the buffer layer BF may be located at a level that is substantially the same as or lower than a level of a top surface of the inner fin spacer IFS. As an example, the buffer layer BF may have a thickness of about 1 nm to about 50 nm.

Gate electrodes GE may be provided to cross the first and second active patterns AP1 and AP2 or may be extended in the first direction D1. The gate electrodes GE may be vertically overlapped with the first and second channel patterns CH1 and CH2. As an example, the gate electrodes GE may be formed of or include at least one of conductive metal nitrides (e.g., titanium nitride or tantalum nitride) or metallic materials (e.g., titanium, tantalum, tungsten, copper, or aluminum).

A separation pattern SP may be interposed between the gate electrodes GE, which are adjacent to each other in the first direction D1. The separation pattern SP may separate the adjacent gate electrodes GE from each other. The gate electrodes GE may be provided on the top surface of the first channel pattern CH1 and at least one side surface of the first channel pattern CH1. The gate electrodes GE may be provided on the top surface of the second channel pattern CH2 and at least one side surface of the second channel pattern CH2. For example, the transistor according to the present embodiment may be a three-dimensional field-effect transistor (e.g., FinFET), in which the gate electrode is provided to three-dimensionally surround the channel patterns.

A pair of gate spacers GS may be disposed on both side surfaces of each of the gate electrodes GE. The gate spacers GS may be extended along the gate electrodes GE and in the first direction D1. Top surfaces of the gate spacers GS may be higher than the top surfaces of the gate electrodes GE. For example, the top surfaces of the gate spacers GS may be coplanar with a top surface of a first interlayer insulating layer 110, which will be described below. The gate spacers GS may be formed of or include at least one of SiCN, SiCON, or SiN. As another example, the gate spacers GS may be a multi-layered structure, which includes at least two different materials of SiCN, SiCON, or SiN.

Gate dielectric patterns GI may be interposed between the gate electrodes GE and the first and second active patterns AP1 and AP2. The gate dielectric patterns GI may be respectively extended along bottom surfaces of the gate electrodes GE.

Figure 3A:
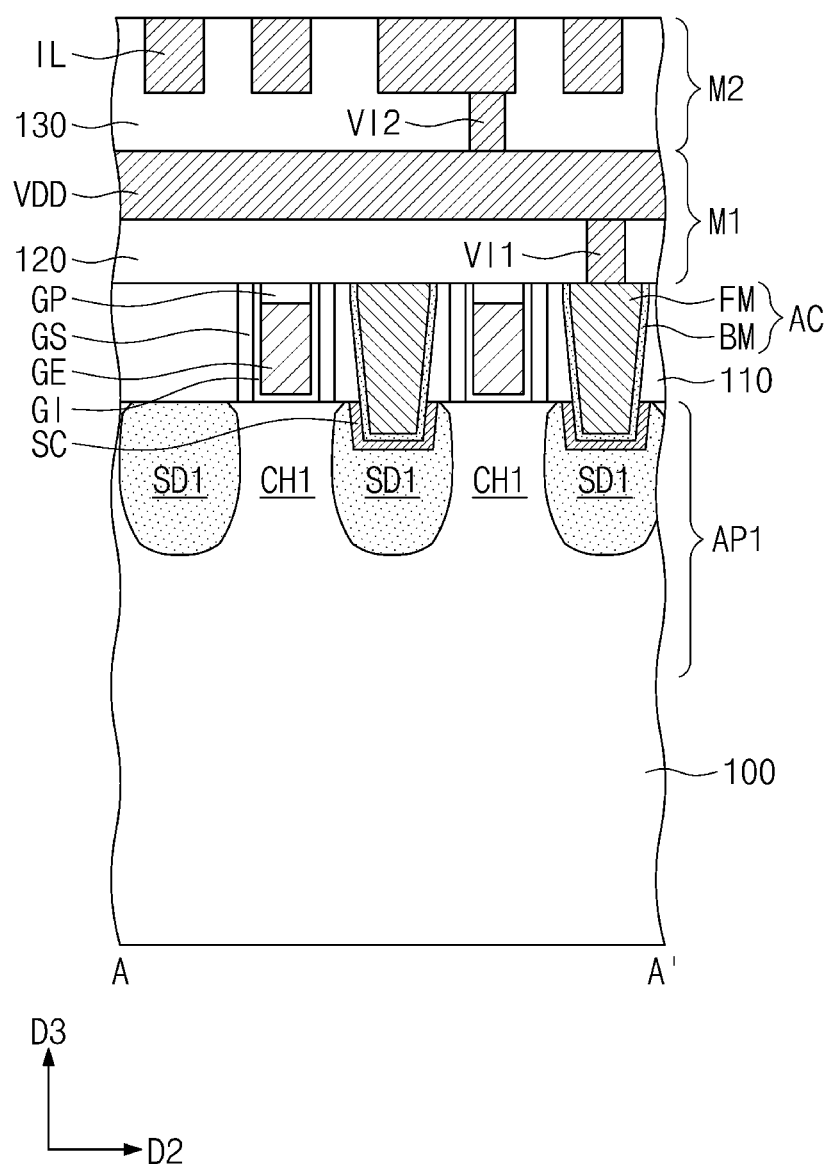
FIGS. 3A, 3B, 3C and 3D are sectional views respectively taken along lines A-A', B-B', C-C', and D-D' of FIG. 2.
Figure 3B:
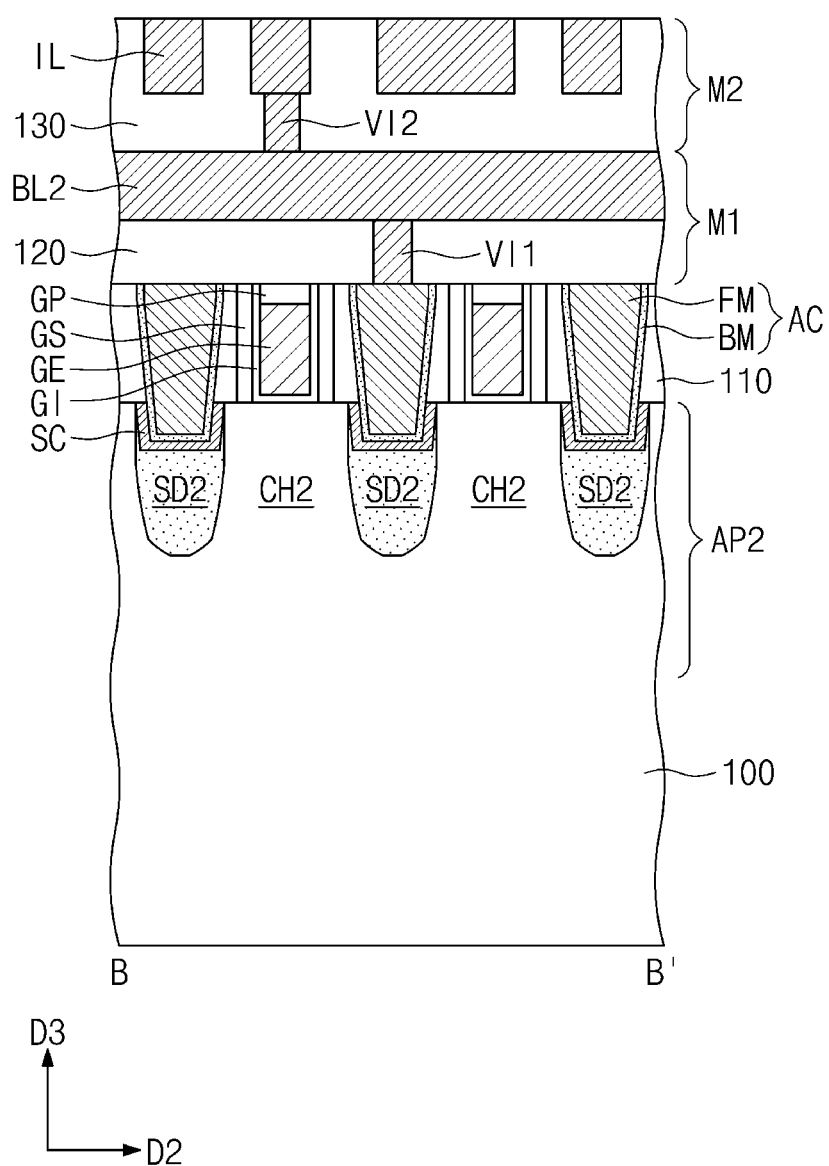
Figure 3C:
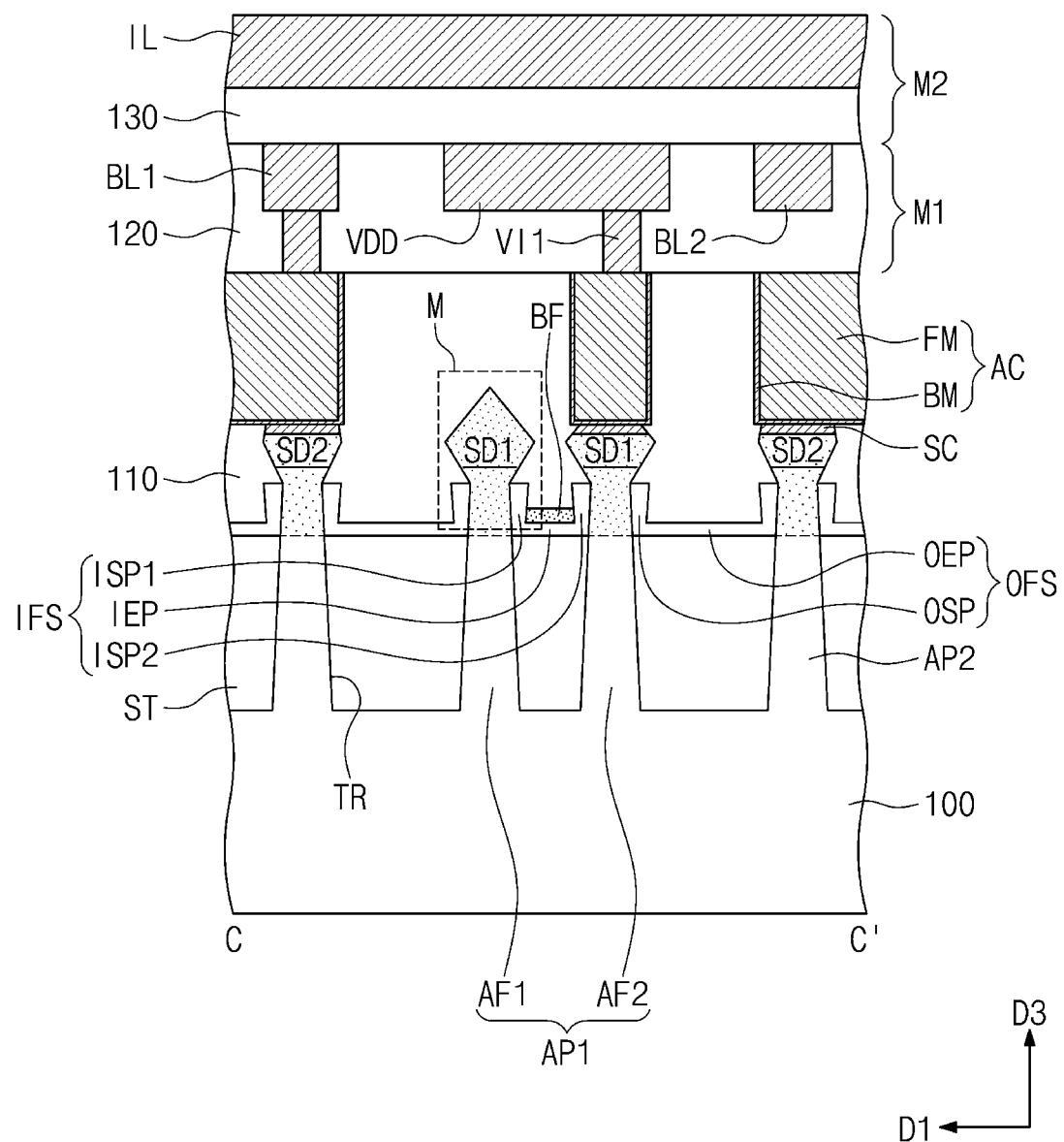
Figure 3D:
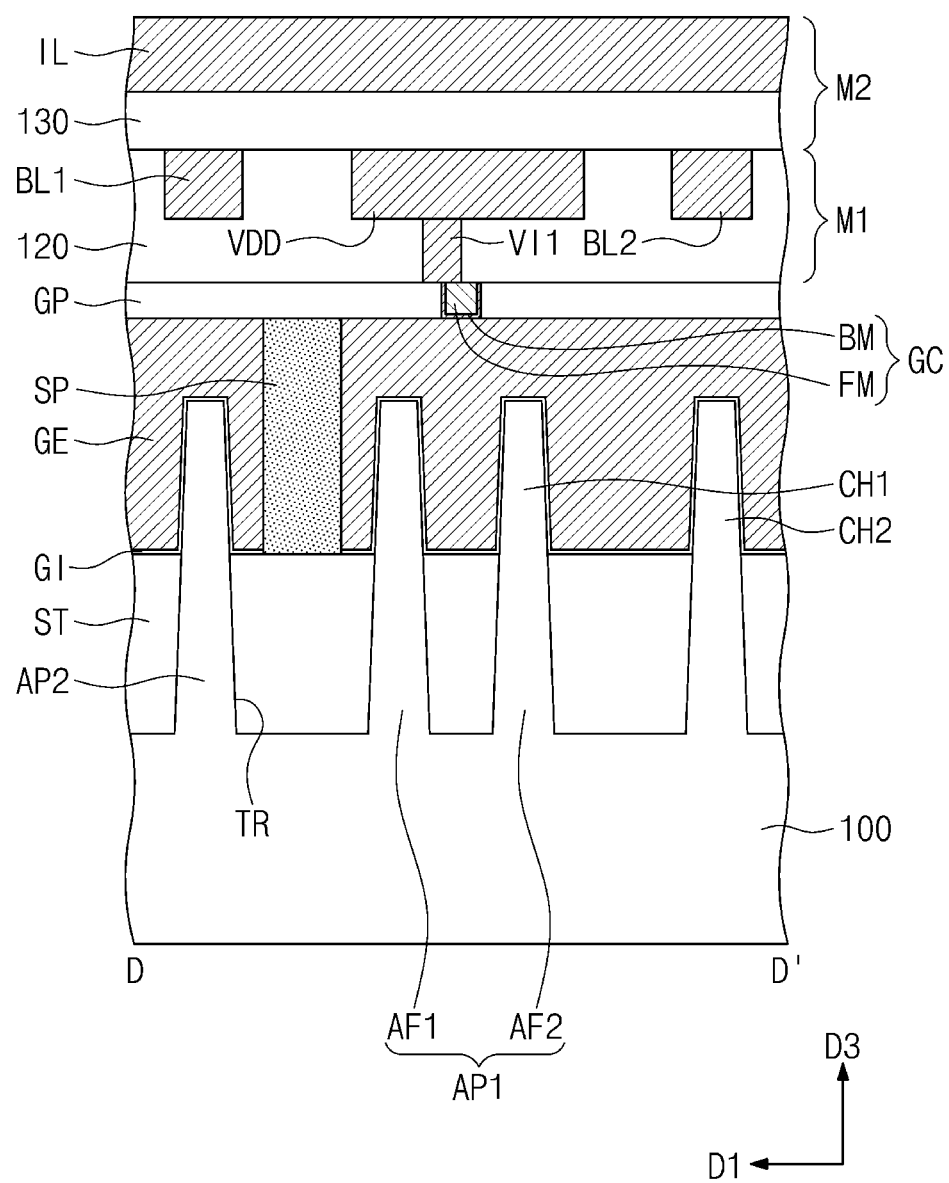

Referring to FIG. 3D, the gate dielectric pattern GI may cover the top surface of the first channel pattern CH1 and the at least one side surface of the first channel pattern CH1. The gate dielectric pattern GI may cover the top surface of the second channel pattern CH2 and the at least one side surface of the second channel pattern CH2.

The gate dielectric patterns GI may be formed of or include at least one of high-k dielectric materials. The high-k dielectric materials may include hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

A gate capping pattern GP may be provided on each of the gate electrodes GE. The gate capping patterns GP may be extended along the gate electrodes GE and in the first direction D1. The gate capping pattern GP may be interposed between the pair of the gate spacers GS. The gate capping patterns GP may be formed of or include at least one of materials, which are selected to have an etch selectivity with respect to first to third interlayer insulating layers 110, 120, and 130 to be described below. For example, the gate capping patterns GP may be formed of or include at least one of SiON, SiCN, SiCON, or SiN.

A first interlayer insulating layer 110 may be provided on the substrate 100. The first interlayer insulating layer 110 may cover the gate spacers GS and the first and second source/drain patterns SD1 and SD2. For example, a top surface of the first interlayer insulating layer 110 may be substantially coplanar with the top surfaces of the gate capping patterns GP and the top surfaces of the gate spacers GS.

Active contacts AC may be provided between adjacent gate electrodes GE. The active contacts AC may be provided to penetrate the first interlayer insulating layer 110 and may be coupled to the first and second source/drain patterns SD1 and SD2. For example, active contacts AC may have top surfaces that are coplanar with the top surface of the first interlayer insulating layer 110.

Each of the active contacts AC may be a self-aligned contact. For example, the active contacts AC may be formed in a self-aligned manner by the gate capping pattern GP and the gate spacer GS. For example, the active contacts AC may cover at least a portion of a side surface of the gate spacer GS.

Silicide patterns SC may be interposed between the active contacts AC and the first source/drain patterns SD1 and between the active contacts AC and the second source/drain patterns SD2. The active contacts AC may be electrically connected to the source/drain pattern SD1 and SD2 through the silicide pattern SC. The silicide pattern SC may be formed of or include at least one of metal silicide materials (e.g., titanium silicide, tantalum silicide, tungsten silicide, nickel silicide, and cobalt silicide).

Gate contacts GC may be provided on the gate electrodes GE. Each of the gate contacts GC may be provided to penetrate the gate capping pattern GP and may be coupled to the gate electrode GE. The gate contacts GC may have top surfaces that are coplanar with the top surface of the first interlayer insulating layer 110. The gate contacts GC may have bottom surfaces that are located at a higher level than that of bottom surfaces of the active contacts AC.

Each of the active and gate contacts AC and GC may include a conductive pattern FM and a barrier pattern BM enclosing the conductive pattern FM. The conductive pattern FM may be formed of or include at least one metal of, for example, aluminum, copper, tungsten, molybdenum, or cobalt. The barrier pattern BM may cover side and bottom surfaces of the conductive pattern FM. The barrier pattern BM may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

A second interlayer insulating layer 120 may be provided on the first interlayer insulating layer 110. A third interlayer insulating layer 130 may be provided on the second interlayer insulating layer 120. As an example, the first to third interlayer insulating layers 110, 120, and 130 may be formed of or include silicon oxide.

A first metal layer M1 may be provided in the second interlayer insulating layer 120. The first metal layer M1 may include the first bit line BL1, a second bit line BL2, and the power line VDD. The first bit line BL1, the second bit line BL2, and the power line VDD may be extended in a second direction D2 to be parallel to each other. A line width of the power line VDD may be larger than a line width of each of the first and second bit lines BL1 and BL2.

The first and second bit lines BL1 and BL2 and the power line VDD of the first metal layer M1 may be electrically connected to the active and gate contacts AC and GC through a first via VI1.

A second metal layer M2 may be provided in the third interlayer insulating layer 130. The second metal layer M2 may include interconnection patterns IL. The interconnection patterns IL may be electrically connected to the first metal layer M1 through second vias VI2. For example, the interconnection patterns IL may be electrically connected to the first metal layer M1 through the second vias VI2.

FIGS. 4A to 4L are sectional views of a portion M of FIG. 3C. Hereinafter, various embodiments of the inner and outer fin spacers IFS and OFS will be described in more detail with reference to FIGS. 4A to 4L.

Figure 4A:
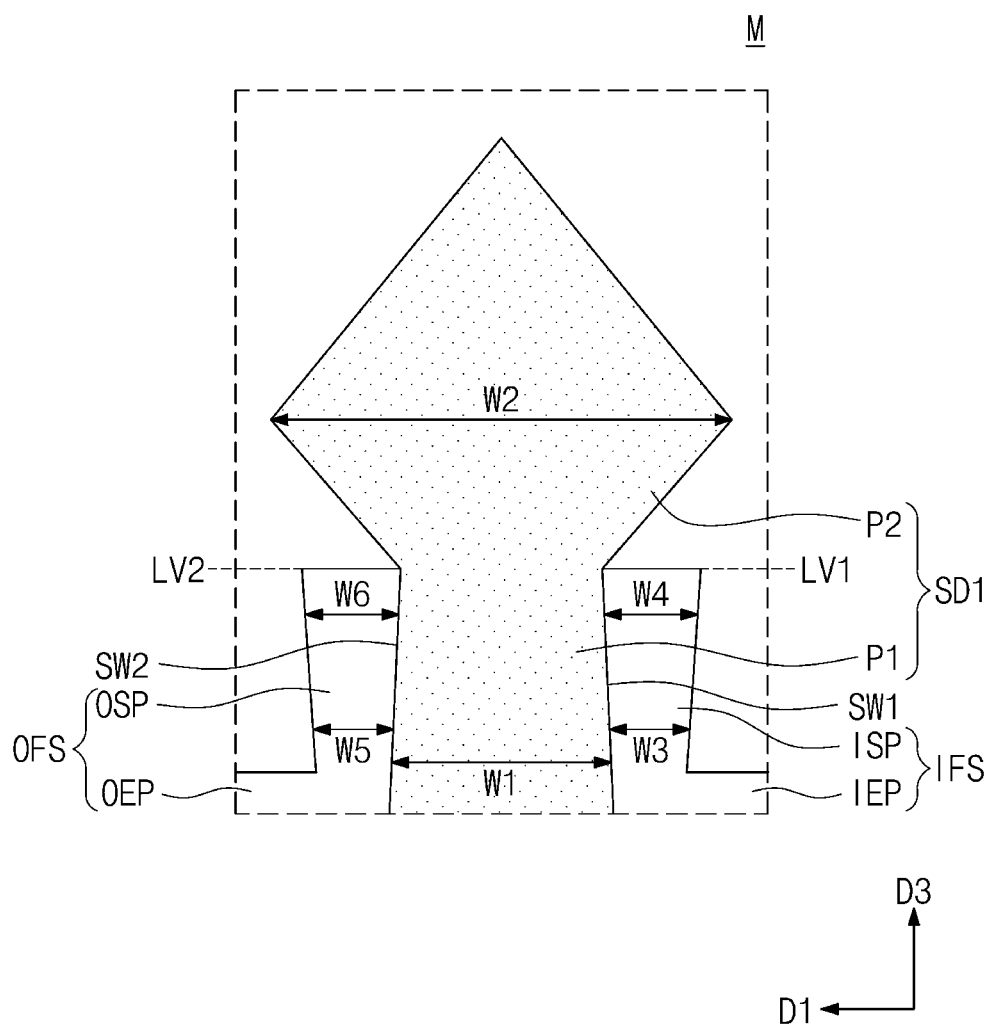
FIGS. 4A, 4B, 4C, 4D, 4E, 4F, 4G, 4H, 4I, 4J, 4K and 4L are sectional views of a portion M of FIG. 3C.

Referring to FIGS. 3C and 4A, the first source/drain pattern SD1 may include a first portion P1, which is interposed between the inner and outer fin spacers IFS and OFS, and a second portion P2, which is provided on the first portion P1. The first portion P1 may be in contact with the inner and outer fin spacers IFS and OFS, and the second portion P2 may be exposed by the inner and outer fin spacers IFS and OFS. The largest width of the first portion P1 in the first direction D1 may be a first width W1, and the largest width of the second portion P2 in the first direction D1 may be a second width W2. The first width W1 may be smaller than the second width W2. The second width W2 may be the largest width of the first source/drain pattern SD1.

Due to the presence of the inner and outer fin spacers IFS and OFS, the first source/drain pattern SD1 may be prevented from being horizontally grown. For example, the second width W2, which is the largest width of the first source/drain pattern SD1, may be reduced by the inner and outer fin spacers IFS and OFS. Thus, it may be possible to prevent a short circuit from being formed between adjacent first source/drain patterns SD1 and to increase an integration density of the semiconductor device.

The first portion P1 of the first source/drain pattern SD1 may include a first side surface SWI and a second side surface SW2. The first side surface SW1 may be a side surface that is adjacent to the device isolation layer ST between the first and second active fins AF1 and AF2 that are adjacent to each other. The second side surface SW2 may be a side surface that is adjacent to the device isolation layer ST between the first and second active patterns AP1 and AP2 that are adjacent to each other. The first side surface SWI and the second side surface SW2 may be opposite to each other in the first direction DI.

The first side surface SW1 of the first source/drain pattern SD1 may be in contact with the inner fin spacer IFS. The second side surface SW2 of the first source/drain pattern SD1 may be in contact with the outer fin spacer OFS.

An inner spacer portion ISP of the inner fin spacer IFS and the outer spacer portion OSP of the outer fin spacer OFS may be substantially the same shape. A width of the bottommost portion of the inner spacer portion ISP in the first direction D1 may be a third width W3, and a width of the topmost portion of the inner space portion ISP in the first direction D1 may be a fourth width W4. The third width W3 may be smaller than the fourth width W4. A width of the bottommost portion of the outer spacer portion OSP in the first direction D1 may be a fifth width W5, and a width of the topmost portion of the outer spacer portion OSP in the first direction D1 may be a sixth width W6. The fifth width W5 may be smaller than the sixth width W6. For example, the topmost portion of each of the first and second inner spacer portions ISP1 and ISP2 and the outer spacer portion OSP may have a width larger than that of the bottommost portion thereof.

The highest level of the top surface of the inner fin spacer IFS may be positioned at a first level LV1. The highest level of the top surface of the outer fin spacer OFS may be positioned at a second level LV2. The first and second levels LV1 and LV2 may be substantially the same level. For example, the top surface of the inner fin spacer IFS and the top surface of the outer fin spacer OFS may be located at substantially the same level. Thus, it may be possible to control recesses, which may be formed in upper portions of the first and second active patterns AP1 and AP2, to a relatively uniform depth. As a result, operation characteristics (e.g., an operation speed) of the semiconductor device may be improved.

Figure 4B:
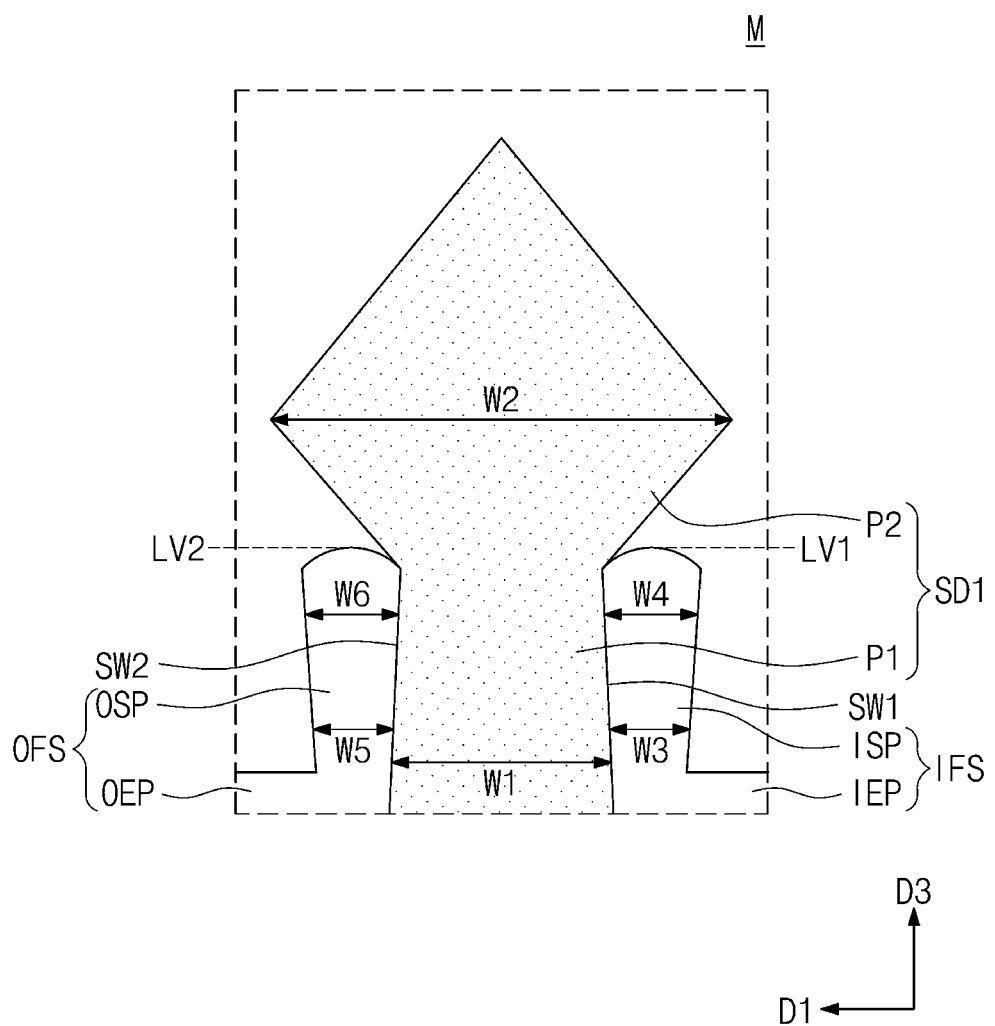
Figure 4C:
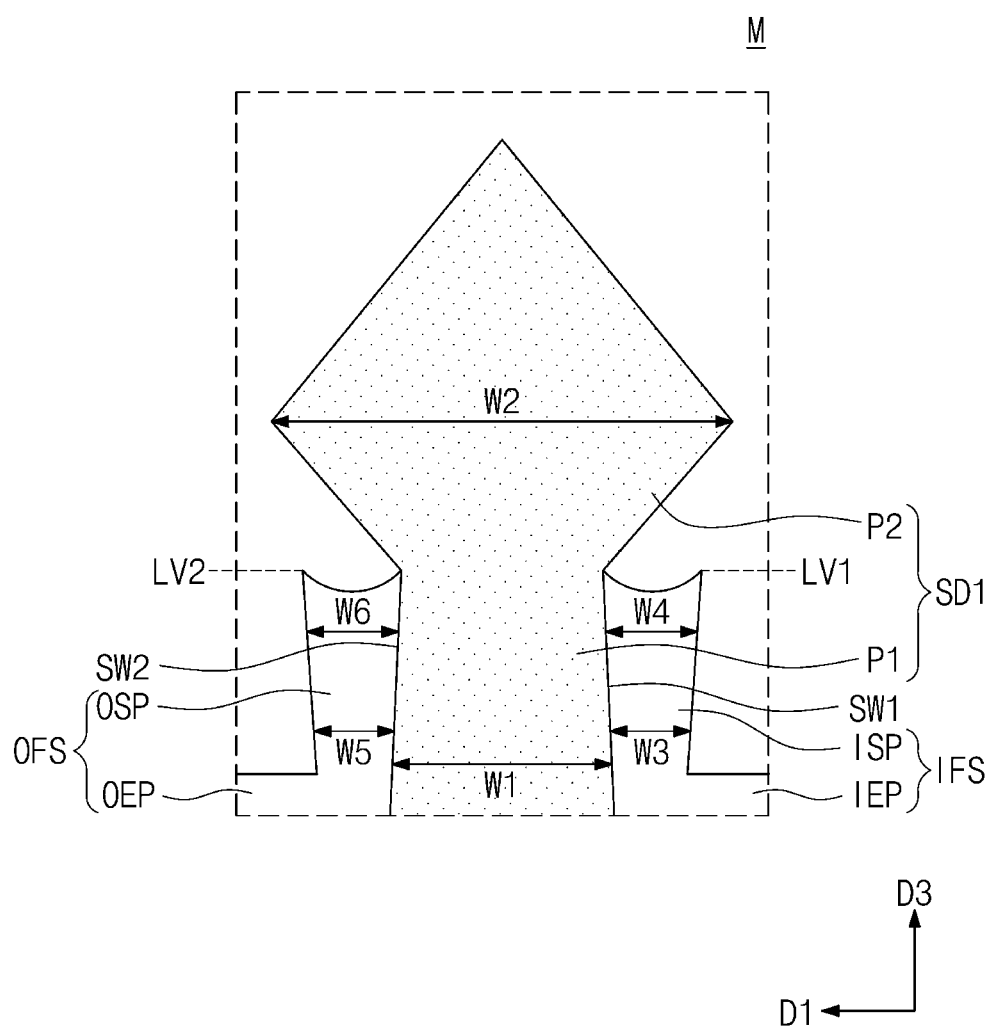

Referring to FIGS. 4B and 4C, the top surface of each of the inner spacer portion ISP and the outer spacer portion OSP may have a non-flat profile. In the present embodiment, an element different from that of FIG. 4A will be described without description of overlapping elements.

Referring to FIG. 4B, each of the inner spacer portion ISP and the outer spacer portion OSP may be formed to have a rounded top surface. As an example, the top surface of each of the inner spacer portion ISP and the outer spacer portion OSP may have a convex profile protruding toward, for example, the second portion P2. Referring to FIG. 4C, the top surface of each of the inner spacer portion ISP and the outer spacer portion OSP may have a concave profile protruding in a direction toward, for example, a top surface of the device isolation layer ST.

The highest level of the top surface of the inner fin spacer IFS may be the first level LV1. The highest level of the top surface of the outer fin spacer OFS may be the second level LV2. The first and second levels LV1 and LV2 may be substantially the same level.

Figure 4D:
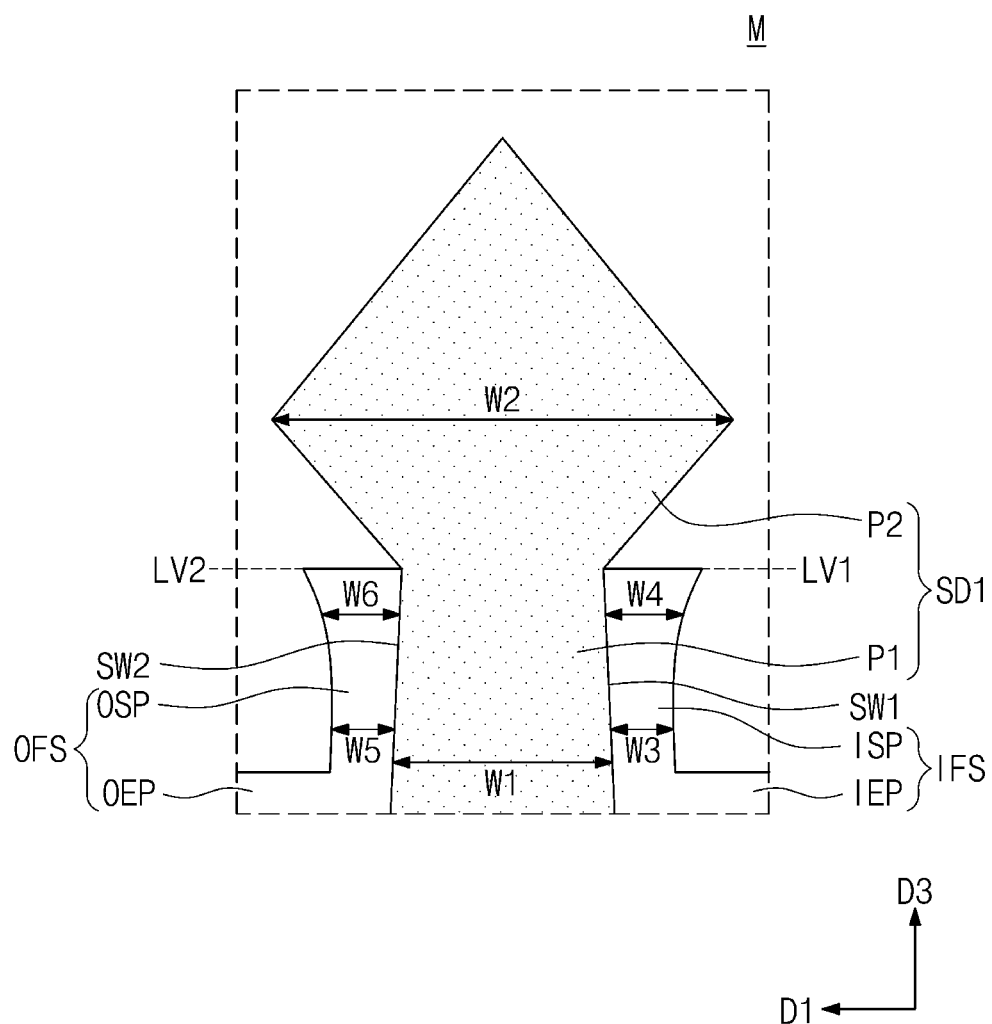

Referring to FIG. 4D, side surfaces of the inner spacer portion ISP and the outer spacer portion OSP may have a non-flat profile. In the present embodiment, an element different from that of FIG. 4A will be described without description of overlapping or already described elements. For example, the side surface of the inner spacer portion ISP facing the first side surface SW1 of the first source/drain pattern SD1 may have a non-flat profile, and the side surface of the outer spacer portion OSP facing the second side surface SW2 may also have a non-flat profile. The topmost portion of each of the first and second inner spacer portions ISP1 and ISP2 and the outer spacer portion OSP may have a width larger than the bottommost portion of the first and second inner spacer portions ISP1 and ISP2 and the outer spacer portion OSP.

In an exemplary embodiment of the present inventive concept, the first and second inner spacer portions ISP1 and ISP2 and the outer spacer portion OSP may have the same widths as each other or different widths from each other.

Figure 4E:
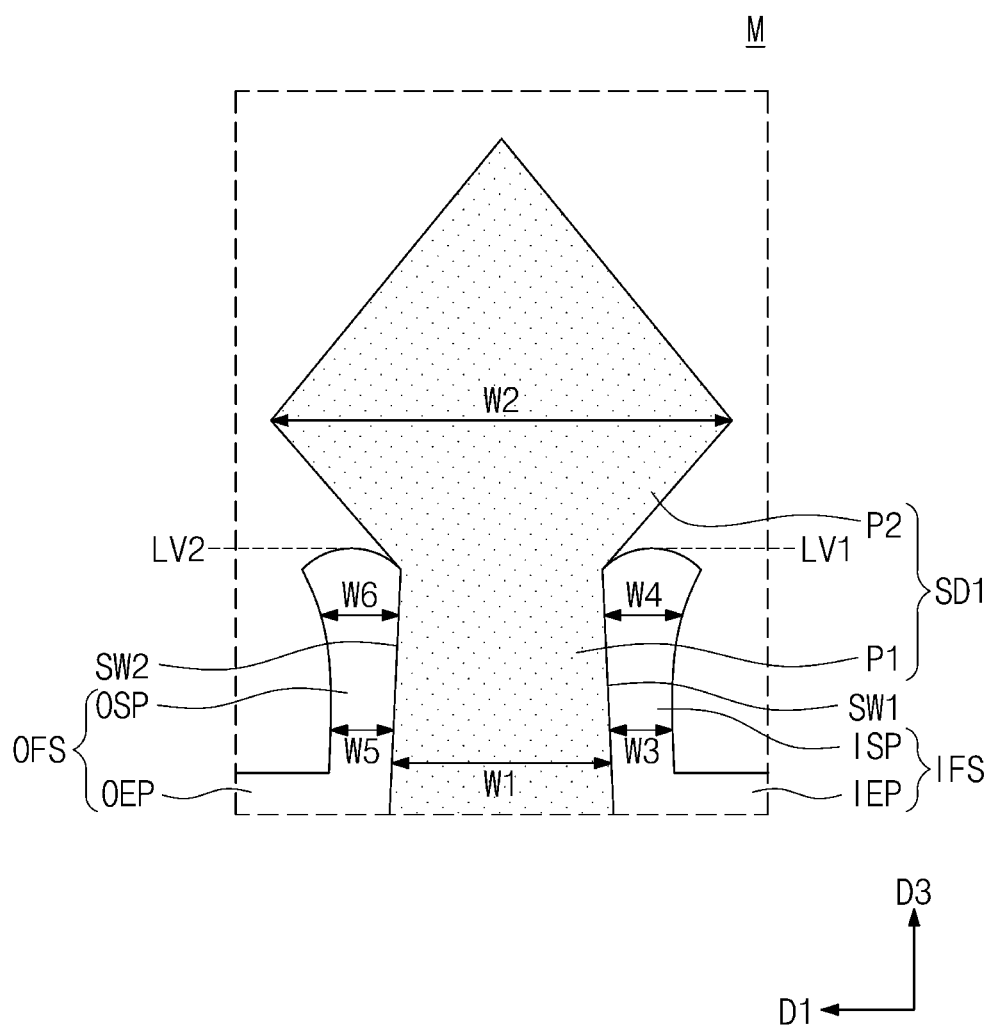
Figure 4F:
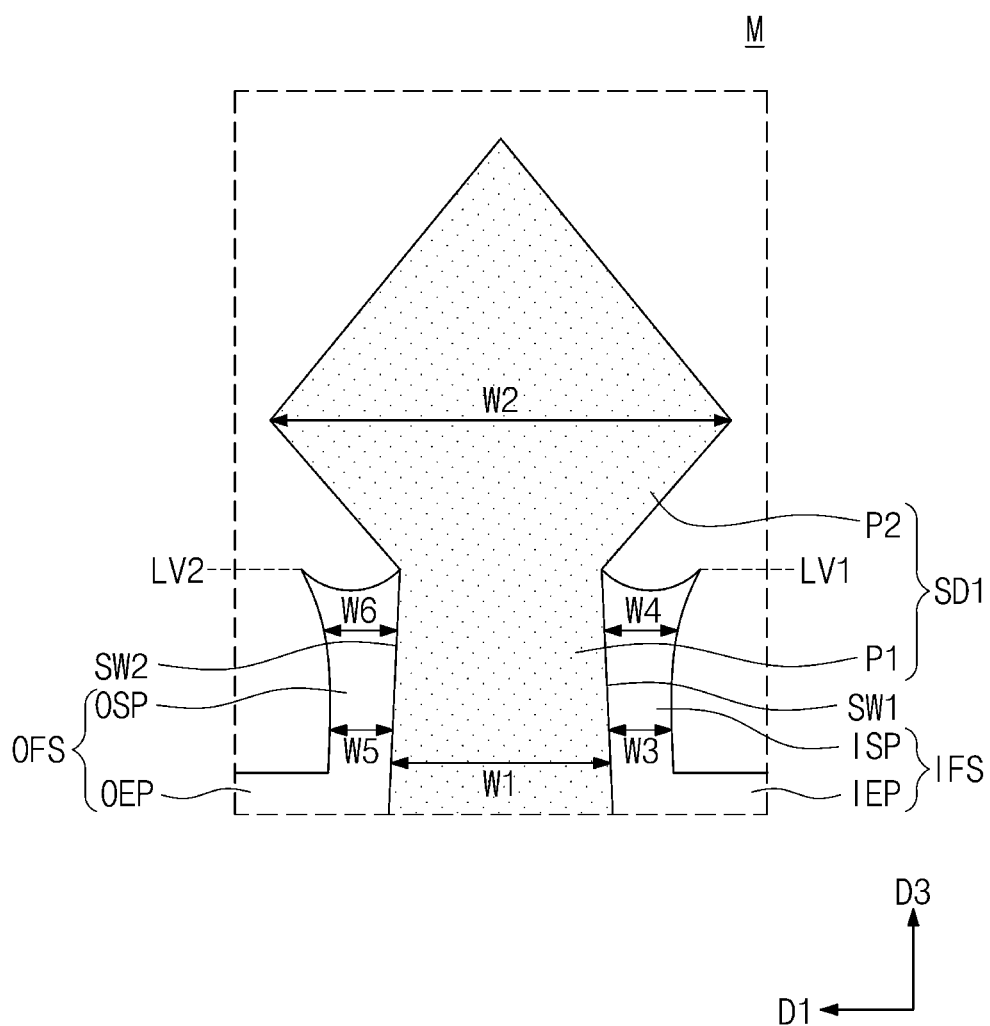
Figure 4G:
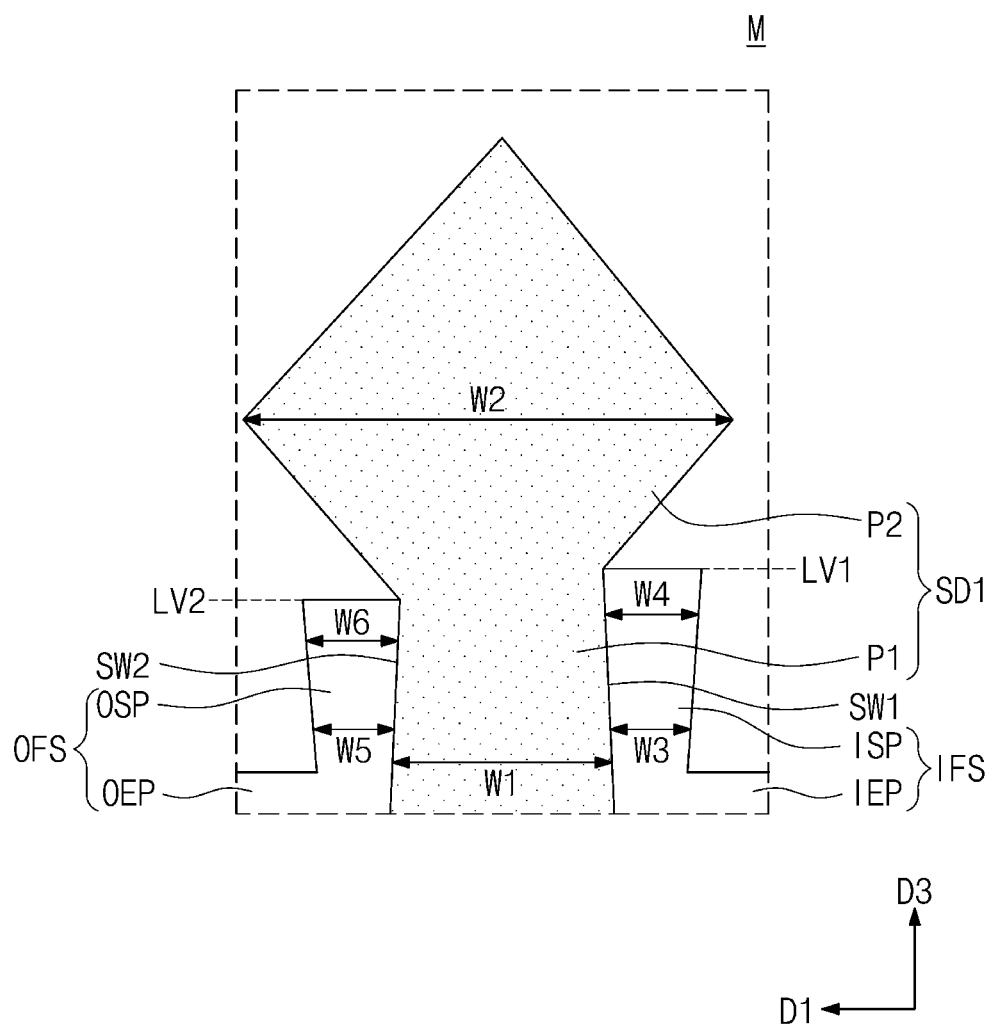
Figure 4H:
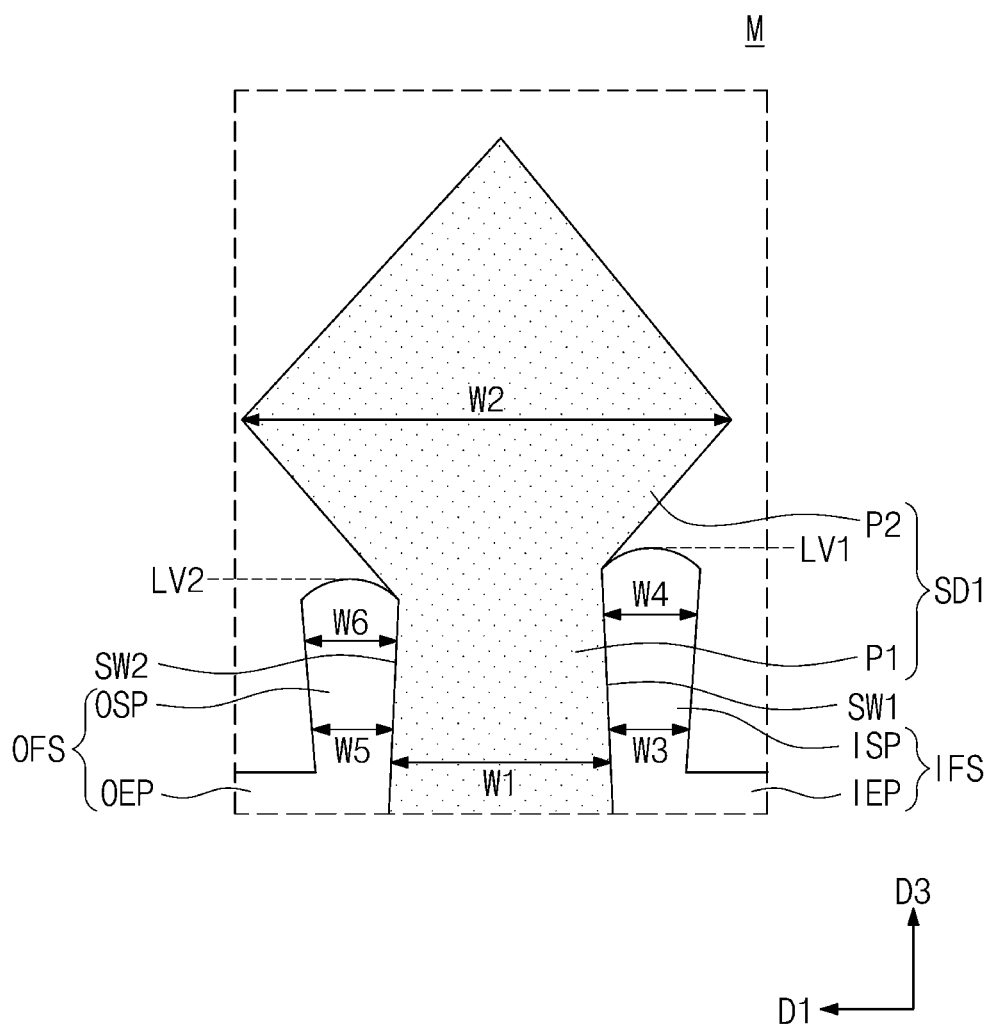
Figure 4I:
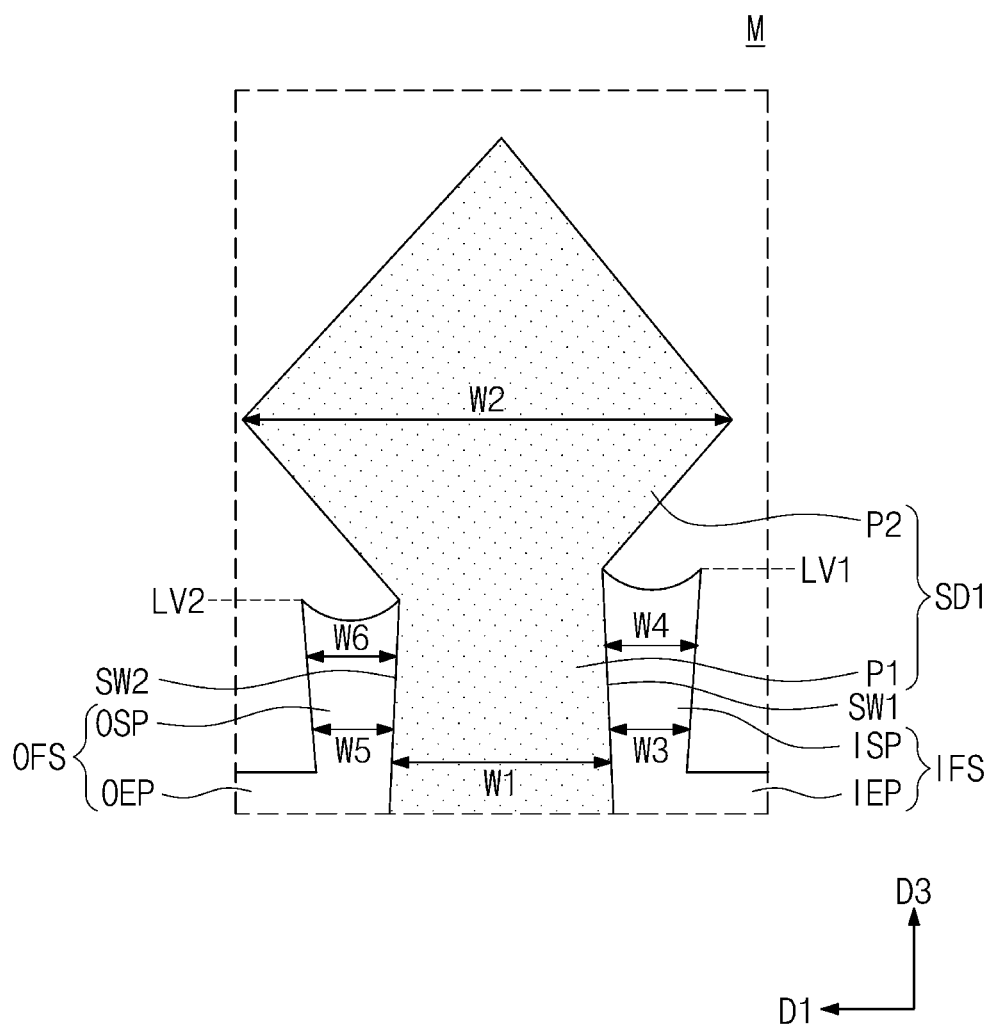
Figure 4J:
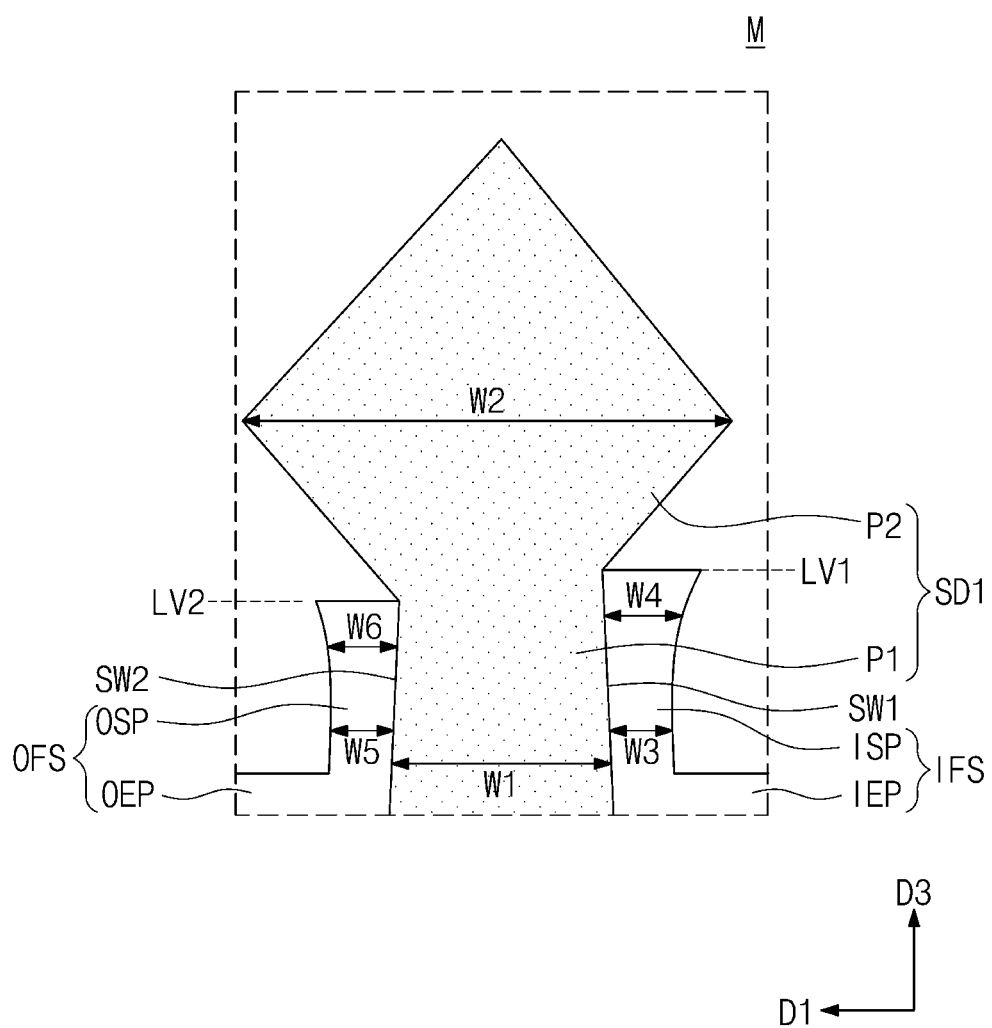
Figure 4K:
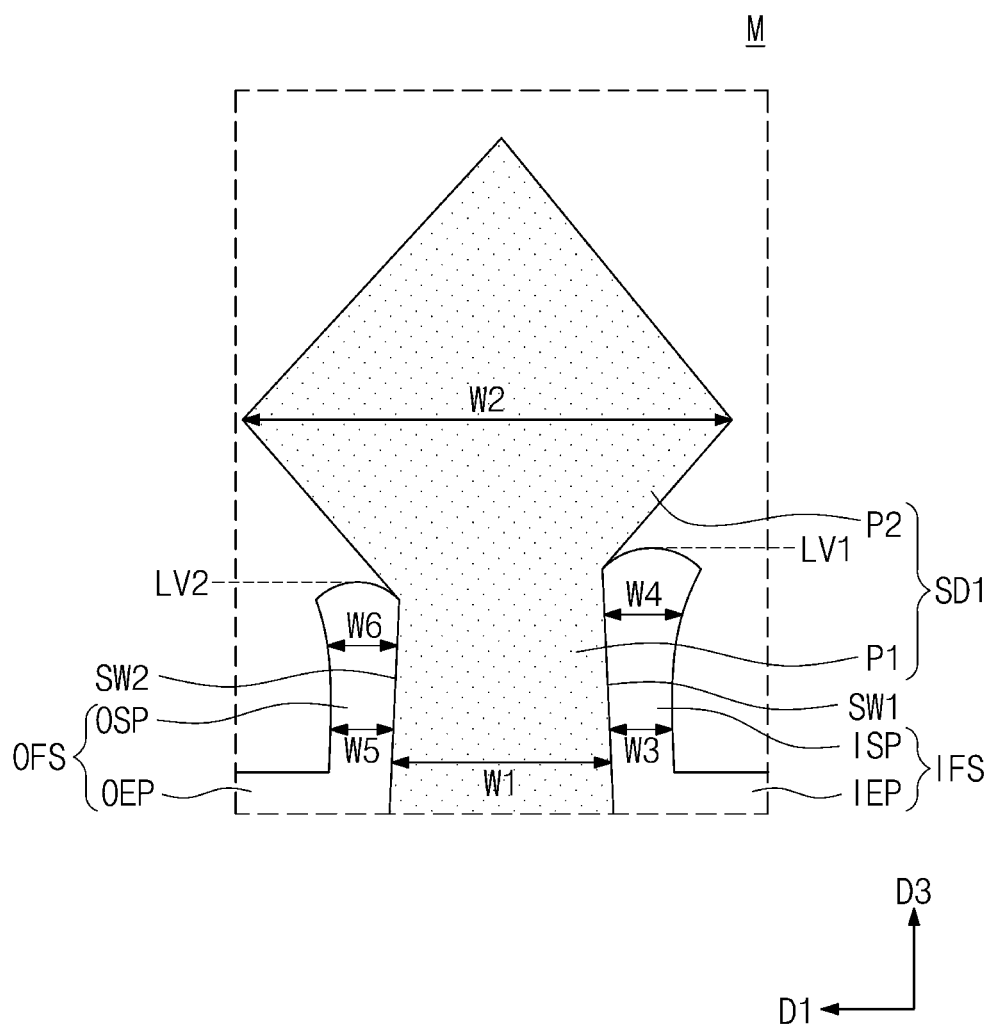
Figure 4L:
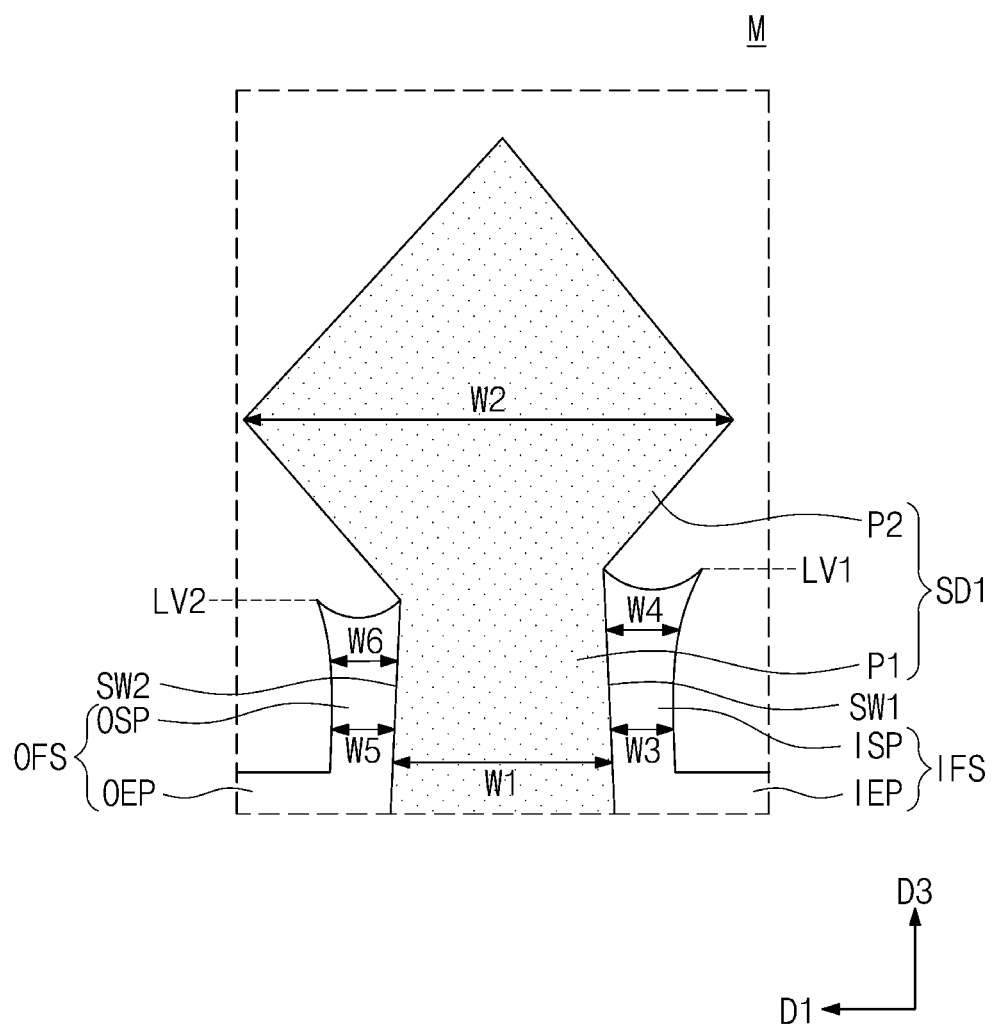

Referring to FIGS. 4E and 4F, the top surface of each of the inner spacer portion ISP and the outer spacer portion OSP may have a non-flat profile. In the present embodiment, an element different from that of FIG. 4D will be described without description of overlapping or already described elements.

Referring to FIG. 4E, each of the inner spacer portion ISP and the outer spacer portion OSP may be formed to have a rounded top surface. As an example, the top surface of each of the inner spacer portion ISP and the outer spacer portion OSP may have a convex profile in, for example, a direction toward the second portion P2. Referring to FIG. 4F, the top surface of each of the inner spacer portion ISP and the outer spacer portion OSP may have a concave profile in, for example, a direction toward the device isolation layer ST.

The highest level of the top surface of the inner fin spacer IFS may be the first level LV1. The highest level of the top surface of the outer fin spacer OFS may be the second level LV2. The first and second levels LV1 and LV2 may be substantially the same level.

The inner and outer fin spacers IFS and OFS in FIGS. 4G to 4L may have substantially the same profile as the inner and outer fin spacers IFS and OFS in FIGS. 4A to 4F but the first and second levels LV1 and LV2 may be different from each other. In the present embodiment, an element different from those of FIGS. 4A to 4F will be described without description of overlapping or already described elements.

Referring to FIGS. 4G to 4L, the first level LV1 may be higher than the second level LV2. As another example, the first level LV1 may be lower than the second level LV2. Since the first and second levels LV1 and LV2 are different from each other, the first source/drain pattern SD1 may have an asymmetric structure. The topmost portion of each of the first and second inner spacer portions ISP1 and ISP2 and the outer spacer portion OSP may have a width larger than the bottommost portion of the first and second inner spacer portions ISP1 and ISP2 and the outer spacer portion OSP. For example, the widths of each of the of the first and second inner spacer portions ISP1 and ISP2 and the outer spacer portion OSP may gradually decrease toward the device isolation layer ST.

FIGS. 5, 7, 9, 11, 13, 15, and 17 are plan views illustrating a method of fabricating a semiconductor device, according to an exemplary embodiment of the present inventive concept. FIGS. 6, 8A, 10A, 12A, 14A, 16A, and 18A are sectional views taken along lines A-A' of FIGS. 5, 7, 9, 11, 13, 15, and 17, respectively. FIGS. 8B, 10B, 12B, 14B, 16B and 18B are sectional views taken along lines B-B' of FIGS.

7, 9, 11, 13, 15, and 17, respectively. FIGS. 8C, 10C, 12C, 16C, and 18C are sectional views taken along lines C-C' of FIGS. 7, 9, 11, 15, and 17, respectively.

Figure 5:
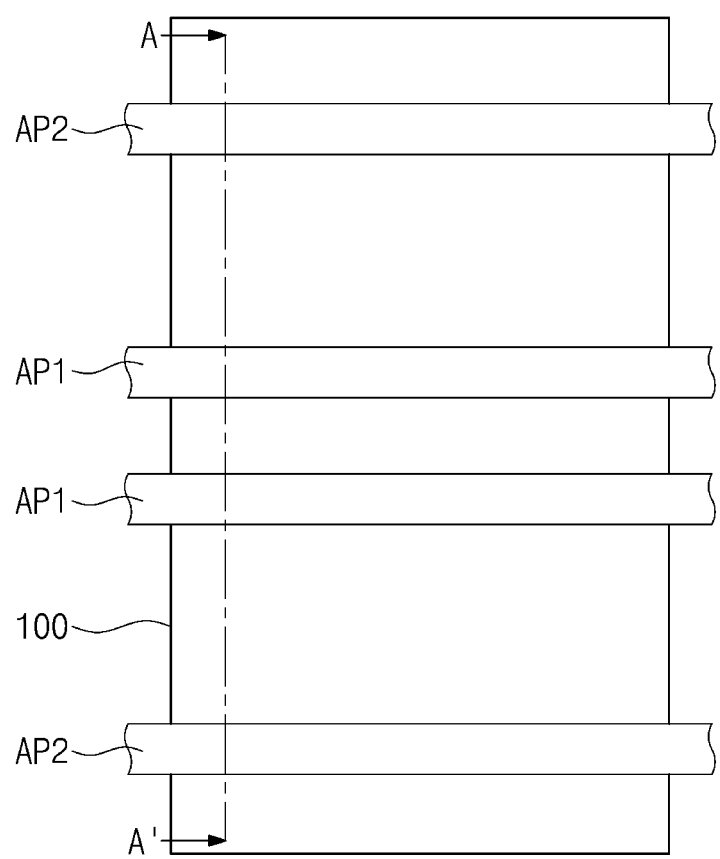
FIGS. 5, 7, 9, 11, 13, 15, and 17 are plan views illustrating a method of fabricating a semiconductor device, according to an exemplary embodiment of the present inventive concept.
Figure 6:
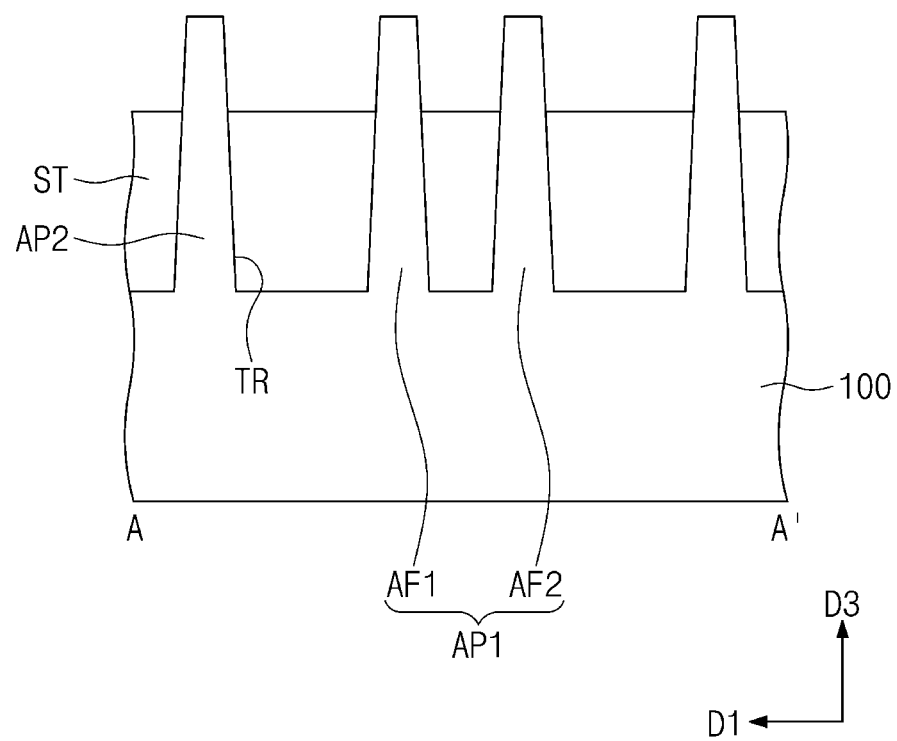
FIGS. 6, 8A, 10A, 12A, 14A, 16A, and 18A are sectional views taken along lines A-A' of FIGS. 5, 7, 9, 11, 13, 15, and 17, respectively.
Figure 7:
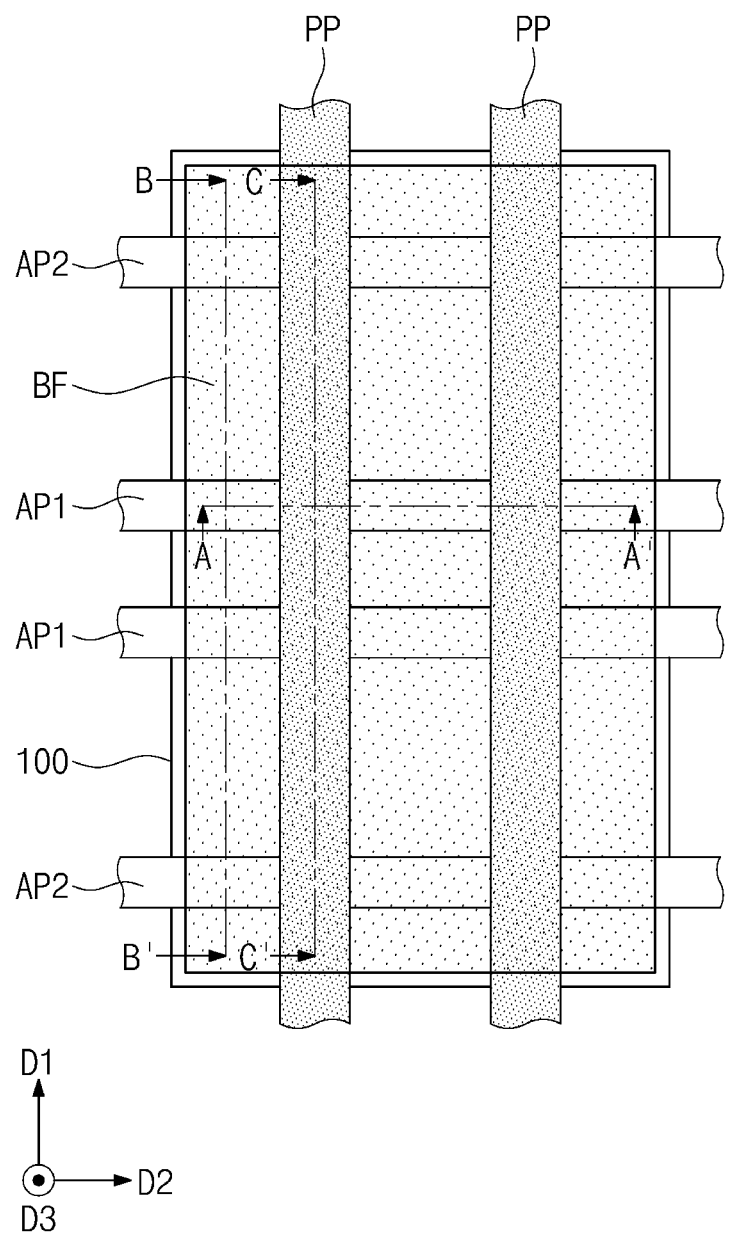
Figure 8A:
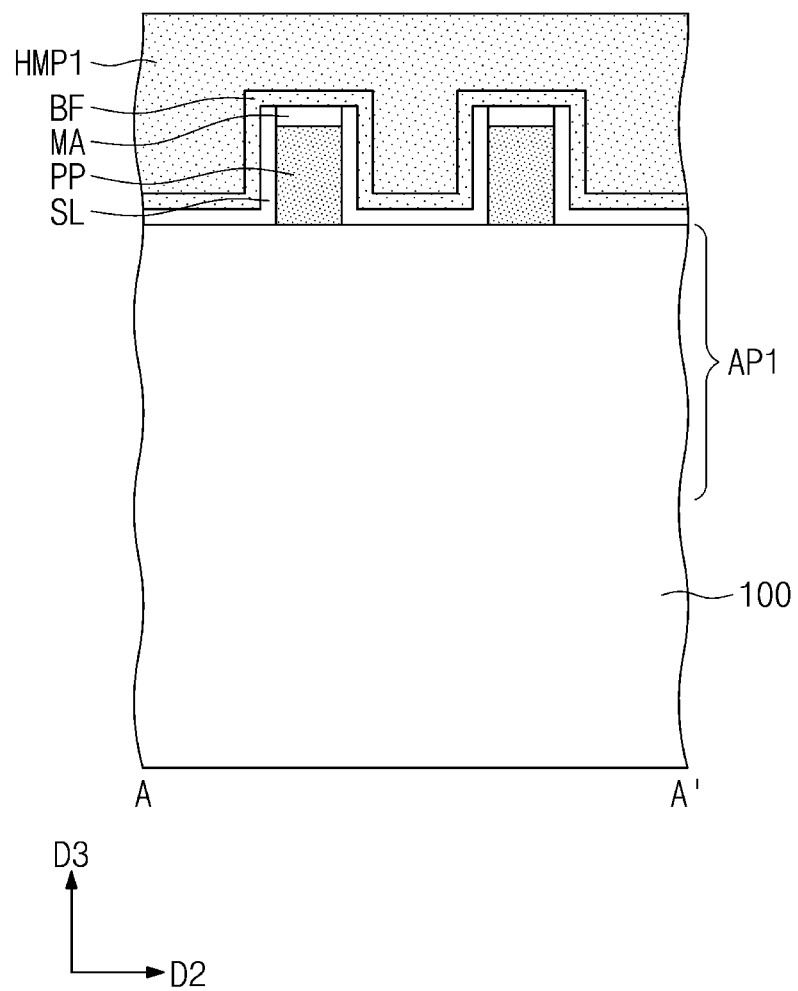
Figure 8B:
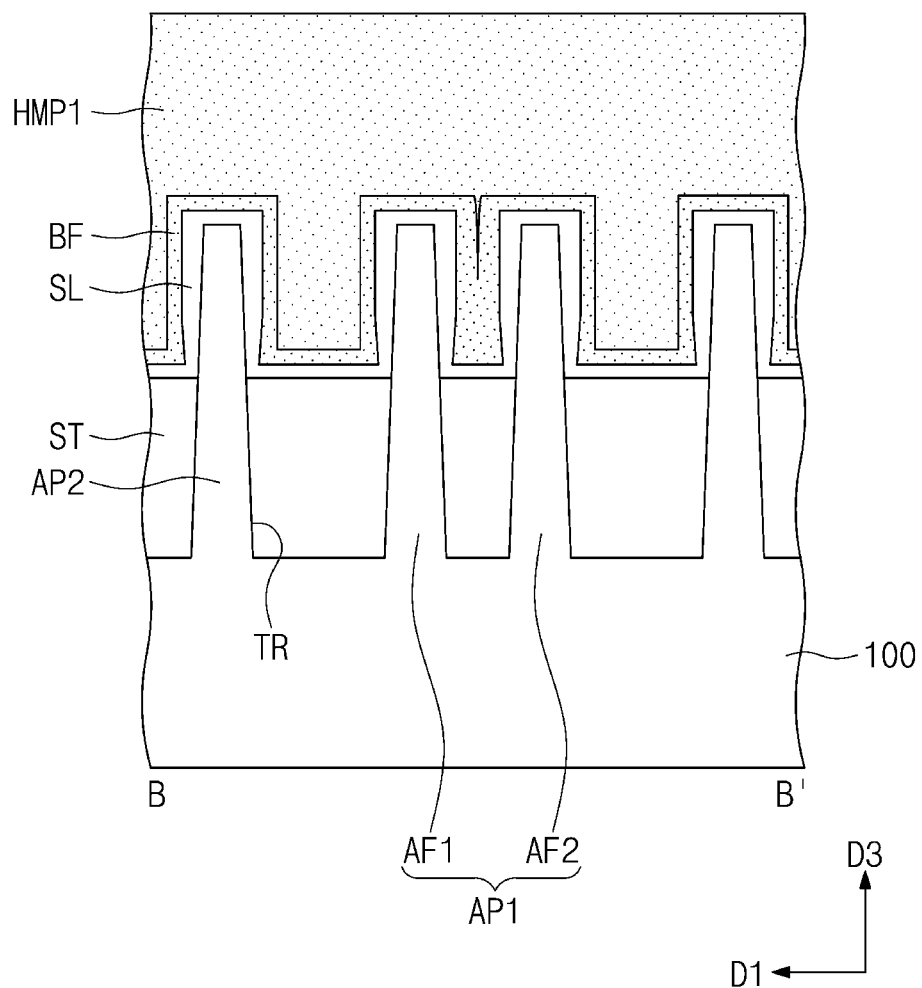
FIGS. 8B, 10B, 12B, 14B, 16B and 18B are sectional views taken along lines B-B' of FIGS. 7, 9, 11, 13, 15, and 17, respectively.
Figure 8C:
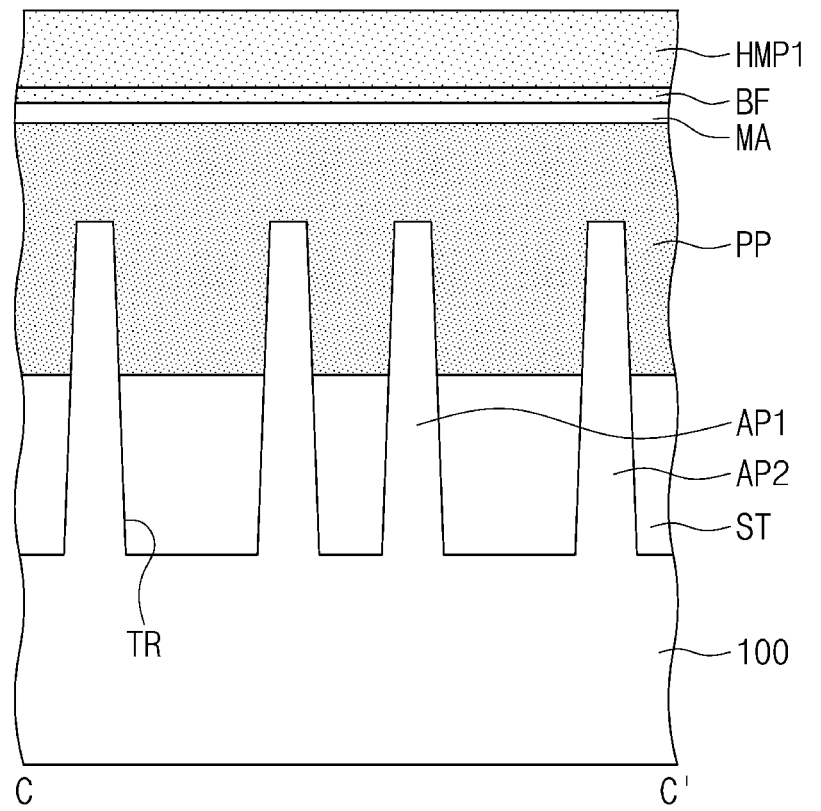
FIGS. 8C, 10C, 12C, 16C, and 18C are sectional views taken along lines C-C' of FIGS. 7, 9, 11, 15, and 17, respectively.
Figure 9:
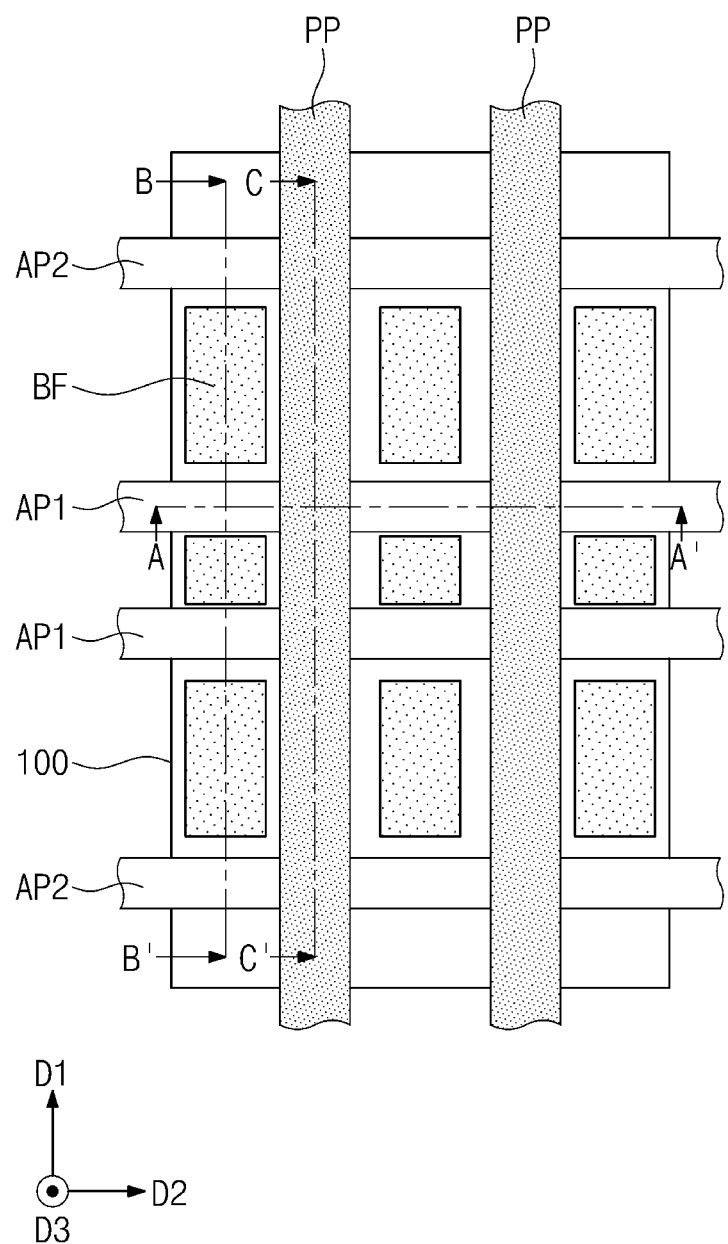
Figure 10A:
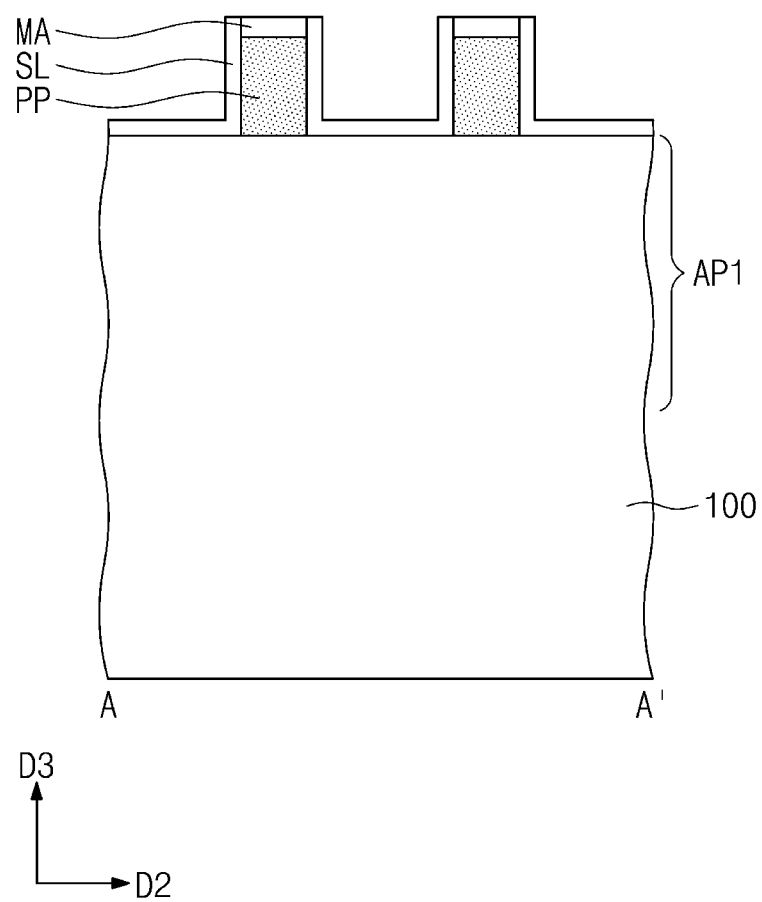
Figure 10B:
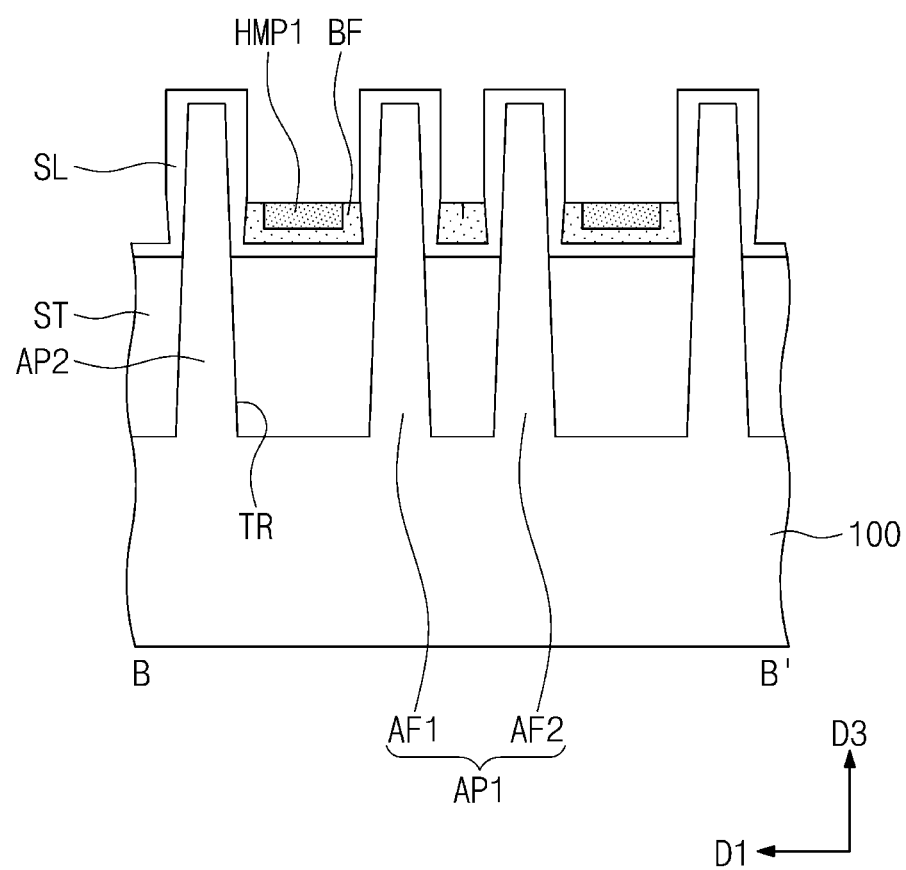
Figure 10C:
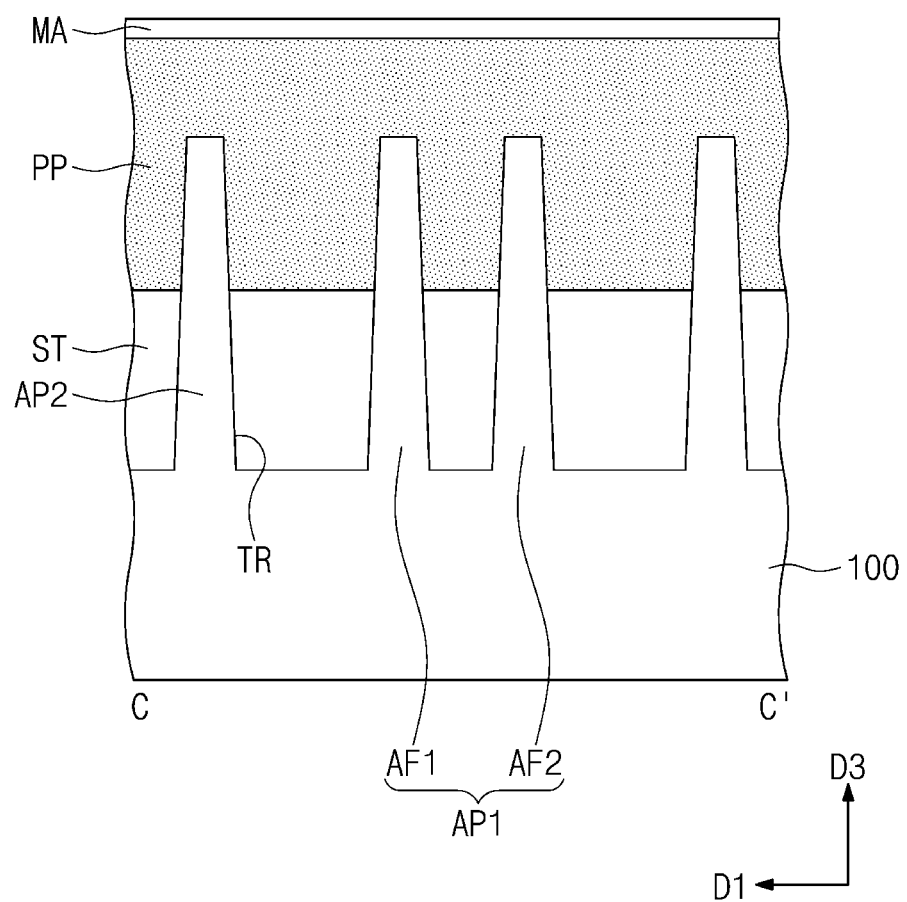
Figure 11:
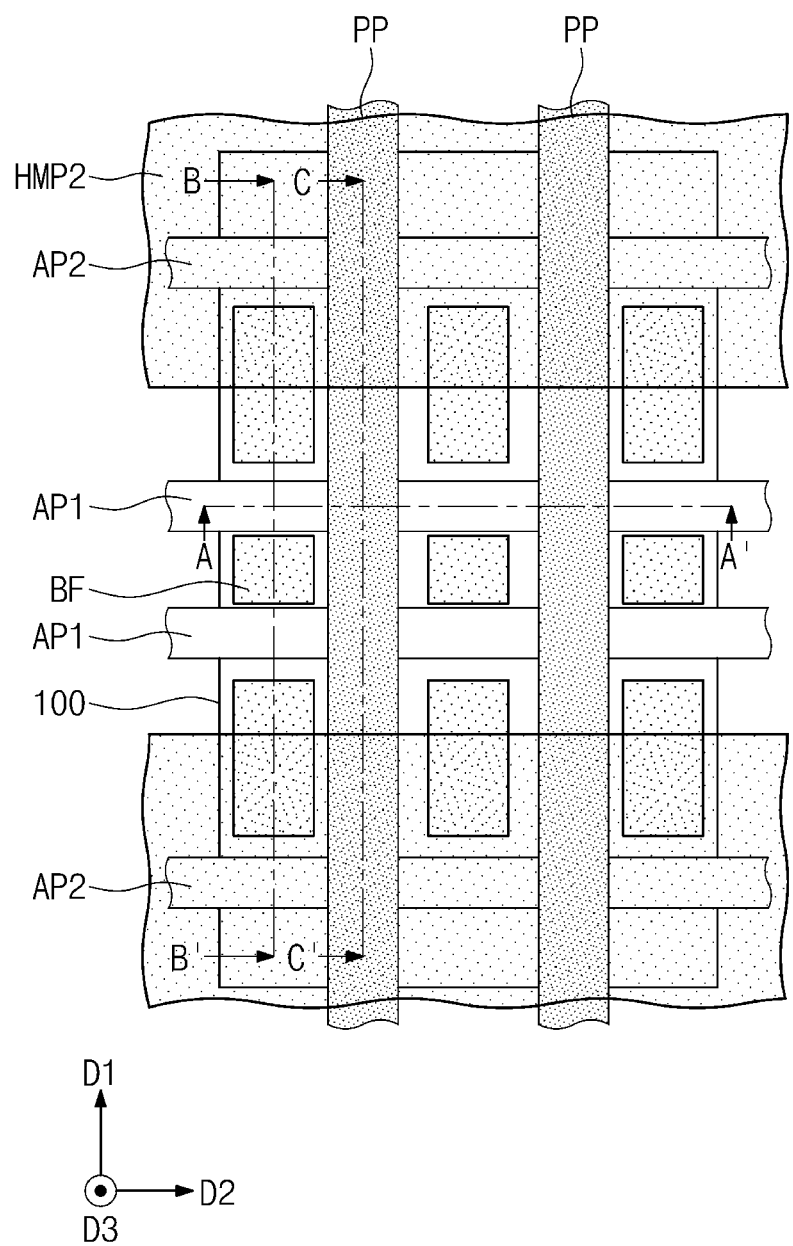
Figure 12A:
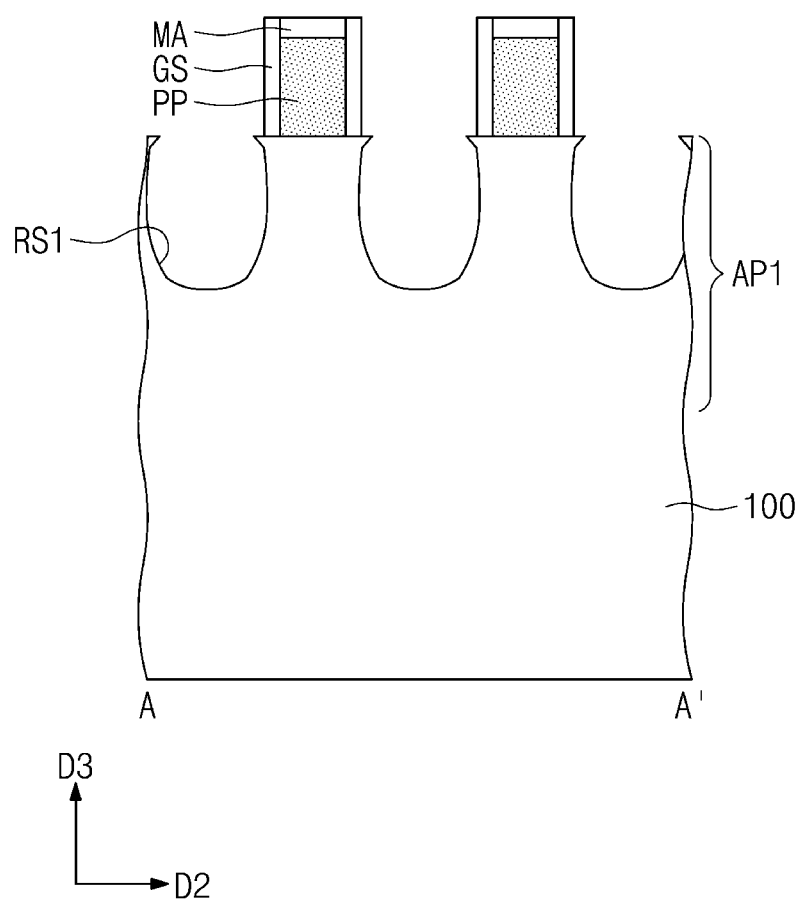
Figure 12B:
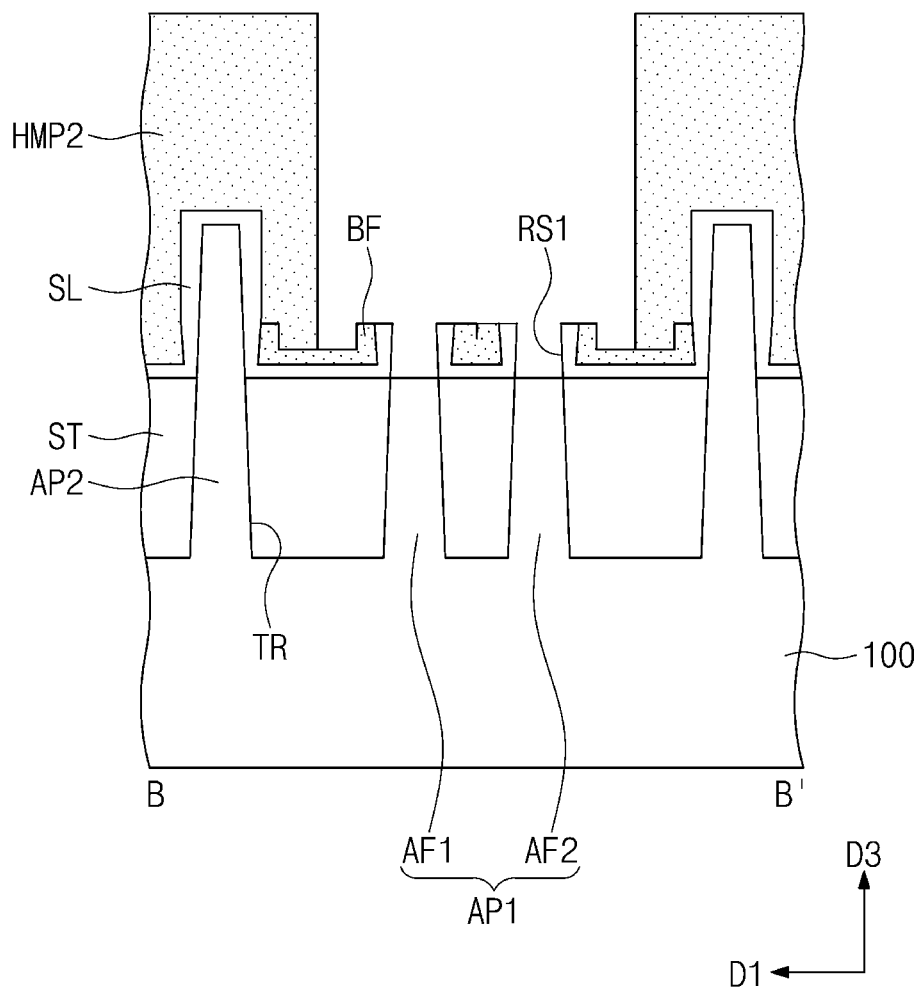
Figure 12C:
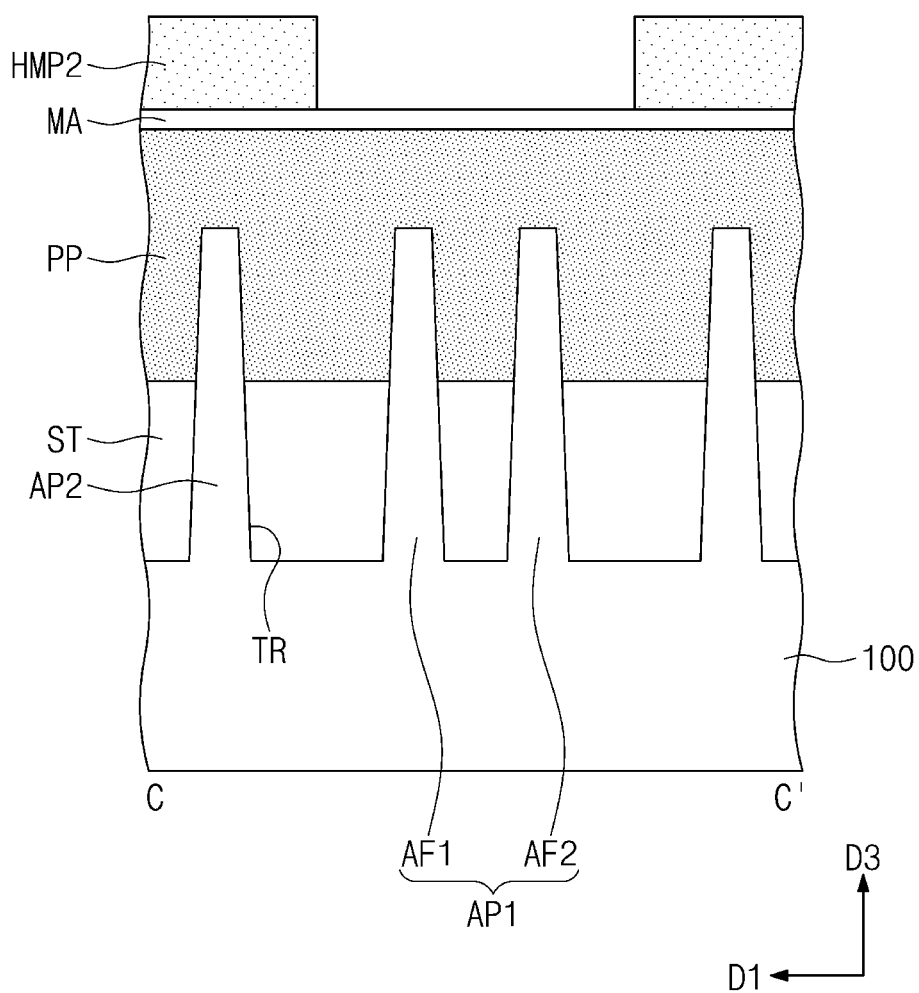

Referring to FIGS. 5 and 6, the substrate 100 may be patterned to form the first and second active patterns AP1 and AP2. For example, the formation of the first and second active patterns AP1 and AP2 may include forming mask patterns on the substrate 100 and anisotropic etching the substrate 100 using the mask patterns as an etch mask. The trenches TR may be formed between adjacent pairs of active patterns AP1 and AP2.

The device isolation layer ST may be formed on the substrate 100 to fill the trenches TR. For example, an insulating layer (e.g., a silicon oxide layer) may be formed on the substrate 100 to cover the first and second active patterns AP1 and AP2. Thereafter, the insulating layer may be recessed to expose upper portions of the first and second active patterns AP1 and AP2. Accordingly, the upper portions of the first and second active patterns AP1 and AP2 may protrude above the device isolation layer ST.

Referring to FIGS. 7 and 8A to 8C, sacrificial patterns PP may be formed to cross the first and second active patterns AP1 and AP2. The sacrificial patterns PP may be formed to extend in the first direction D1 and may have, for example, a rectangular shape. For example, the formation of the sacrificial patterns PP may include forming a sacrificial layer on the substrate 100, forming mask patterns MA on the sacrificial layer, and patterning the sacrificial layer using the mask patterns MA as an etch mask. The sacrificial layer may include, for example, a poly-silicon layer.

A spacer layer SL may be formed on both side surfaces of each of the sacrificial patterns PP. The spacer layer SL may also be formed to cover a top surface and both side surfaces of each of the first and second active patterns AP1 and AP2. The spacer layer SL may be extended to cover a region of the device isolation layer ST filling the trenches TR. For example, the spacer layer SL may be formed on the entire top surface of the substrate 100. The spacer layer SL may be formed of or include at least one of SiCN, SiCON, or SiN. As another example, the spacer layer SL may be a multi-layer including at least two of SiCN, SiCON, or SiN. However, the present inventive concept is not limited thereto. For example, the spacer layer SL may be a single layer.

The buffer layer BF may be formed on the spacer layer SL. For example, the buffer layer BF may be formed to fully cover the spacer layer SL. The buffer layer BF may be formed of or include a material whose dielectric constant is higher than that of the spacer layer SL. The buffer layer BF may be formed of or include at least one of materials, which are highly resistant to a dry etching process and have a low resistant to a wet etching process. As an example, the buffer layer BF may be formed of or include aluminum oxide ($Al_2O_3$). As another example, the buffer layer BF may be formed of or include aluminum oxide ($Al_2O_3$) doped with at least one of yttrium (Y), hafnium (Hf), zirconium (Zr), or manganese (Mn). As an additional example, the buffer layer BF may be formed of or include yttrium oxide ($Y_2O_3$) doped with at least one of hafnium (Hf), zirconium (Zr), or manganese (Mn).

A first hard mask pattern HMP1 may be formed on the buffer layer BF. For example, the first hard mask pattern HMP1 may be formed to fully cover the buffer layer BF. In an exemplary embodiment of the present inventive concept, the first hard mask pattern HMP1 may be formed of or include a carbon-containing material (e.g., SOH).

Referring to FIGS. 9 and 10A to 10C, the first hard mask pattern HMP1 may be partially etched. For example, the first hard mask pattern HMP1 may be partially etched such that a top surface thereof is located at a level lower than top surfaces of the first and second active patterns AP1 and AP2.

After the etching of the first hard mask pattern HMP1, a wet etching process may be performed to etch the buffer layer BF. The buffer layer BF may be partially etched. For example, the buffer layer BF may be etched such that a top surface thereof is located at substantially the same level as the top surface of the first hard mask pattern HMP1. For example, the buffer layer BF, which is in contact with the first hard mask pattern HMP1, may not be etched.

A height of the buffer layer BF may be adjusted by a height of the left portion of the first hard mask pattern HMP1. After the wet etching process, the first hard mask pattern HMP1 may be formed in the buffer layer BF.

Referring to FIGS. 11 and 12A to 12C, the first hard mask pattern HMP1 may be removed, and then, a second hard mask pattern HMP2 may be formed to selectively cover the second active pattern AP2. The removal of the first hard mask pattern HMP1 may include an ashing process. The second hard mask pattern HMP2 may be formed to expose the first active pattern AP1. The second hard mask pattern HMP2 may be formed of or include a carbon-containing material (e.g., SOH).

First recesses RS1 may be formed in an upper portion of the first active pattern AP1 using the second hard mask pattern HMP2 as an etch mask. A pair of the first recesses RS1 may be formed at both sides of each of the sacrificial patterns PP. The formation of the first recesses RS1 may include performing a dry etching process on the upper portion of the first active pattern AP1 using the mask patterns MA and the spacer layer SL, which is provided on both side surfaces of the sacrificial patterns PP, as an etch mask.

During the formation of the first recesses RS1, the spacer layer SL on the top surface of the first active pattern AP1 may be removed. Accordingly, the gate spacers GS may be formed at both side surfaces of each of the sacrificial patterns PP.

The spacer layer SL on both side surfaces of the upper portion of the first active pattern AP1 may be at least partially removed. For example, since the buffer layer BF includes a material that is highly resistant to a dry etching process, the spacer layer SL in contact with the buffer layer BF may not be etched. As a result, heights of fin spacers IFS and OFS, which will be described below, may be adjusted by the buffer layer BF.

Next, a wet etching process may be performed to remove the buffer layer BF. In certain case, even when the wet etching process is finished, the buffer layer BF may partially remain between the first and second active fins AF1 and AF2. This is because due to a small distance between the first and second active fins AF1 and AF2, the buffer layer BF therein is formed to have a thickness that is too large to be fully removed.

Figure 13:
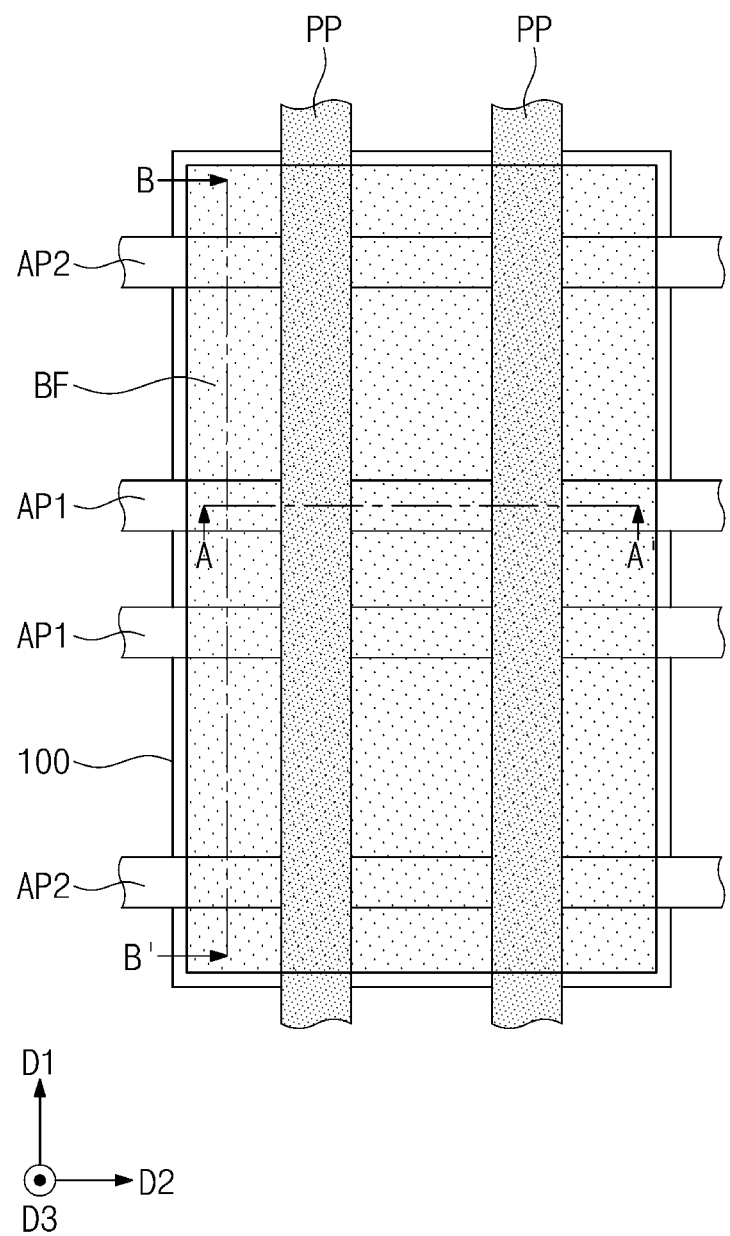
Figure 14A:
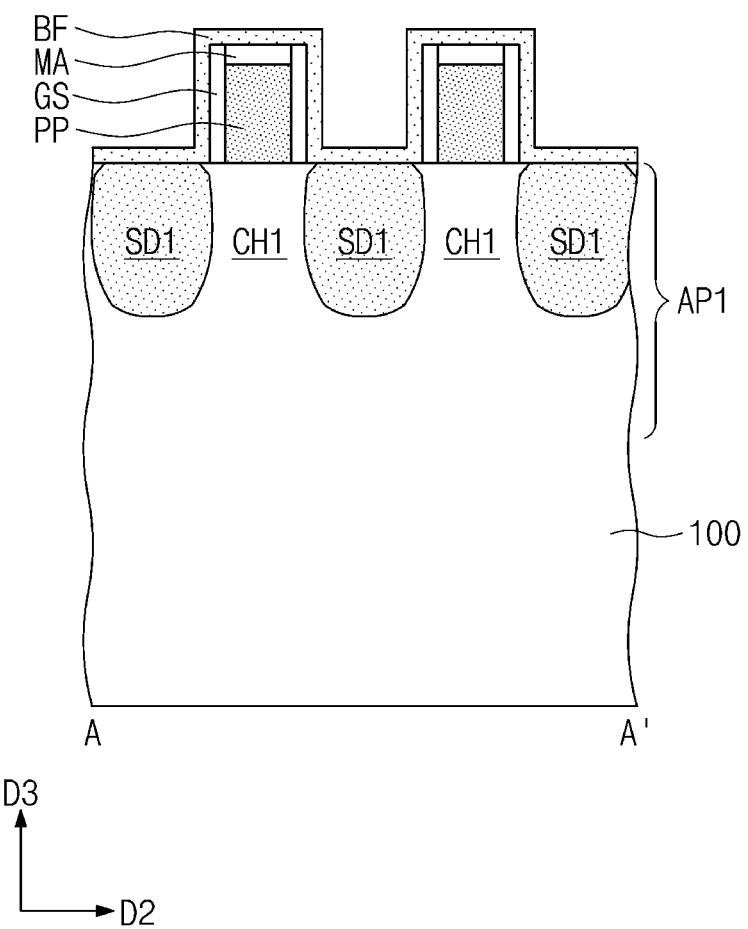
Figure 14B:
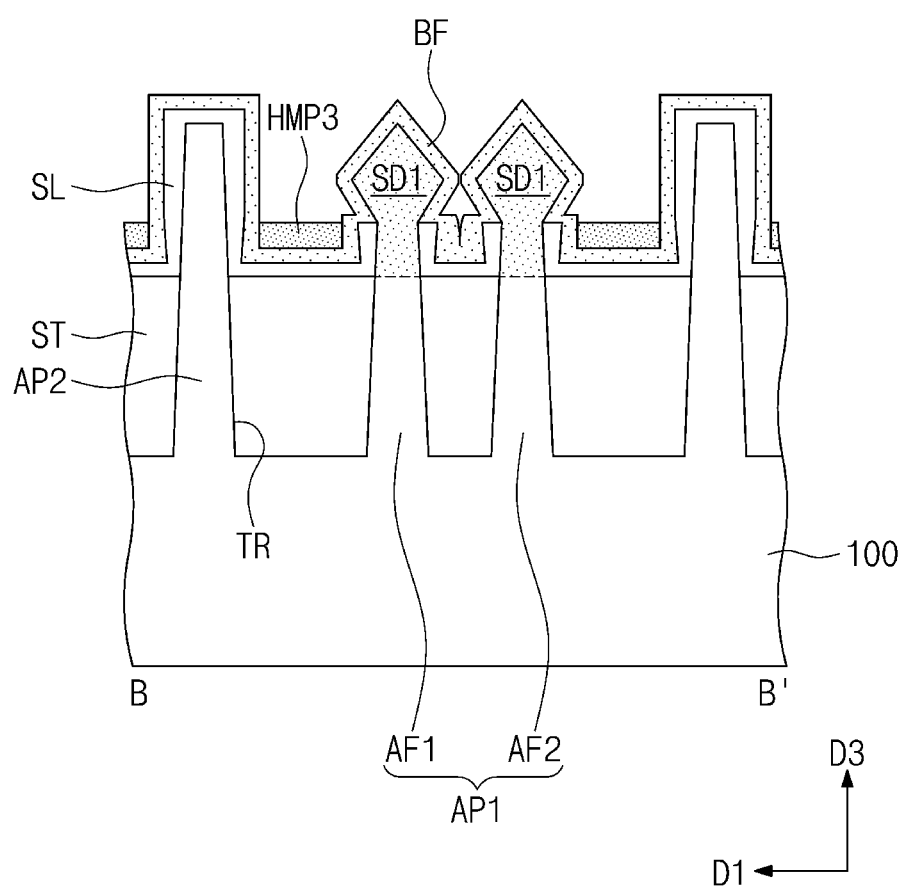
Figure 15:
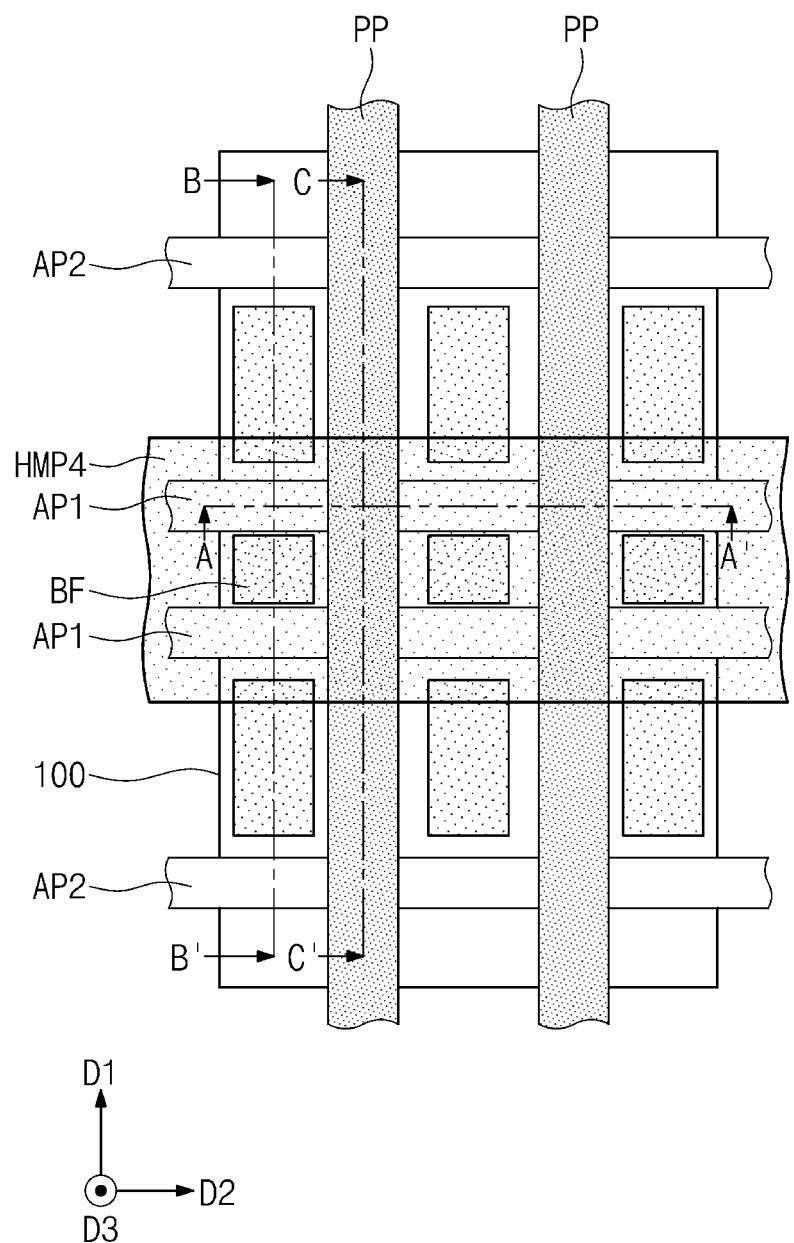
Figure 16A:
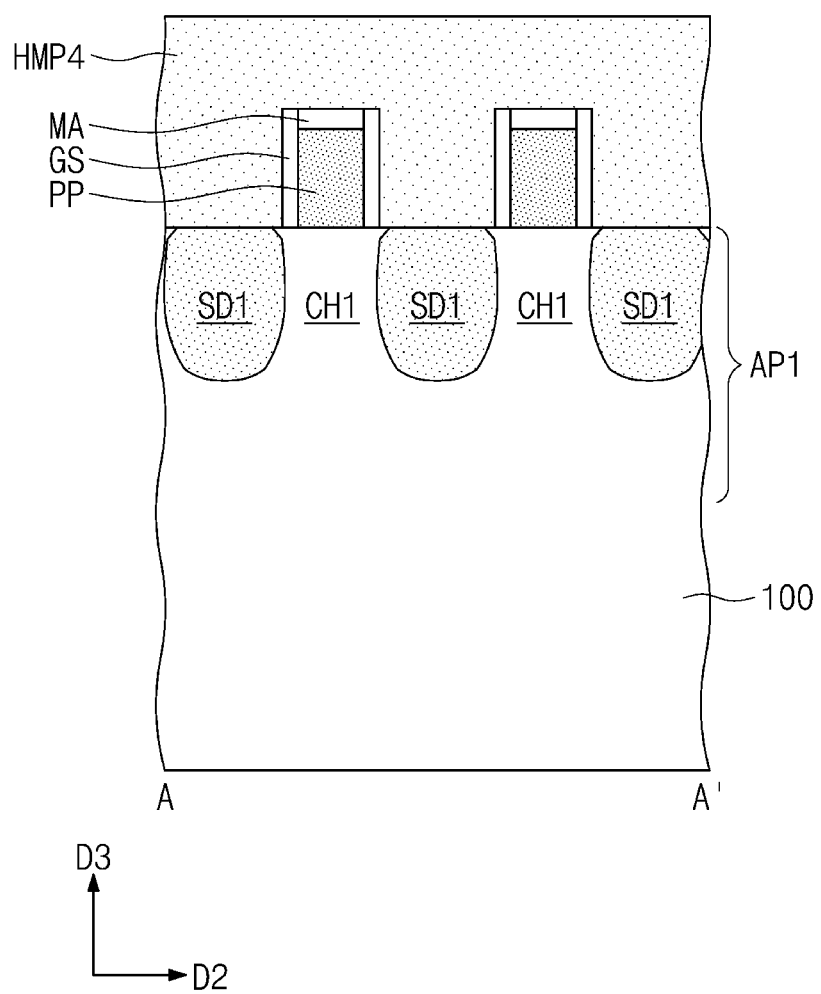
Figure 16B:
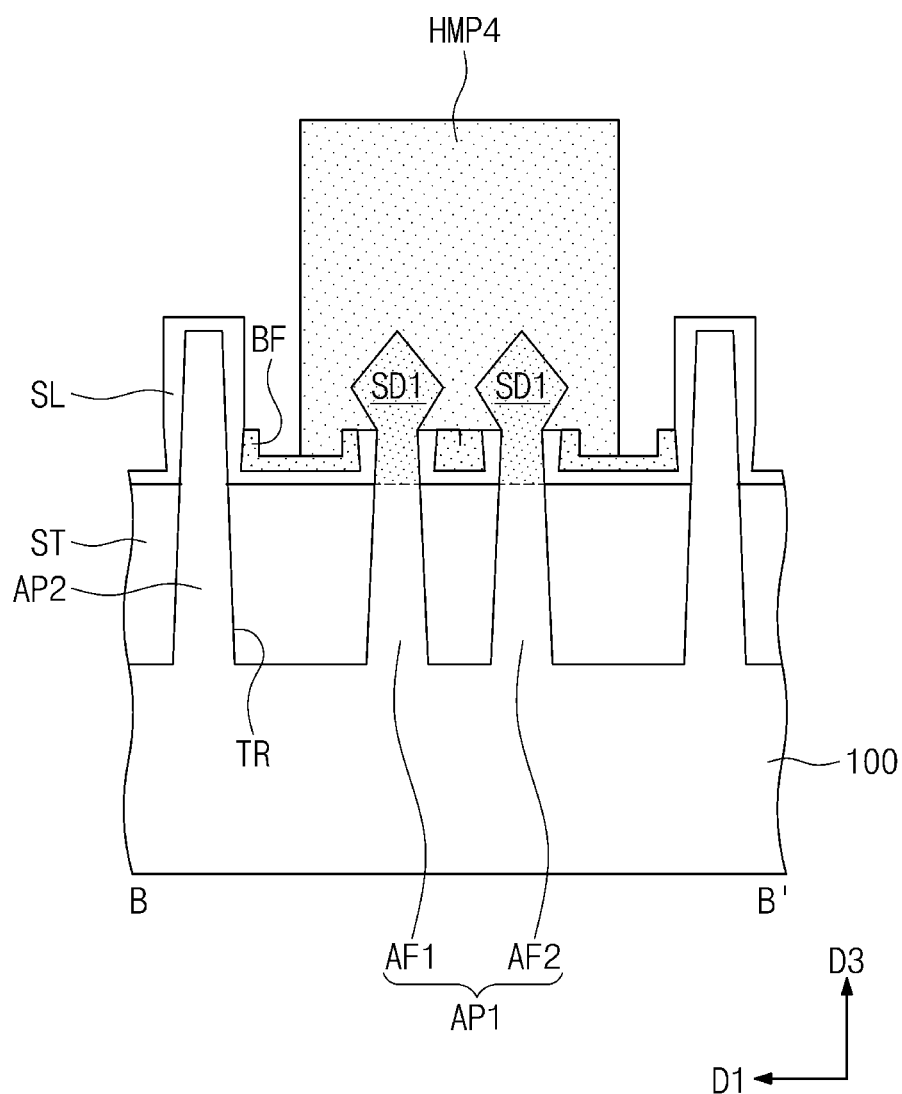
Figure 16C:
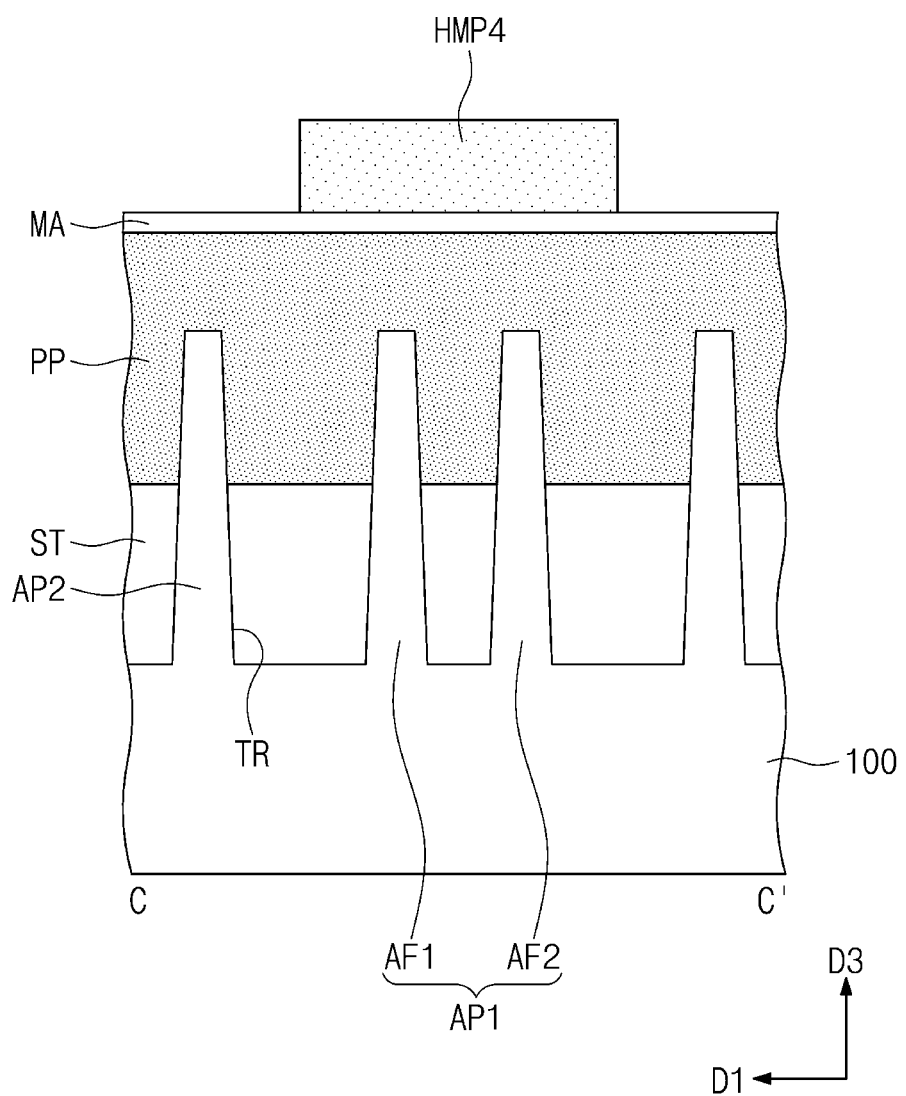
Figure 17:
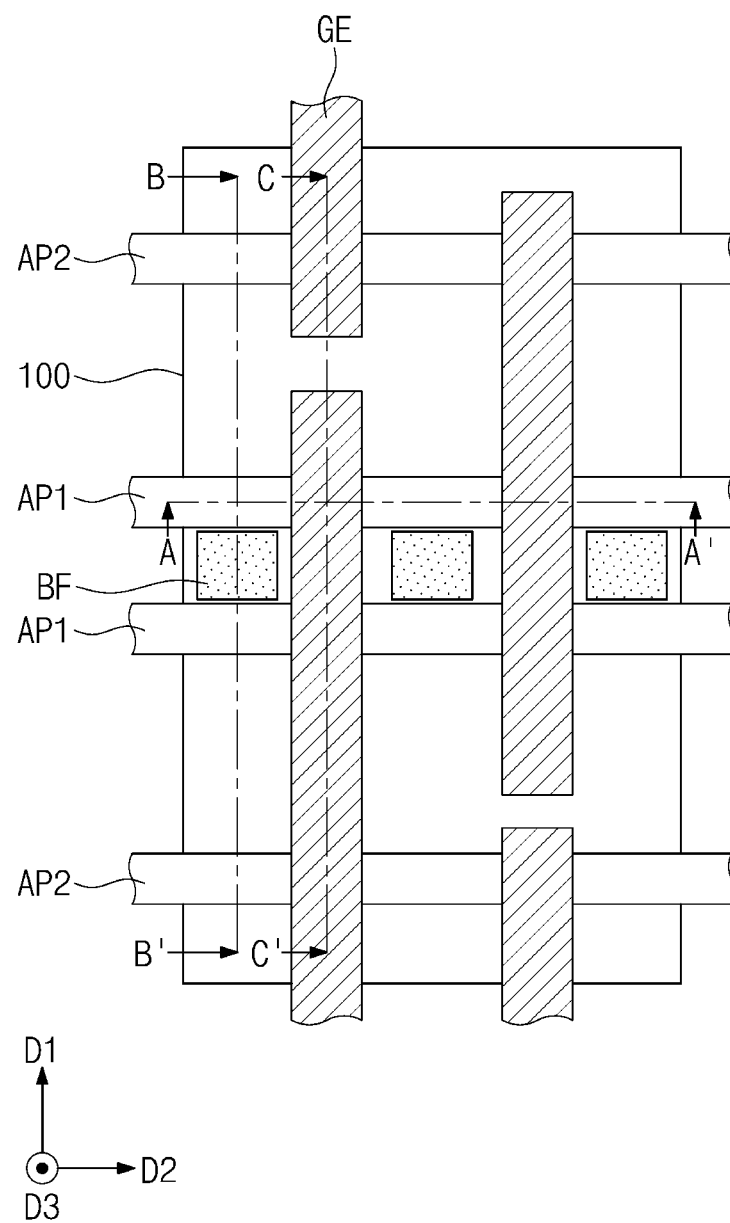
Figure 18A:
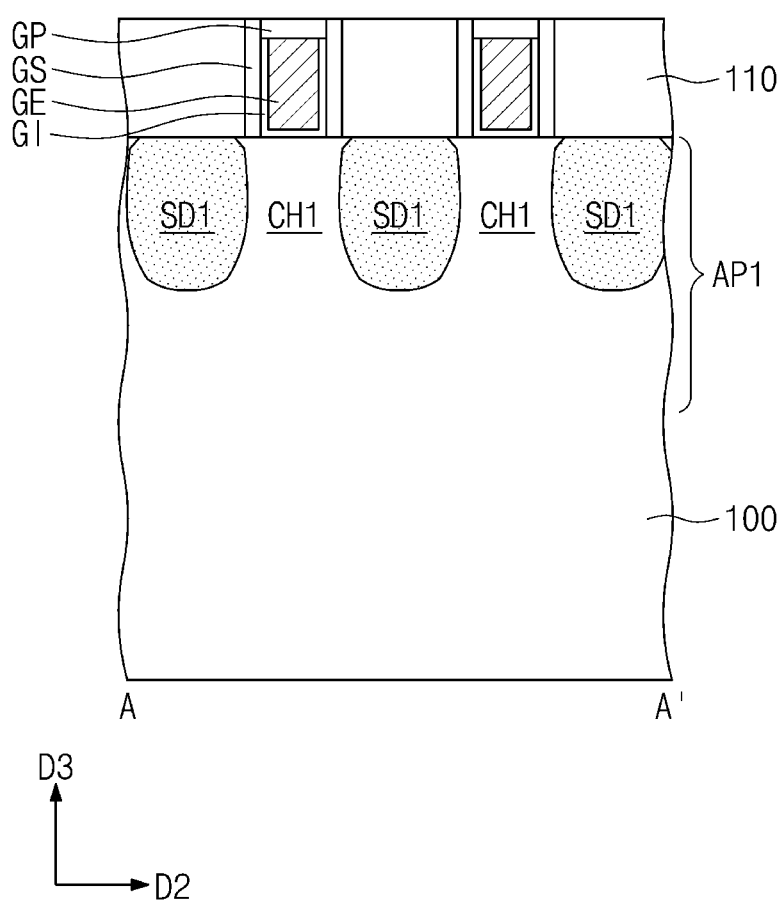
Figure 18B:
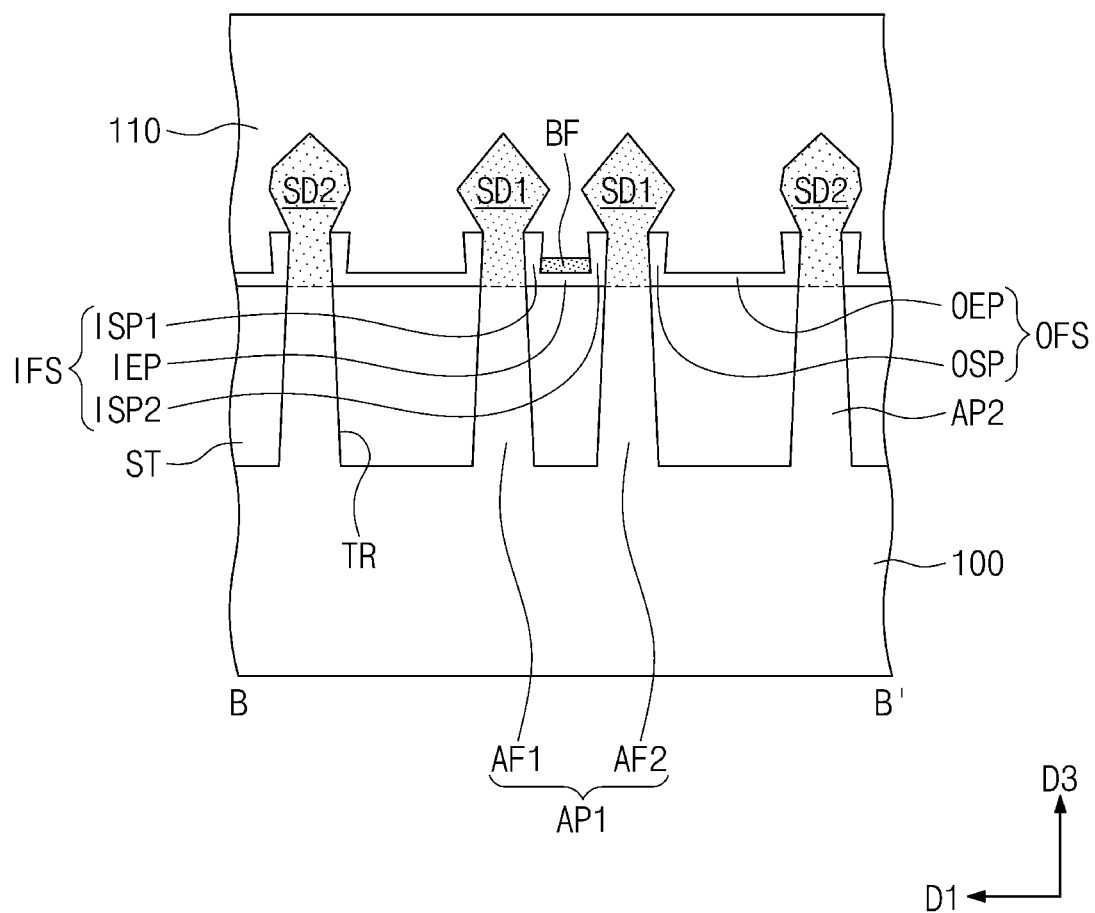
Figure 18C:
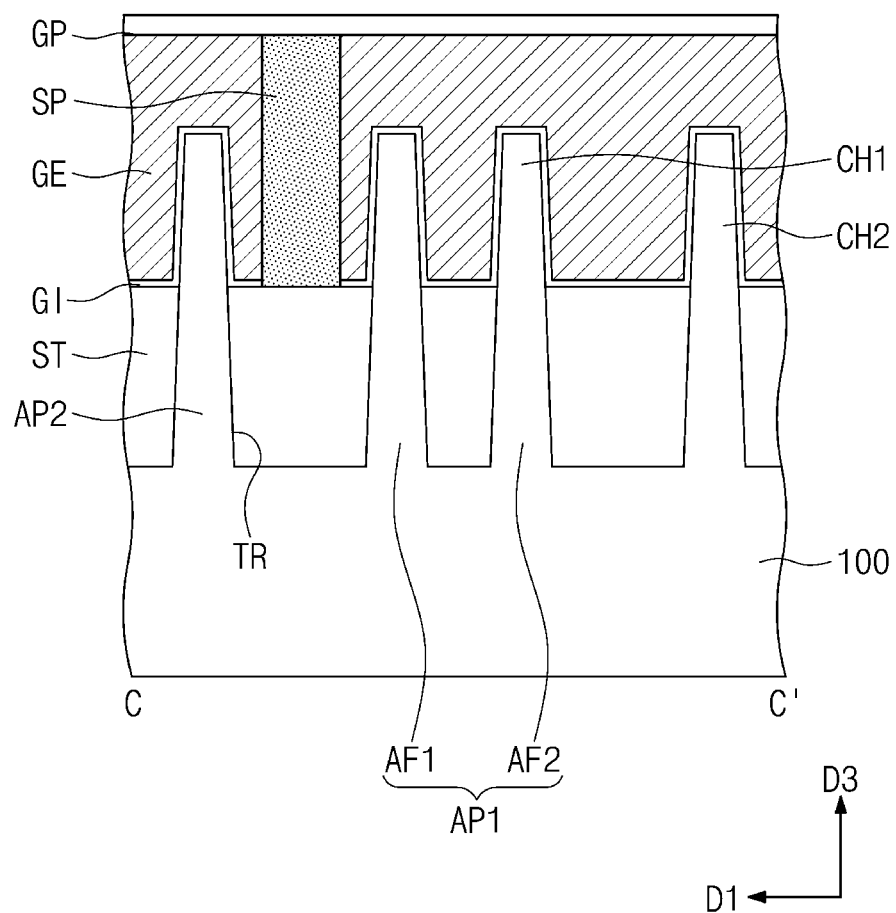

Referring to FIGS. 13, 14A, and 14B, the first source/drain patterns SD1 may be formed to fill the first recesses RS1. For example, the formation of the first source/drain patterns SD1 may include performing a selective epitaxial growth process using the exposed inner side surfaces of the first recesses RS1 as a seed layer. As a result of the formation of the first source/drain patterns SD1, the first channel pattern CH1 may be provided between each pair of the first source/drain patterns SD1. As an example, the selective epitaxial growth process may include a chemical vapor deposition (CVD) process or a molecular beam epitaxy (MBE) process. The first source/drain patterns SD1 may be formed of or include a semiconductor material (e.g., SiGe) whose lattice constant is larger than a lattice constant of the semiconductor material of the substrate 100. Each of the first source/drain patterns SD1 may be formed of a plurality of semiconductor layers.

In an embodiment, impurities may be injected into the first source/drain patterns SD1, during the selective epitaxial growth process to form the first source/drain patterns SD1. In an exemplary embodiment of the present inventive concept, after the formation of the first source/drain patterns SD1, impurities may be injected into the first source/drain patterns SD1. For example, the first source/drain patterns SD1 may be doped to have a first conductivity type (e.g., p-type).

During the selective epitaxial growth process, the horizontal growth of the first source/drain patterns SD1 may be prevented by the spacer layer SL. As a result, it may be possible to prevent a short circuit from being formed between the first source/drain patterns SD1, which are adjacent to each other, and to increase an integration density of the semiconductor device.

A buffer layer BF may be formed again to cover the first source/drain patterns SD1 and the spacer layer SL. A third hard mask pattern HMP3 may be formed on the buffer layer BF, and the third hard mask pattern HMP3 may be partially etched. The process of etching the third hard mask pattern HMP3 may be performed in substantially the same manner as the etching process of the first hard mask pattern HMP1, described with reference to FIGS. 9 and 10A to 10C. For example, the third hard mask pattern HMP3 may be formed of or include a carbon-containing material (e.g., SOH).

Referring to FIGS. 15 and 16A to 16C, the buffer layer BF may be partially etched. The process of etching the buffer layer BF may be performed in substantially the same manner as the etching process of the buffer layer BF described with reference to FIGS. 9 and 10A to 10C. For example, the portions of the buffer layer BF, which are in contact with the third hard mask pattern HMP3, may not be etched.

After the etching of the buffer layer BF, the third hard mask pattern HMP3 may be removed by an ashing process, and a fourth hard mask pattern HMP4 may be formed to selectively cover the first active pattern AP1.

Referring to FIGS. 17 and 18A to 18C, second recesses may be formed in an upper portion of the second active pattern AP2. The formation of the second recesses may include performing a dry etching process on the upper portion of the second active pattern AP2 using the mask patterns MA and the gate spacers GS as an etch mask.

The spacer layer SL on the top surface of the second active pattern AP2 may be removed. The spacer layer SL on both side surfaces of the upper portion of the second active pattern AP2 may be partially removed. For example, since the buffer layer BF includes a material that is highly resistant to a dry etching process, portions of the spacer layer SL in contact with the buffer layer BF may not be etched. Accordingly, the remaining portions of the spacer layer SL may form the inner fin spacer IFS may be formed to be interposed between adjacent ones of the first source/drain patterns SD1, and the outer fin spacer OFS may be formed to be interposed between the first source/drain pattern SD1 and the second source/drain pattern SD2 to be described below. In an exemplary embodiment of the present inventive concept, the inner and outer fin spacers IFS and OFS may have top surfaces that are located at substantially the same level as each other.

In the case where only the hard mask pattern, without the buffer layer, is used as an etch mask, heights of the fin spacers may vary depending on positions and distances of the hard mask patterns and/or recesses in an upper portion of the active pattern formed to have non-uniform depths, and thus operation characteristics (e.g., an operation speed) of the semiconductor device may be deteriorated. By contrast, according to an exemplary embodiment of the present inventive concept, since the spacer layer SL is protected by the buffer layer BF during the dry etching process, heights of the inner and outer fin spacers IFS and OFS, formed from the spacer layer SL, may be controlled to have relatively uniform values. As a result, the operation characteristics (e.g., an operation speed) of the semiconductor device may be increased.

Thereafter, a wet etching process may be performed to remove the buffer layer BF. In certain cases, even when the wet etching process is finished, a portion of the buffer layer BF may be left on the inner fin spacer IFS. This is because due to a small distance between the first and second active fins AF1 and AF2, the buffer layer BF therein is formed to have a thickness that is too large to be fully removed. The buffer layer BF left on the inner fin spacer IFS may prevent the inner fin spacer IFS from being damaged by a subsequent (e.g., pre-cleaning) process. As a result, electric characteristics of the semiconductor device may be increased.

The second source/drain patterns SD2 may be formed to fill the second recesses. For example, the formation of the second source/drain patterns SD2 may include performing a selective epitaxial growth process using the exposed inner side surfaces of the second recesses as a seed layer. As a result of the formation of the second source/drain patterns SD2, a second channel pattern may be formed between each pair of the second source/drain patterns SD2. As an example, the second source/drain patterns SD2 may be formed of or include the same semiconductor material (e.g., Si) as the substrate 100. The second source/drain patterns SD2 may be doped to have a second conductivity type (e.g., n-type).

The first interlayer insulating layer 110 may be formed to cover the first and second source/drain patterns SD1 and SD2, the mask patterns MA, and the gate spacers GS. As an example, the first interlayer insulating layer 110 may include a silicon oxide layer.

The first interlayer insulating layer 110 may be planarized to expose the top surfaces of the sacrificial patterns PP. The planarization of the first interlayer insulating layer 110 may be performed using, for example, an etch-back or chemical mechanical polishing (CMP) process. As a result, the top surface of the first interlayer insulating layer 110 may be coplanar with the top surfaces of the sacrificial patterns PP and the top surfaces of the gate spacers GS.

The sacrificial patterns PP may be replaced with the gate electrodes GE and the separation pattern SP. For example, the exposed sacrificial patterns PP may be selectively removed. As a result of the removal of the sacrificial patterns PP, empty spaces may be formed. The gate dielectric patterns GI, the gate electrodes GE, and the gate capping patterns GP may be formed in the empty spaces.

The gate dielectric patterns GI may be formed by, for example, an atomic layer deposition (ALD) or a chemical oxidation process. As an example, the gate dielectric pattern GI may be formed of or include a high-k dielectric material.

The formation of the gate electrodes GE and the gate capping patterns GP may include forming a gate metal layer in the empty spaces, and recessing the gate metal layer. The formation further includes forming a gate capping layer on the recessed gate metal layer, and planarizing the gate capping layer to expose the top surface of the first interlayer insulating layer 110.

The separation pattern SP may be formed by partially removing the gate electrodes GE and filling the removed region with an insulating material. The gate electrode GE may be divided into a plurality of the gate electrodes GE by the separation pattern SP.

Referring back to FIGS. 2 and 3A to 3D, the active contacts AC may be formed to penetrate the first interlayer insulating layer 110 and to be electrically connected to the first and second source/drain patterns SD1 and SD2. The gate contacts GC may be formed to penetrate the gate capping pattern GP and to be electrically connected to the gate electrodes GE.

The formation of the active and gate contacts AC and GC may include forming contact holes, and forming the barrier pattern BM to partially fill the contact holes. The formation may further include forming the conductive pattern FM on the barrier pattern BM.

The second interlayer insulating layer 120 may be formed on the first interlayer insulating layer 110. The first metal layer M1 may be formed in the second interlayer insulating layer 120. The formation of the first metal layer M1 may include forming the first bit line BL1, the second bit line BL2, and the power line VDD.

The third interlayer insulating layer 130 may be formed on the second interlayer insulating layer 120. The second metal layer M2 may be formed in the third interlayer insulating layer 130. The formation of the second metal layer M2 may include forming the interconnection patterns IL.

Figure 19:
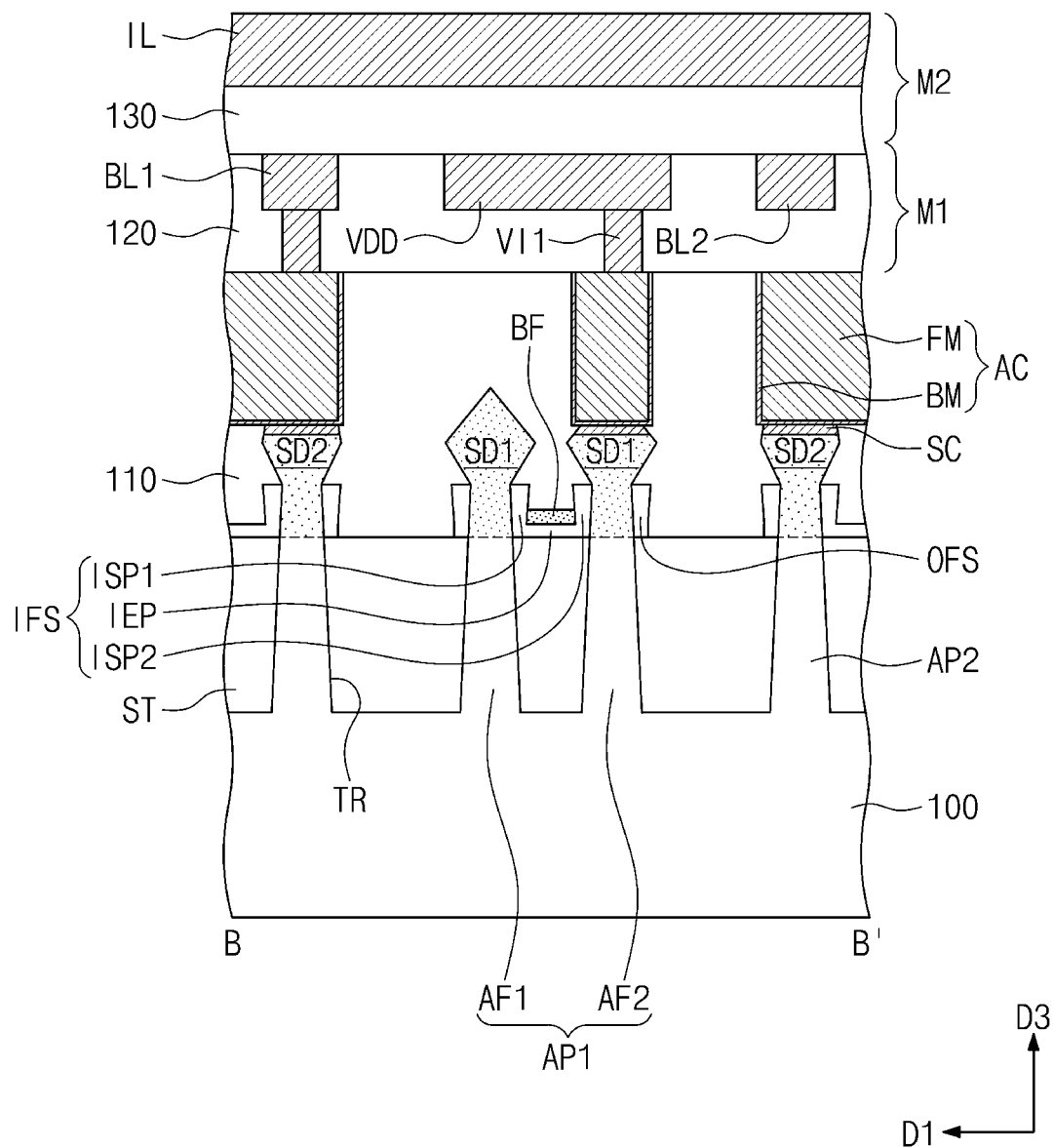
FIG. 19 is a sectional view illustrating a semiconductor device according to an exemplary embodiment of the present inventive concept.

FIG. 19 is a sectional view illustrating a semiconductor device according to an exemplary embodiment of the present inventive concept. In the following description, an element previously described with reference to FIGS. 2 and 3A to 3D may be identified by the same reference number without repeating an overlapping or redundant description thereof.

Referring to FIG. 19, the outer fin spacer OFS may not be extended to a region, which is located on the device isolation layer ST and between the first and second active patterns AP1 and AP2 that are adjacent to each other. For example, the outer fin spacer OFS may not include the outer extended portion OEP described with reference to FIGS. 3A to 3D. For example, a portion of the device isolation layer ST may be exposed by adjacent outer fin spacers OFS.

The inner fin spacer IFS may include inner spacer portions ISP1 and ISP2 and an inner extended portion IEP. The inner fin spacer IFS may include the first inner spacer portion ISP1, which is in contact with the first source/drain pattern SD1 provided on the upper portion of the first active fin AF1, and the second inner spacer portion ISP2, which is in contact with the first source/drain pattern SD1 provided on the upper portion of the second active fin AF2. For example, the inner extended portion IEP may connect the first inner spacer portion ISP1 and the second inner spacer portion ISP2 to each other. In an exemplary embodiment of the present inventive concept, the first and second inner spacer portions ISP1 and ISP2 may have substantially the same shape as each other.

The inner fin spacer IFS may further include the inner extended portion IEP, which is extended from the first and second inner spacer portions ISP1 and ISP2 to a region on the device isolation layer ST between the first and second active fins AF1 and AF2.

The outer fin spacer OFS may be provided between the first and second active patterns AP1 and AP2, which are adjacent to each other. For example, the outer fin spacer OFS may be in contact with the first source/drain pattern SD1.

The buffer layer BF may be provided on the inner fin spacer IFS. For example, the buffer layer BF may be provided on the inner extended portion IEP and may be interposed between the first and second inner spacer portions ISP1 and ISP2. The buffer layer BF may be formed of or include a material whose dielectric constant is higher than that of the inner fin spacer IFS. The buffer layer BF may be formed of or include at least one of materials, which are highly resistant to a dry etching process and are lowly resistant to a wet etching process. As an example, the buffer layer BF may be formed of or include aluminum oxide ($Al_2O_3$). As another example, the buffer layer BF may be formed of or include aluminum oxide ($Al_2O_3$) doped with at least one of yttrium (Y), hafnium (Hf), zirconium (Zr), or manganese (Mn). As other example, the buffer layer BF may be formed of or include yttrium oxide ($Y_2O_3$) doped with at least one of hafnium (Hf), zirconium (Zr), or manganese (Mn).

A top surface of the buffer layer BF may be located at a level that is substantially the same as or lower than a level of a top surface of the inner fin spacer IFS. As an example, the buffer layer BF may have a thickness of about 1 nm to about 50 nm.

Hereinafter, a method of fabricating a semiconductor device according to the present embodiment will be described with reference to FIGS. 20A to 20E. FIGS. 20A to 20E are sectional views illustrating a method of fabricating a semiconductor device, according to an exemplary embodiment of the present inventive concept.

Figure 20A:
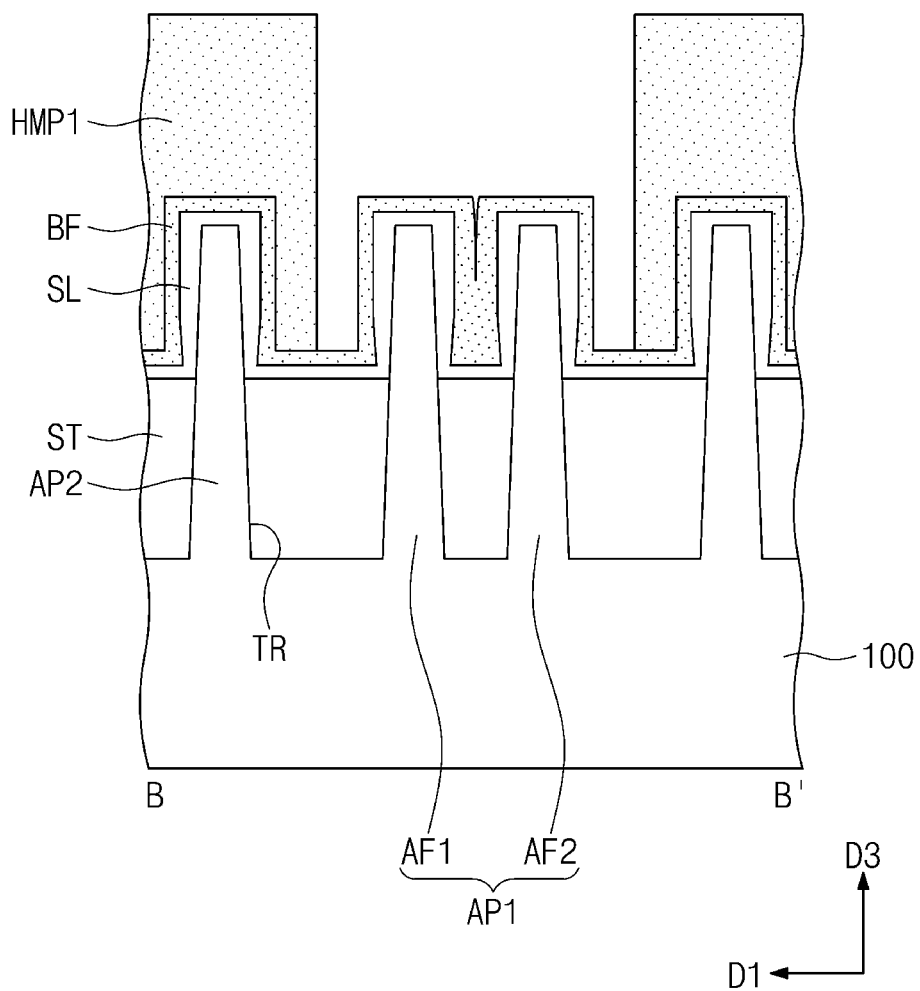
FIGS. 20A, 20B, 20C, 20D and 20E are sectional views illustrating a method of fabricating a semiconductor device, according to an exemplary embodiment of the present inventive concept.

Referring to FIG. 20A, the spacer layer SL and the buffer layer BF may be sequentially formed on the resulting structure of FIG. 6 (e.g., the device isolation layer ST and the first and second active patterns AP1 and AP2). For example, the spacer layer SL may be formed on a top surface and both side surfaces of each of the first and second active patterns AP1 and AP2. For example, the spacer layer SL may be formed on a top surface of the device isolation layer ST. The spacer layer SL may be extended to a region on the device isolation layer ST filling the trenches TR. The spacer layer SL may be formed on the substrate 100. For example, the spacer layer SL may overlap the entire top surface of the substrate 100. The spacer layer SL may be formed of or include at least one of SiCN, SiCON, and/or SiN. As another example, the spacer layer SL may be a multi-layer including at least two of SiCN, SiCON, and/or SiN.

The buffer layer BF may be formed on the spacer layer SL. For example, the buffer layer BF may be formed to fully cover the spacer layer SL. The buffer layer BF may be formed of or include a material whose dielectric constant is higher than that of the spacer layer SL. The buffer layer BF may be formed of or include at least one of materials, which are highly resistant to a dry etching process and are lowly resistant to a wet etching process. As an example, the buffer layer BF may be formed of or include aluminum oxide ($Al_2O_3$). As another example, the buffer layer BF may be formed of or include aluminum oxide ($Al_2O_3$) doped with at least one of yttrium (Y), hafnium (Hf), zirconium (Zr), and/or manganese (Mn). As other example, the buffer layer BF may be formed of or include yttrium oxide ($Y_2O_3$) doped with at least one of hafnium (Hf), zirconium (Zr), and/or manganese (Mn).

The first hard mask pattern HMP1 may be formed on the buffer layer BF. For example, the first hard mask pattern HMP1 may partially cover the second active pattern AP2. The first hard mask pattern HMP1 may be formed of or include a carbon-containing material (e.g., SOH).

Figure 20B:
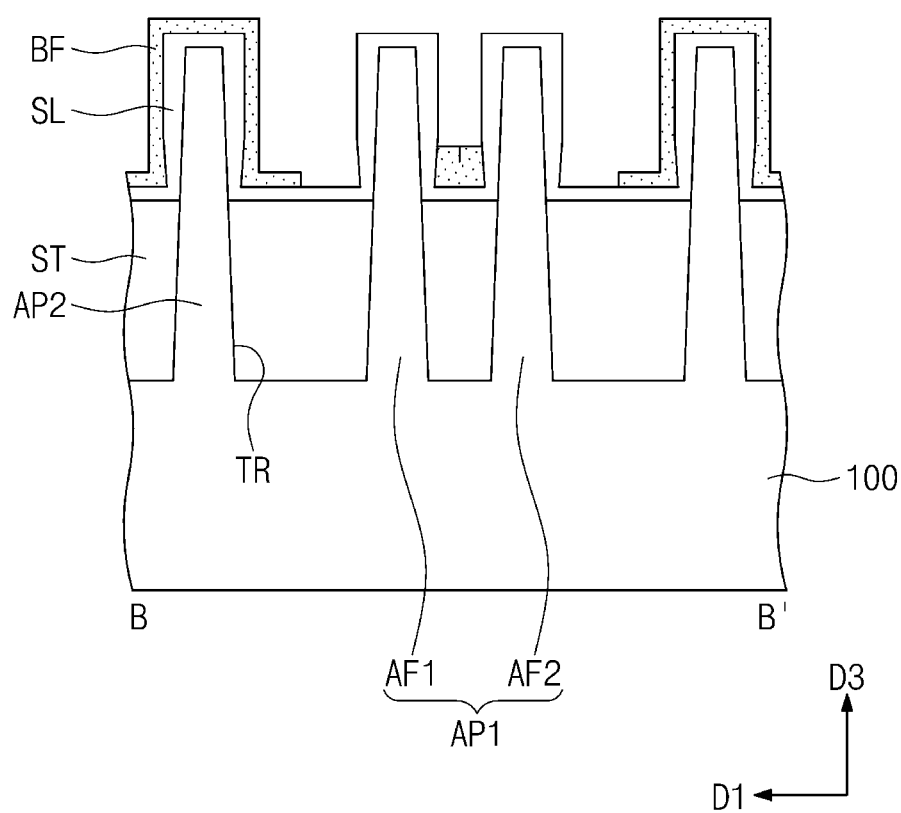

Referring to FIG. 20B, an etching process may be performed on the buffer layer BF using the first hard mask pattern HMP1 as an etch mask. The etching process may be, for example, a wet etching process. The buffer layer BF may be partially etched. Portions of the buffer layer BF may remain on the second active pattern AP2. In addition, a portion of the buffer layer BF may be left between the first and second active fins AF1 and AF2. Due to a small distance between the first and second active fins AF1 and AF2, the buffer layer BF therebetween may be formed to have a thickness that is too large to be fully removed. After the etching process, the first hard mask pattern HMP1 may be removed by, for example, an ashing process.

Figure 20C:
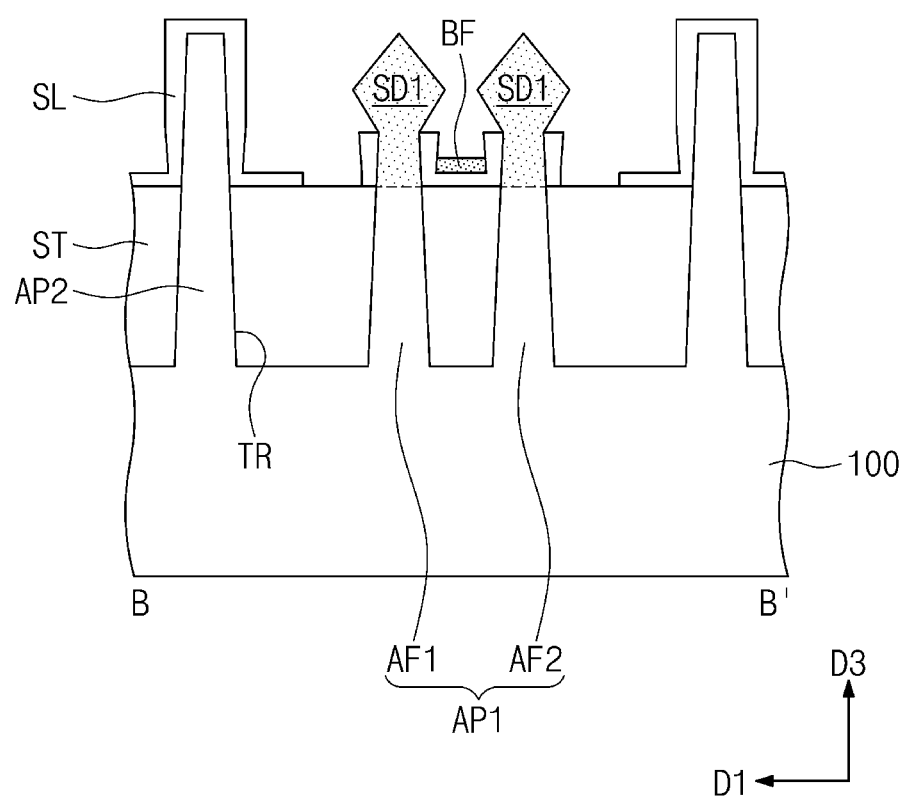

Referring to FIG. 20C, an etching process may be performed on the spacer layer SL and the first active pattern AP1 using the buffer layer BF, which remains on the second active pattern AP2, as an etch mask. For example, etching process may be a dry etching process. The spacer layer SL and the first active pattern AP1, which are not covered with the buffer layer BF, may be partially etched. For example, a first portion of the spacer layer SL, which is extended to a region on the device isolation layer ST between the first and second active patterns AP1 and AP2, a second portion of the spacer layer SL, which is provided on the top surface of the first active pattern AP1, and a third portion of the spacer layer SL, which covers both side surfaces of an upper portion of the first active pattern AP1, may be etched. First recesses may be formed in an upper portion of the first active pattern AP1.

In the case where only the hard mask pattern, without the buffer layer, is used as an etch mask, heights of the fin spacers may vary depending on positions and distances of the hard mask patterns and/or recesses in an upper portion of the active pattern may be formed to have non-uniform depths, and thus operation characteristics (e.g., an operation speed) of the semiconductor device may be deteriorated. By contrast, according to an exemplary embodiment of the present inventive concept, since the buffer layer BF is used as the etch mask, it may be possible to control the depths of the recesses to relatively uniform values. As a result, the operation characteristics (e.g., an operation speed) of the semiconductor device may be improved.

Thereafter, the buffer layer BF may be removed by, for example, a wet etching process. Here, the buffer layer BF between the first and second active fins AF1 and AF2 may not be fully removed.

The first source/drain patterns SD1 may be formed to fill the first recesses. Due to the presence of the spacer layer SL, the first source/drain patterns SD1 may be prevented from being horizontally grown.

Figure 20D:
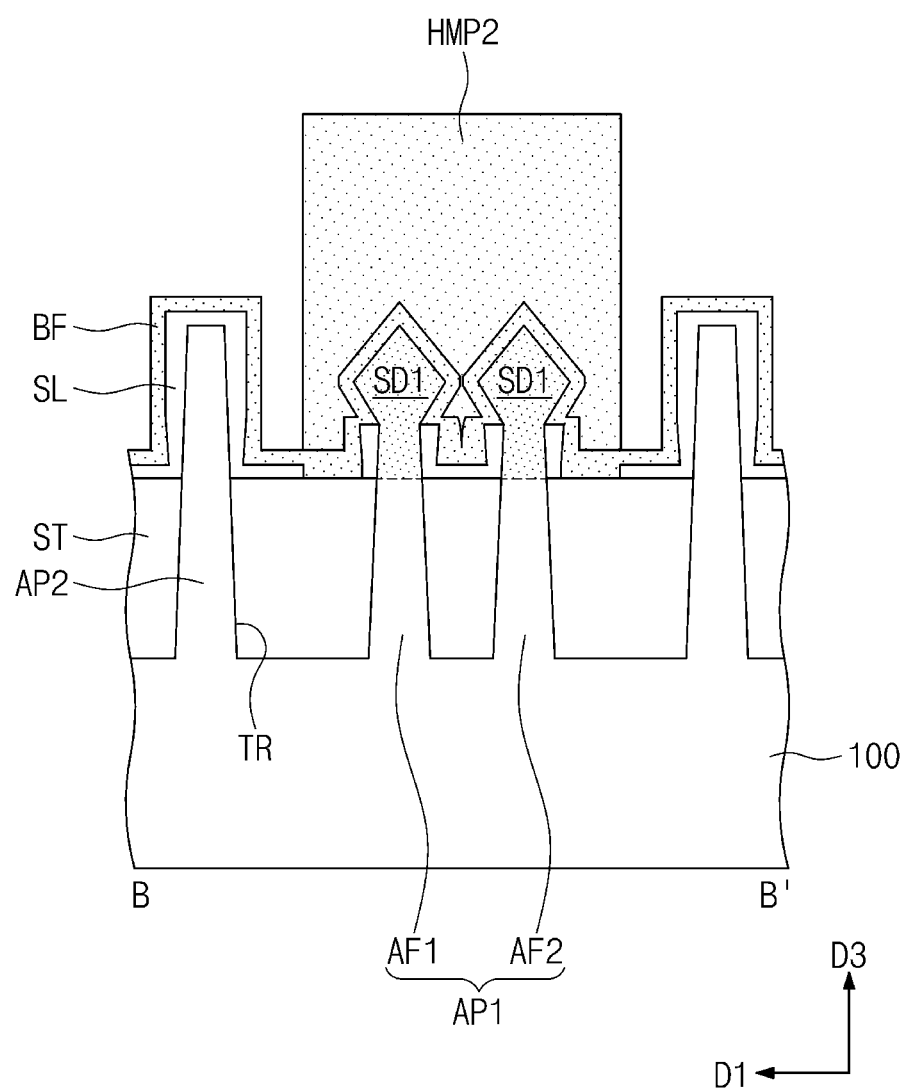

Referring to FIG. 20D, a buffer layer BF may be formed again to cover the first source/drain patterns SD1 and the spacer layer SL. The second hard mask pattern HMP2 may be formed on the buffer layer BF. The second hard mask pattern HMP2 may at least partially cover the first active pattern AP1. For example, the second hard mask pattern HMP2 may be formed of or include a carbon-containing material (e.g., SOH).

Figure 20E:
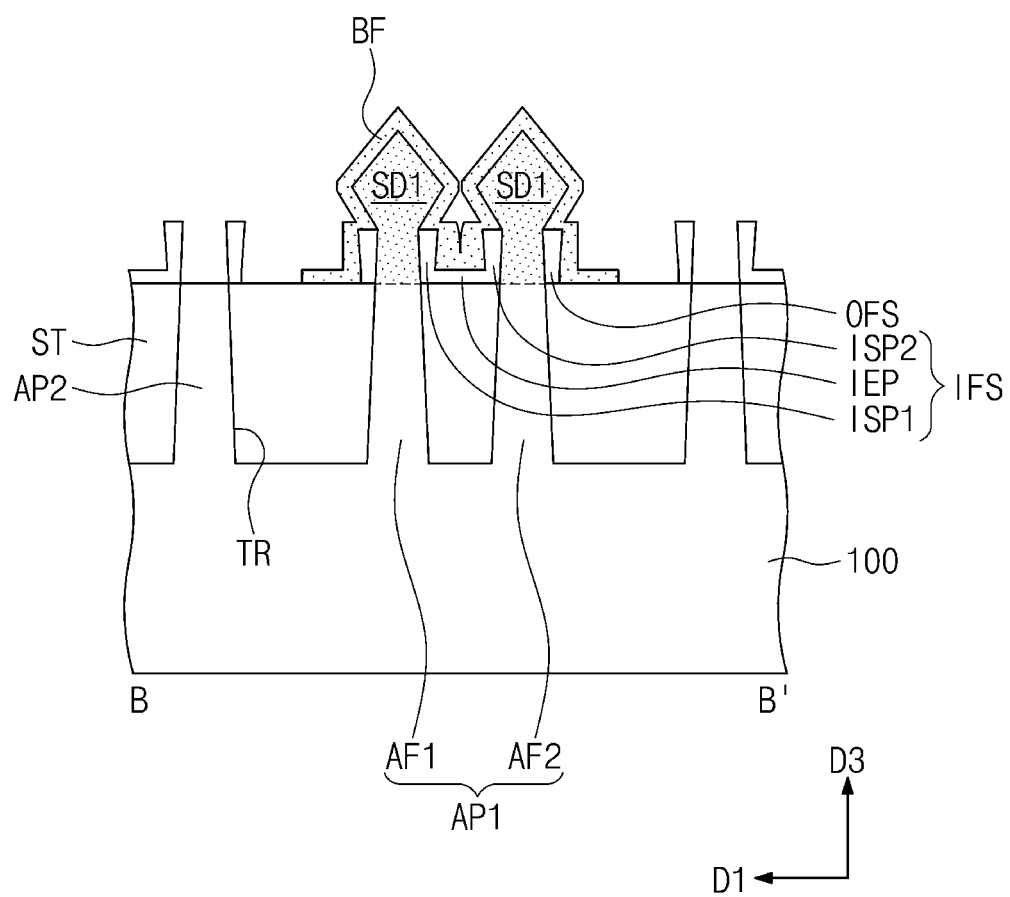

Referring to FIG. 20E, an etching process may be performed on the buffer layer BF using the second hard mask pattern HMP2 as an etch mask. The etching process may be, for example, a wet etching process. The buffer layer BF may be partially etched. The buffer layer BF may remain on the first active pattern AP1. After the etching process, the second hard mask pattern HMP2 may be removed by, for example, an ashing process.

Thereafter, an etching process may be performed on the spacer layer SL and the second active pattern AP2 using the buffer layer BF, which is on the first active pattern AP1, as an etch mask. The etching process may be, for example, a dry etching process. The spacer layer SL and the second active pattern AP2, which is not covered with the buffer layer BF, may be partially etched. A first portion of the spacer layer SL, which is extended to a region on the device isolation layer ST between the first and second active patterns AP1 and AP2, a second portion of the spacer layer SL, which is provided on the top surface of the second active pattern AP2, and a third portion of the spacer layer SL, which covers both side surfaces of an upper portion of the second active pattern AP2, may be etched. Accordingly, the inner fin spacer IFS may be formed to be interposed between adjacent first source/drain patterns SD1, and the outer fin spacer OFS may be formed to be interposed between the first and second active patterns AP1 and AP2, which are adjacent to each other. Second recesses may be formed in the upper portion of the second active pattern AP2.

Referring back to FIG. 19, a wet etching process may be performed to remove buffer layer BF. In certain cases, even when the wet etching process is finished, a portion of the buffer layer BF may remain on the inner fin spacer IFS. Due to a small distance between the first and second active fins AF1 and AF2, the buffer layer BF may have a thickness that is too large to be fully removed. The buffer layer BF remaining on the inner fin spacer IFS may prevent the inner fin spacer IFS from being damaged by a subsequent (e.g., pre-cleaning) process. As a result, electric characteristics of the semiconductor device may be improved.

Thereafter, the second source/drain patterns SD2 may be formed to fill the second recesses. The first interlayer insulating layer 110 may be formed to cover the first and second source/drain patterns SD1 and SD2. As an example, the first interlayer insulating layer 110 may include a silicon oxide layer.

The active contacts AC may be formed to penetrate the first interlayer insulating layer 110 and may be electrically connected to the first and second source/drain patterns SD1 and SD2.

The formation of the active contacts AC may include forming contact holes, and forming the barrier pattern BM to partially fill the contact holes. The formation may further include forming the conductive pattern FM on the barrier pattern BM.

The second interlayer insulating layer 120 may be formed on the first interlayer insulating layer 110. The first metal layer M1 may be formed in the second interlayer insulating layer 120. The formation of the first metal layer M1 may include forming the first bit line BL1, the second bit line BL2, and the power line VDD.

The third interlayer insulating layer 130 may be formed on the second interlayer insulating layer 120. The second metal layer M2 may be formed in the third interlayer insulating layer 130. The formation of the second metal layer M2 may include forming the interconnection patterns IL.

Figure 21:
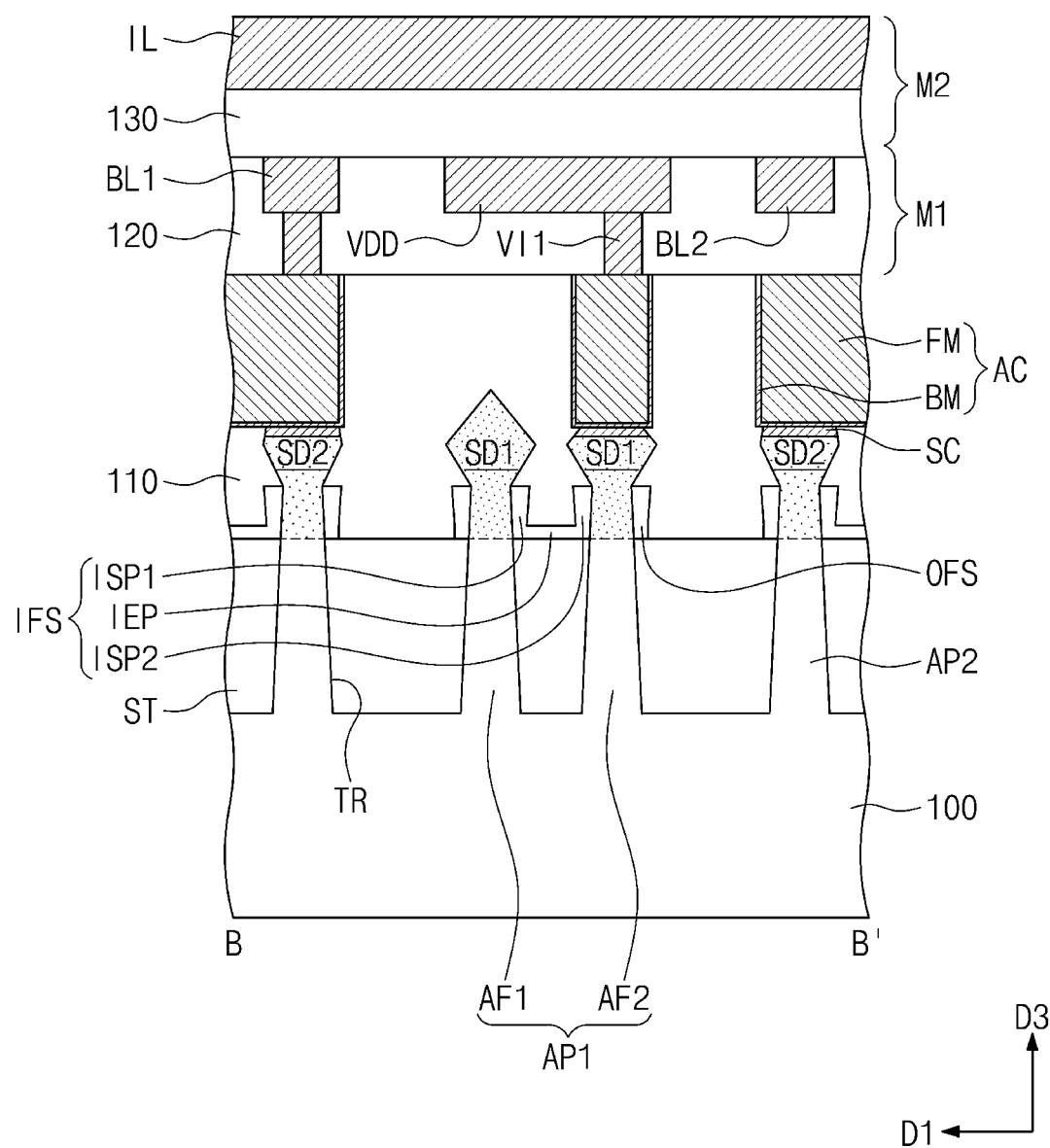
FIG. 21 is a sectional view illustrating a semiconductor device according to an exemplary embodiment of the present inventive concept.

FIG. 21 is a sectional view illustrating a semiconductor device according to an exemplary embodiment of the present inventive concept. Referring to FIG. 21, the buffer layer BF may not be provided on the inner fin spacer IFS. For example, since the buffer layer BF is fully removed, the buffer layer BF may not remain on the inner fin spacer IFS.

Figure 22A:
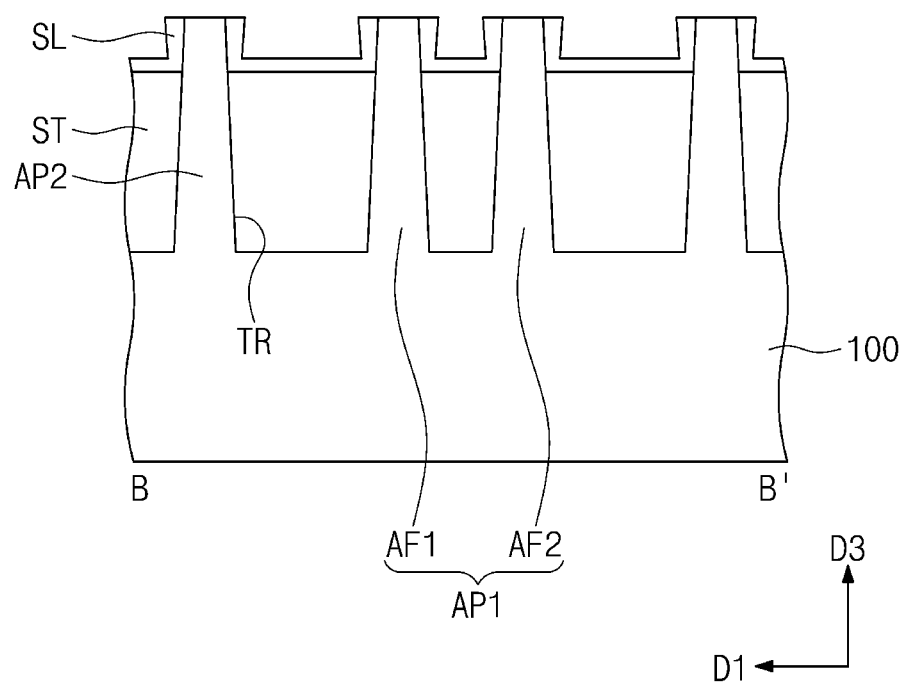
FIGS. 22A, 22B, and 22C are sectional views illustrating a method of fabricating a semiconductor device, according to an exemplary embodiment of the present inventive concept.
Figure 22B:
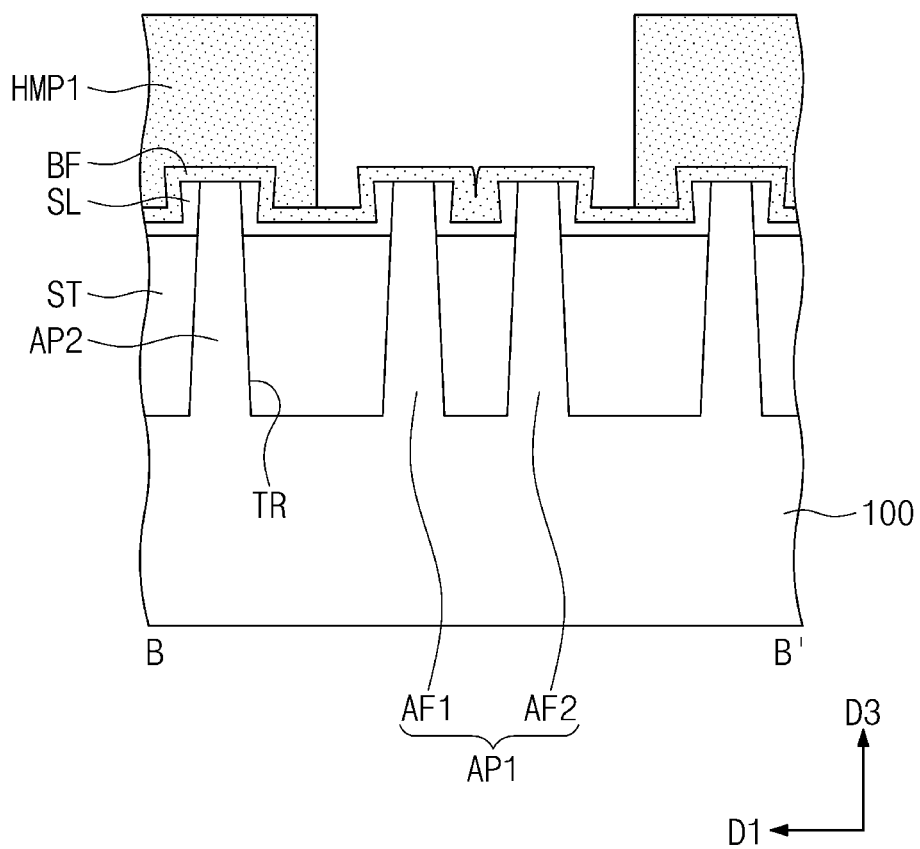
Figure 22C:
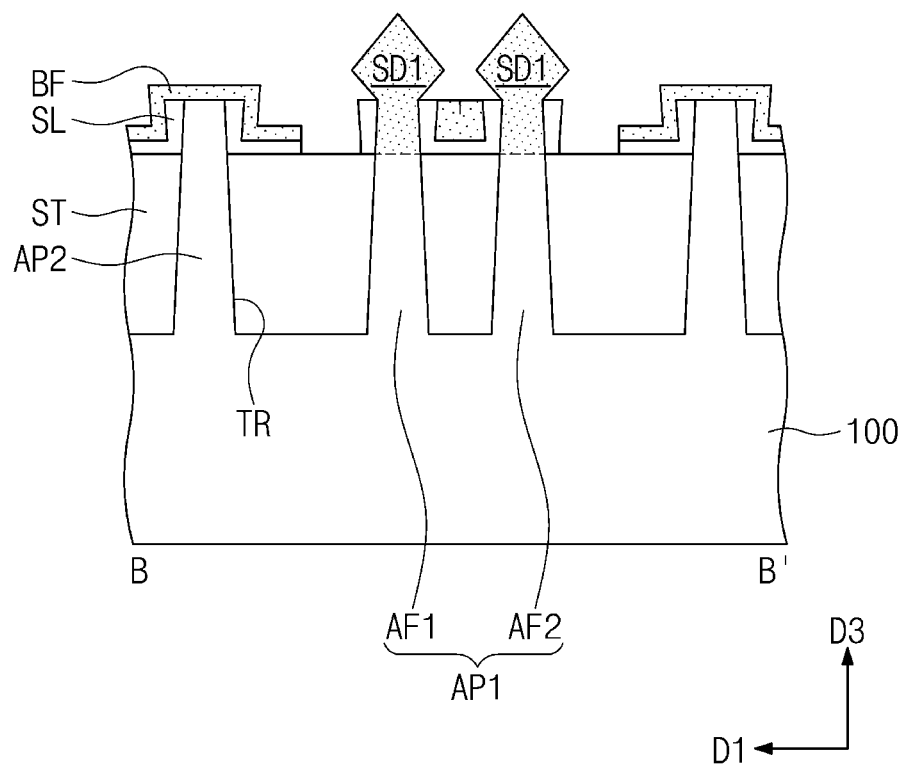

FIGS. 22A to 22C are sectional views illustrating a method of fabricating a semiconductor device, according to an exemplary embodiment of the present inventive concept.

Referring to FIG. 22A, the spacer layer SL may be formed on the resulting structure of FIG. 6. The spacer layer SL may be formed on a top surface and both side surfaces of each of the first and second active patterns AP1 and AP2. The spacer layer SL may be extended to a region on the device isolation layer ST filling the trenches TR. The spacer layer SL may be disposed on the substrate 100. For example, the spacer layer SL may be formed on the entire top surface of the substrate 100.

An upper portion of the spacer layer SL and upper portions of the first and second active patterns AP1 and AP2 may be etched. Here, top surfaces of the remaining portions of the first and second active patterns AP1 and AP2 may be located at a level that is higher than a top surface of the device isolation layer ST and is the same as a top surface of the spacer layer SL. For example, the remaining upper portions of the first and second active patterns AP1 and AP2 may protrude above the device isolation layer ST.

Referring to FIG. 22B, the buffer layer BF may be formed on the top surfaces of the first and second active patterns AP1 and AP2 and the spacer layer SL.

The first hard mask pattern HMP1 may be formed on the buffer layer BF. The first hard mask pattern HMP1 may at least partially cover the second active pattern AP2. The first hard mask pattern HMP1 may be formed of or include a carbon-containing material (e.g., SOH).

Referring to FIG. 22C, an etching process may be performed on the buffer layer BF, the spacer layer SL, and the first active pattern AP1 using the first hard mask pattern HMP1 as an etch mask. A portion of the buffer layer BF, a portion of the spacer layer SL, and an upper portion of the first active pattern AP1, which are exposed by the first hard mask pattern HMP1, may be etched. Next, the first hard mask pattern HMP1 may be removed by, for example, an ashing process.

First recesses may be formed in an upper portion of the first active pattern AP1. The first source/drain patterns SD1 may be formed to fill the first recesses.

After the formation of the first source/drain patterns SD1, a wet etching process may be performed to remove the buffer layer BF. In certain case, even when the wet etching process is finished, the buffer layer BF may partially remain between the first and second active fins AF1 and AF2.

Thereafter, the process may be substantially the same as the process described with reference to FIGS. 20D and 20E. Similar to the process described with reference to FIG. 20D, a buffer layer BF may be formed again to cover the first source/drain patterns SD1 and the spacer layer SL. The second hard mask pattern HMP2 may be formed on the buffer layer BF. The second hard mask pattern HMP2 may at least partially cover the first active pattern AP1. The second hard mask pattern HMP2 may be formed of or include a carbon-containing material (e.g., SOH).

Next, similar to the process described with reference to FIG. 20E, an etching process may be performed on the buffer layer BF using the second hard mask pattern HMP2 as an etch mask. The etching process may be, for example, a wet etching process. The buffer layer BF may be partially etched. The buffer layer BF may remain on the first active pattern AP1. After the etching process, the second hard mask pattern HMP2 may be removed by an ashing process.

An etching process may be performed on the spacer layer SL and the second active pattern AP2 using the buffer layer BF, which is on the first active pattern AP1, as an etch mask. The etching process may be, for example, a dry etching process. The spacer layer SL and the second active pattern AP2, which is not covered with the buffer layer BF, may be partially etched. For example, the spacer layer SL, which is extended to a region on the device isolation layer ST between the first and second active patterns AP1 and AP2, may be etched. Accordingly, the inner fin spacer IFS may be formed to be interposed between adjacent first source/drain patterns SD1, and the outer fin spacer OFS may be formed to be interposed between the first and second active patterns AP1 and AP2, which are adjacent to each other. Second recesses may be formed in the upper portion of the second active pattern AP2.

Referring back to FIG. 19, the second source/drain patterns SD2 may be formed to fill the second recesses. After the formation of the second source/drain patterns SD2, a wet etching process may be performed to remove the buffer layer BF. In certain cases, even when the wet etching process is finished, a portion of the buffer layer BF may remain on the inner fin spacer IFS.

The first interlayer insulating layer 110 may be formed to cover the first and second source/drain patterns SD1 and SD2. The active contacts AC may be formed to penetrate the first interlayer insulating layer 110 and may be electrically connected to the first and second source/drain patterns SD1 and SD2. The second interlayer insulating layer 120 may be formed on the first interlayer insulating layer 110, and the third interlayer insulating layer 130 may be formed on the second interlayer insulating layer 120.

Figure 23A:
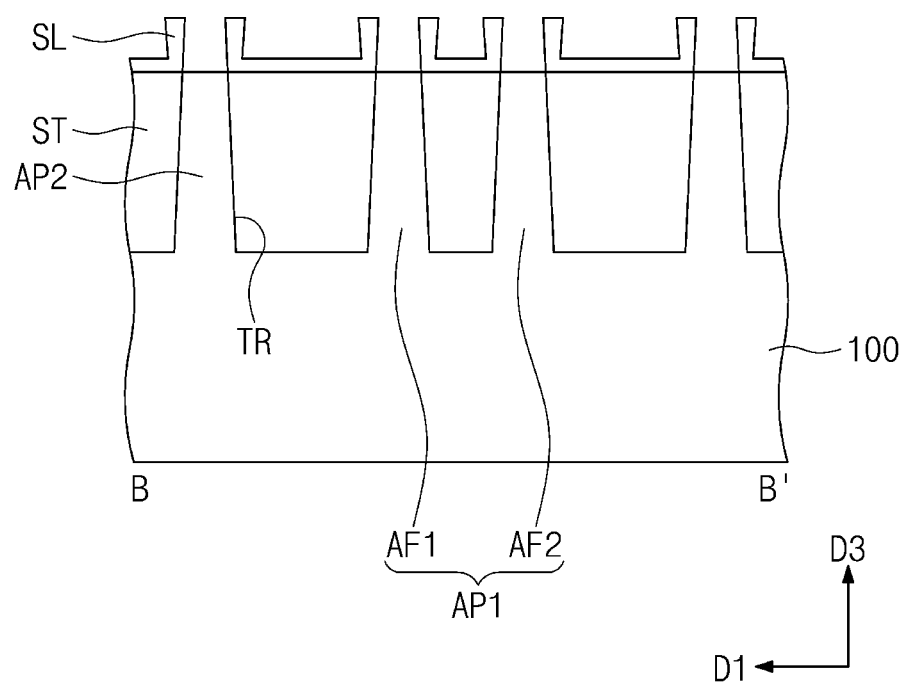
FIGS. 23A, 23B and 23C are sectional views illustrating a method of fabricating a semiconductor device, according to an exemplary embodiment of the present inventive concept.
Figure 23B:
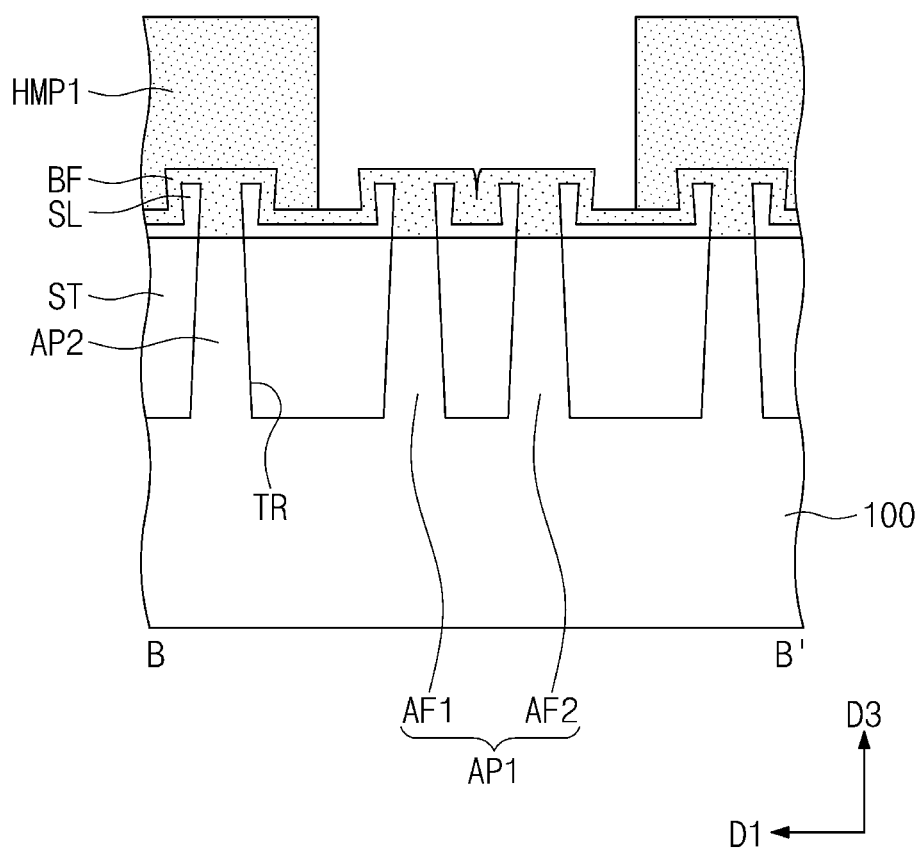
Figure 23C:
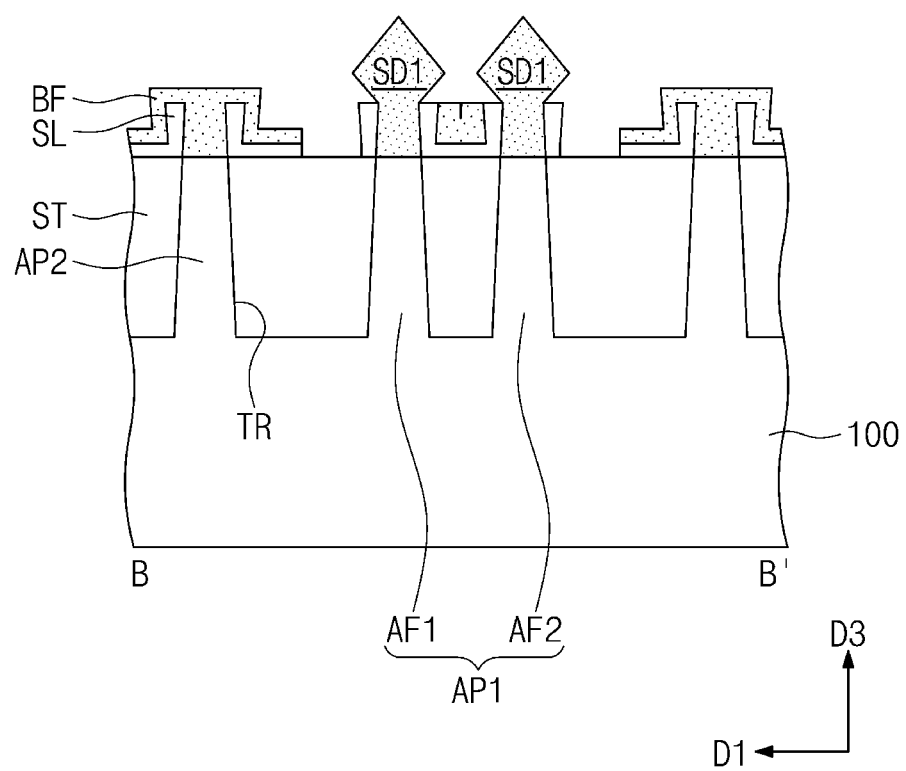

FIGS. 23A to 23C are sectional views illustrating a method of fabricating a semiconductor device, according to an exemplary embodiment of the present inventive concept.

Referring to FIG. 23A, the spacer layer SL may be formed on the resulting structure of FIG. 6. The spacer layer SL may be formed on a top surface and both side surfaces of each of the first and second active patterns AP1 and AP2. The spacer layer SL may be extended to a region on the device isolation layer ST filling the trenches TR. The spacer layer SL may overlap the substrate 100. For example, the spacer layer SL may be formed to fully cover the substrate 100.

An upper portion of the spacer layer SL and upper portions of the first and second active patterns AP1 and AP2 may be etched. First and second recesses may be respectively formed in upper portions of the first and second active patterns AP1 and AP2. Here, the first and second recesses may be provided by the spacer layer SL. The remaining portions of the first and second active patterns AP1 and AP2 may not protrude above the device isolation layer ST.

Referring to FIG. 23B, the buffer layer BF may be formed on the spacer layer SL. The buffer layer BF may fill the first and second recesses. For example, a portion of the buffer layer BF may be disposed in openings in the spacer layer SL.

The first hard mask pattern HMP1 may be formed on the buffer layer BF. The first hard mask pattern HMP1 may partially cover the second active pattern AP2. The first hard mask pattern HMP1 may be formed of or include, for example, a carbon-containing material (e.g., SOH).

Referring to FIG. 23C, an etching process may be performed on the buffer layer BF and the spacer layer SL using the first hard mask pattern HMP1 as an etch mask. A portion of the buffer layer BF and a portion of the spacer layer SL, which are exposed by the first hard mask pattern HMP1, may be etched. Here, the buffer layer BF in the first recesses may be etched. The first hard mask pattern HMP1 may be removed by, for example, an ashing process.

After the removal of the first hard mask pattern HMP1, the first source/drain patterns SD1 may be formed to fill the first recesses.

After the formation of the first source/drain patterns SD1, a wet etching process may be performed to remove the buffer layer BF. In certain case, even when the wet etching process is finished, the buffer layer BF may partially remain between the first and second active fins AF1 and AF2.

Thereafter, the process may be substantially the same as the process described with reference to FIGS. 20D and 20E. Similar to the process described with reference to FIG. 20D, a buffer layer BF may be formed again to cover the first source/drain patterns SD1 and the spacer layer SL. The second hard mask pattern HMP2 may be formed on the buffer layer BF. The second hard mask pattern HMP2 may at least partially cover the first active pattern AP1. The second hard mask pattern HMP2 may be formed of or include a carbon-containing material (e.g., SOH).

Next, similar to the process described with reference to FIG. 20E, an etching process may be performed on the buffer layer BF using the second hard mask pattern HMP2 as an etch mask. The etching process may be, for example, a wet etching process. The buffer layer BF may be partially etched. Here, the buffer layer BF in the second recesses may be etched. The buffer layer BF may remain on the first active pattern AP1. After the etching process, the second hard mask pattern HMP2 may be removed by an ashing process.

Thereafter, an etching process may be performed on the spacer layer SL using the buffer layer BF, which is on the first active pattern AP1, as an etch mask. The etching process may be, for example, a dry etching process. The spacer layer SL, which is not covered with the buffer layer BF, may be partially etched. For example, the spacer layer SL, which is extended to a region on the device isolation layer ST between the first and second active patterns AP1 and AP2, may be etched. Accordingly, the inner fin spacer IFS may be formed to be interposed between adjacent first source/drain patterns SD1, and the outer fin spacer OFS may be formed to be interposed between the first and second active patterns AP1 and AP2, which are adjacent to each other.

Referring back to FIG. 19, the second source/drain patterns SD2 may be formed to fill the second recesses. After the formation of the second source/drain patterns SD2, a wet etching process may be performed to remove the buffer layer BF. In certain cases, even when the wet etching process is finished, a portion of the buffer layer BF may remain on the inner fin spacer IFS.

The first interlayer insulating layer 110 may be formed to cover the first and second source/drain patterns SD1 and SD2. The active contacts AC may be formed to penetrate the first interlayer insulating layer 110 and may be electrically connected to the first and second source/drain patterns SD1 and SD2. The second interlayer insulating layer 120 may be formed on the first interlayer insulating layer 110, and the third interlayer insulating layer 130 may be formed on the second interlayer insulating layer 120.

FIGS. 24A to 24D are sectional views, which are taken along the lines A-A', B-B', C-C', and D-D' of FIG. 2 to illustrate a semiconductor device according to an exemplary embodiment of the present inventive concept. In the following description, an element previously described with reference to FIGS. 2 and 3A to 3D may be identified by the same reference number without repeating an overlapping or redundant description thereof.

Referring to FIGS. 2 and 24A to 24D, the device isolation layer ST may be provided on the substrate 100 to realize the SRAM cell. The device isolation layer ST may be provided to form the first and second active patterns AP1 and AP2.

The first active pattern AP1 may include the first channel patterns CH1, which are vertically stacked. The stacked first channel patterns CH1 may be spaced apart from each other in a third direction D3. The stacked first channel patterns CH1 may be overlapped with each other, when viewed in a plan view. The second active pattern AP2 may include the second channel patterns CH2, which are vertically stacked. The stacked second channel patterns CH2 may be spaced apart from each other in the third direction D3. The stacked second channel patterns CH2 may be overlapped with each other, when viewed in a plan view. The first and second channel patterns CH1 and CH2 may each be formed of or include at least one of silicon (Si), germanium (Ge), and/or silicon-germanium (SiGe).

The first active pattern AP1 may further include the first source/drain patterns SD1. The stacked first channel patterns CH1 may be interposed between each adjacent pair of the first source/drain patterns SD1. The stacked first channel patterns CH1 may connect the adjacent pair of the first source/drain patterns SD1 to each other.

The second active pattern AP2 may further include the second source/drain patterns SD2. The stacked second channel patterns CH2 may be interposed between each adjacent pair of the second source/drain patterns SD2. The stacked second channel patterns CH2 may connect the adjacent pair of the second source/drain patterns SD2 to each other.

The gate electrodes GE may be provided to overlap the first and second channel patterns CH1 and CH2 and to extend in the first direction D1. The gate electrode GE may be vertically overlapped with the first and second channel patterns CH1 and CH2. A pair of the gate spacers GS may be disposed on opposite side surfaces of the gate electrode GE. The gate capping pattern GP may be provided on the gate electrode GE.

Figure 24A:
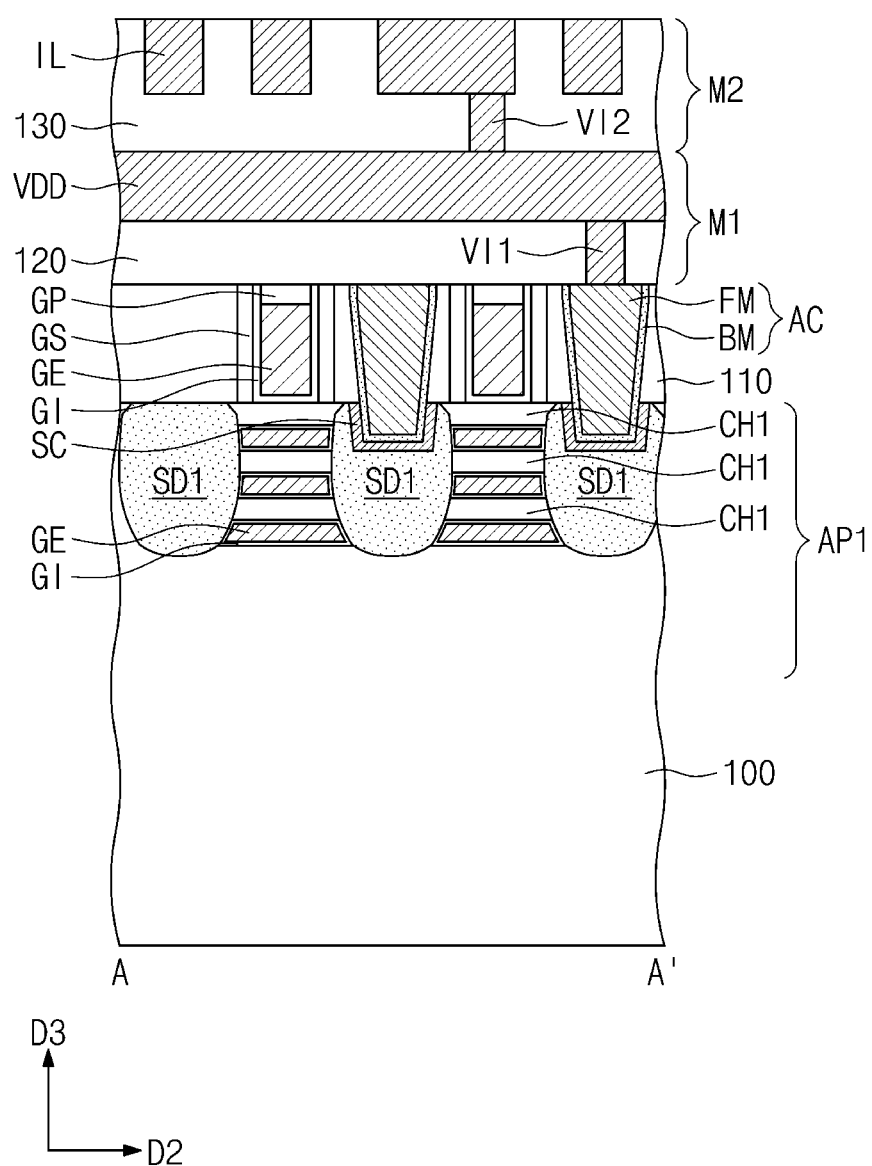
FIGS. 24A, 24B, 24C and 24D are sectional views, which are taken along the lines A-A', B-B', C-C', and D-D' of FIG. 2 to illustrate a semiconductor device according to an exemplary embodiment of the present inventive concept.
Figure 24B:
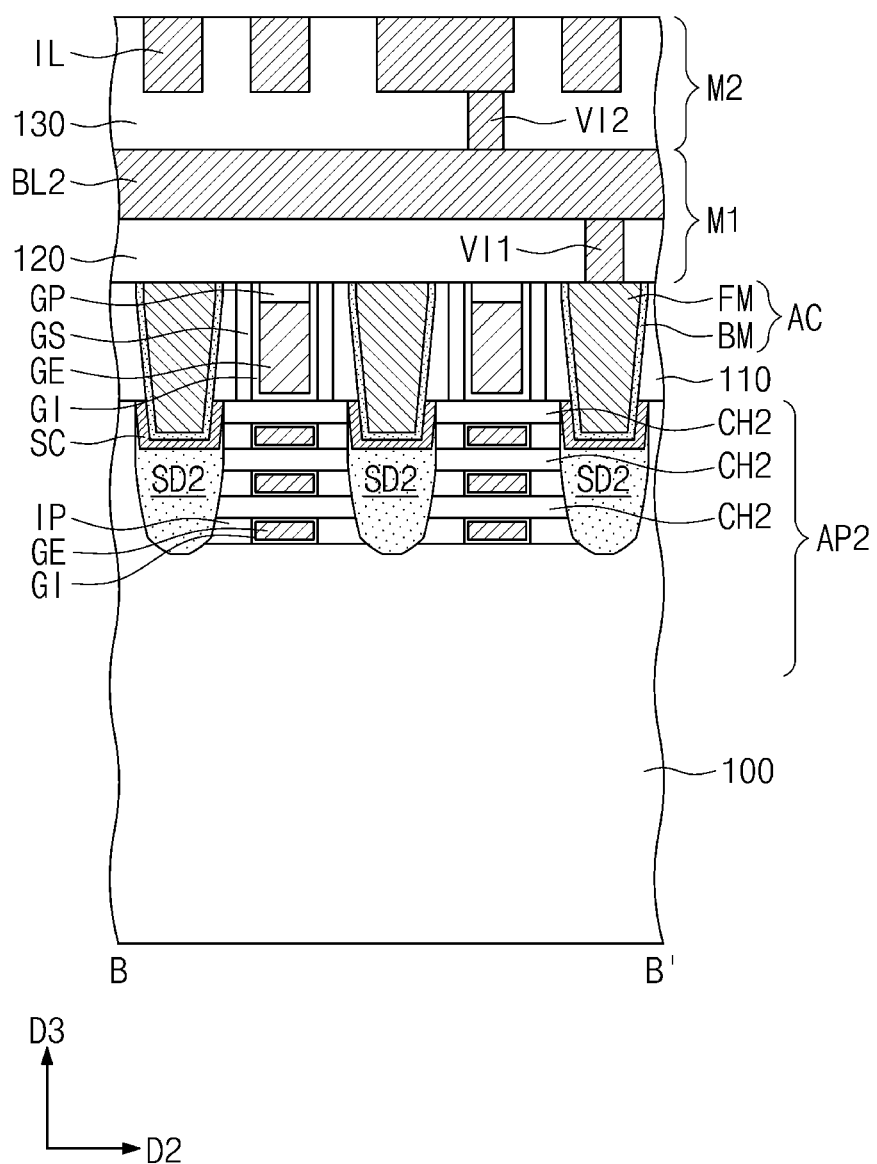
Figure 24C:
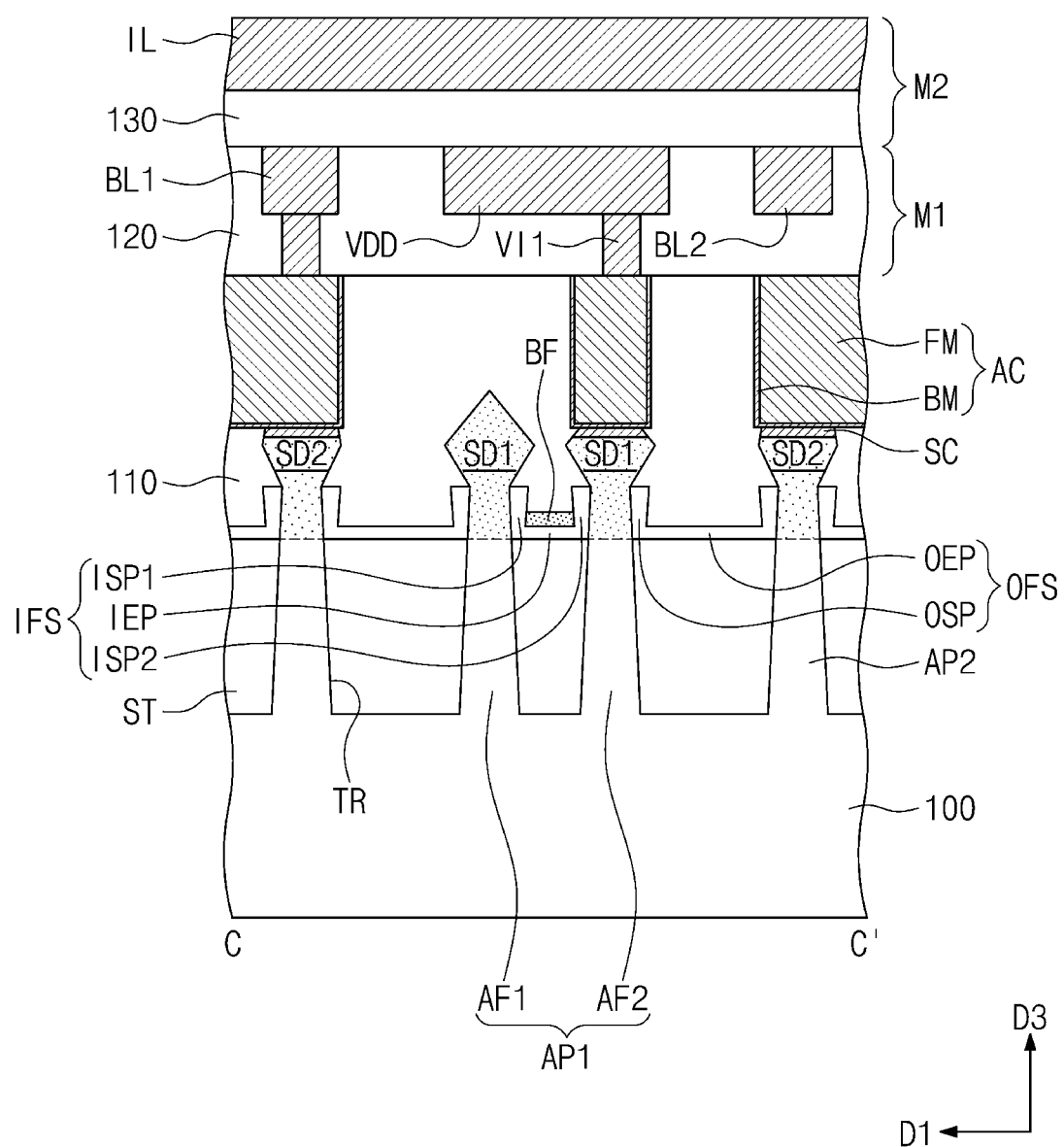
Figure 24D:
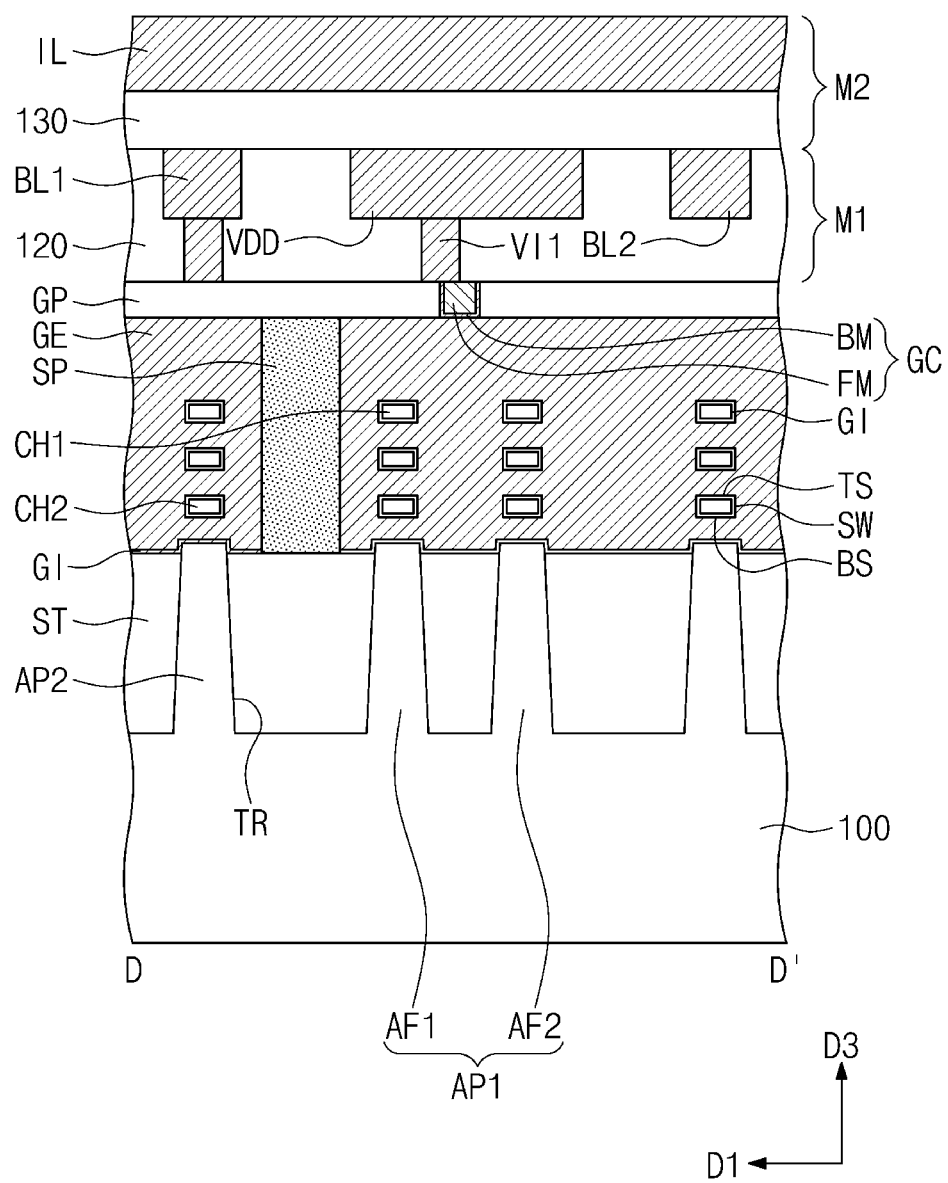

The gate electrode GE may be provided to surround each of the first and second channel patterns CH1 and CH2 (e.g., see FIG. 24D). The gate electrode GE may be provided on a top surface TS, at least one side surface SW, and a bottom surface BS of each of the first and second channel patterns CH1 and CH2. For example, the gate electrode GE may be provided to face the top surface TS, the bottom surface BS, and the opposite side surfaces SW of each of the first and second channel patterns CH1 and CH2. A transistor according to the present embodiment may be a three-dimensional field-effect transistor (e.g., a multi-bridge channel field-effect transistor (MBCFET)), in which the gate electrode GE is provided to three-dimensionally surround the channel patterns CH1 and CH2.

The gate dielectric pattern GI may be provided between the first channel patterns CH1 and the gate electrode GE and between the second channel patterns CH2 and the gate electrode GE. The gate dielectric pattern GI may be provided to surround each of the first and second channel patterns CH1 and CH2.

An insulating pattern IP may be interposed between the gate dielectric pattern GI and the second source/drain pattern SD2. The gate electrode GE may be spaced apart from the second source/drain pattern SD2 by the gate dielectric pattern GI and the insulating pattern IP. However, the insulating pattern IP may be omitted from a region on the first active pattern AP1.

The inner fin spacer IFS may be interposed between the first source/drain patterns SD1, which are adjacent to each other. The outer fin spacer OFS may be interposed between the first and second source/drain patterns SD1 and SD2, which are adjacent to each other. The buffer layer BF may be provided on the inner fin spacer IFS.

The first interlayer insulating layer 110 may be provided to cover the substrate 100. For example, the first interlayer insulating layer 110 may fully cover the substrate 100. The active contacts AC may be provided to penetrate the first interlayer insulating layer 110 and may be connected to the first and second source/drain patterns SD1 and SD2, respectively. The gate contacts GC may be provided to penetrate the gate capping pattern GP and may be connected to the gate electrodes GE, respectively. The inner fin spacer IFS, the outer fin spacer OFS, the buffer layer BF, the active contacts AC, and the gate contacts GC may be configured to have substantially the same features as those previously described with reference to FIGS. 2, 3A to 3D, and 4A to 4D.

The second interlayer insulating layer 120 may be provided on the first interlayer insulating layer 110. The third interlayer insulating layer 130 may be provided on the second interlayer insulating layer 120. The first metal layer M1 may be provided in the second interlayer insulating layer 120. The second metal layer M2 may be provided in the third interlayer insulating layer 130.

According to an exemplary embodiment of the present inventive concept, a semiconductor device may include an inner fin spacer and an outer fin spacer, and thus, it may be possible to adjust horizontal growth of source/drain patterns and thereby prevent a short circuit from being formed between the source/drain patterns. Accordingly, an integration density of the semiconductor device may be increased. In addition, recess depths of active patterns and heights of fin spacers may be uniformly controlled, and a device isolation layer may be prevented from being recessed. As a result, it may be possible to improve electric characteristics and reliability of the semiconductor device according to an exemplary embodiment of the present inventive concept.

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. A semiconductor device, comprising:
a first active pattern on a substrate, wherein the first active pattern comprises a first active fin and a second active fin, which are adjacent to each other in a first direction;
a device isolation layer defining the first active pattern;
a gate electrode crossing the first active pattern;
a first source/drain pattern and a second source/drain pattern provided on the first active fin and the second active fin, respectively;
an inner fin spacer interposed between the first and second source/drain patterns; and
a buffer layer provided on the device isolation layer between the first and second active fins,
wherein the inner fin spacer comprises:
a first inner spacer portion contacting the first source/drain pattern;
a second inner spacer portion contacting the second source/drain pattern; and
an inner extended portion extending from the first and second inner spacer portions, wherein the inner extended portion is between the first and second active fins,
wherein the buffer layer has a dielectric constant higher than a dielectric constant of the inner fin spacer,
wherein a top surface of the buffer layer is at a level lower than a top surface of the inner fin spacer.

2. The semiconductor device of claim 1, wherein the buffer layer is located on the inner extended portion and is interposed between the first and second inner spacer portions.

3. The semiconductor device of claim 1, wherein each of the first and second source/drain patterns comprises:
a first portion in contact with the inner fin spacer; and
a second portion provided on the first portion,
wherein the first portion comprises a first side surface and a second side surface, wherein the first side surface is adjacent to the device isolation layer between the first and second active fins, and the second side surface is opposite to the first side surface in the first direction, and
a largest width of the first portion in the first direction is smaller than a largest width of the second portion in the first direction.

4. The semiconductor device of claim 3, wherein the first inner spacer portion is in contact with the first side surface of the first source/drain pattern, and
the second inner spacer portion is in contact with the first side surface of the second source/drain pattern.

5. The semiconductor device of claim 3, further comprising:
a second active pattern provided on the substrate and spaced apart from the first active pattern in the first direction; and
an outer fin spacer provided between the first active pattern and second active pattern, which are adjacent to each other.

6. The semiconductor device of claim 5, wherein the outer fin spacer comprises an outer spacer portion in contact with the second side surface of the first source/drain pattern, and
wherein a topmost portion of the outer spacer portion has a width larger than that of a bottommost portion of the outer spacer portion.

7. The semiconductor device of claim 6, wherein the outer fin spacer further comprises an outer extended portion extending from the outer spacer portion to a region on the device isolation layer between the first and second active patterns, and
a width of the inner fin spacer in the first direction is smaller than a width of the outer fin spacer in the first direction.

8. The semiconductor device of claim 5, wherein a highest level of the top surface of the inner fin spacer and a highest level of a top surface of the outer fin spacer are located at substantially a same level as each other.

9. The semiconductor device of claim 1, wherein each of the first and second inner spacer portions has a bottommost portion and a topmost portion wider than the bottommost portion.

10. The semiconductor device of claim 1, wherein the buffer layer comprises aluminum oxide and has a thickness of about 1 nm to about 50 nm.

11. A semiconductor device, comprising:
a substrate having a first active fin and a second active fin, which are spaced apart from each other in a first direction;
a device isolation layer defining the first and second active fins;
a gate electrode extended in the first direction to cross the first and second active fins;
first and second source/drain patterns respectively provided in upper portions of the first and second active fins, and wherein each of the first source/drain pattern and the second source/drain pattern comprises a first portion and a second portion on the first portion;

an inner fin spacer interposed between the first and second source/drain patterns and in contact with a first side surface of the first portion of each of the first and second source/drain patterns; and a buffer layer provided on the inner fin spacer, wherein the buffer layer has a dielectric constant higher than a dielectric constant of the inner fin spacer, wherein the inner fin spacer comprises:

a first inner spacer portion in contact with the first side surface of the first source/drain pattern; and a second inner spacer portion in contact with the first side surface of the second source/drain pattern, wherein each of the first and second inner spacer portions has a bottommost portion and a topmost portion wider than the bottommost portion.

12. The semiconductor device of claim 11, wherein the inner fin spacer further comprises:

an inner extended portion extending from the first and second inner spacer portions, wherein the inner extended portion is between the first and second active fins, wherein the buffer layer is located on the inner extended portion and is interposed between the first and second inner spacer portions.

13. The semiconductor device of claim 12, further comprising an outer fin spacer that is in contact with a second side surface opposite to the first side surface of the first source/drain pattern, wherein a topmost portion of the outer fin spacer has a width larger than that of a bottommost portion of the outer fin spacer.

14. The semiconductor device of claim 13, wherein a highest level of a top surface of the inner fin spacer and a highest level of a top surface of the outer fin spacer are located at substantially a same level as each other.

15. The semiconductor device of claim 13, herein the first portion of t first source/drain pattern is interposed between the inner fin spacer and the outer fin spacer.

16. A semiconductor device, comprising:

a first active pattern on a substrate, wherein the first active pattern comprises a first active fin and a second active fin spaced apart from each other in a first direction and extending in a second direction crossing the first direction;

a device isolation layer provided on the substrate to define the first and second active fins, wherein upper portions of the first and second active fins protrude beyond the device isolation layer;

a gate electrode extended in the first direction to cross the first and second active fins;

a first source/drain pattern and a second source/drain pattern respectively provided on the first and second active fins and having a same conductivity type, wherein the first and second source/drain patterns being arranged along side portions of the gate electrode in the first direction;

a gate spacer provided on the side portions of the gate electrode and extending in the first direction;

a gate capping pattern on the gate electrode;

an interlayer insulating layer on the gate capping pattern;

an active contact provided to penetrate the interlayer insulating layer and coupled to at least one of the first source/drain pattern or the second source/drain pattern;

a silicide pattern interposed between the active contact and the at least one of the first source/drain pattern or the second source/drain pattern;

a gate contact penetrating the gate capping pattern and coupled to the gate electrode;

an inner fin spacer interposed between the first and second source/drain patterns;

a buffer layer provided on the inner fin spacer and having a dielectric constant higher than a dielectric constant of the inner fin spacer;

a first metal layer provided on the interlayer insulating layer and electrically connected to the active contact and the gate contact; and a second metal layer provided on the first metal layer and electrically connected to the first metal layer, wherein the gate spacer and the inner fin spacer comprises a same material as each other.

17. The semiconductor device of claim 16, wherein each of the first and second source/drain patterns comprises:

a first portion in contact with the inner fin spacer; and a second portion on the first portion, wherein the first portion comprises a first side surface and a second side surface, wherein the first side surface is adjacent to the device isolation layer between the first and second active fins; and the second side surface is opposite to the first side surface, and wherein a largest width of the first portion in the first direction is smaller than a largest width of the second portion in the first direction.

18. The semiconductor device of claim 17, wherein the inner fin spacer comprises:

a first inner spacer portion in contact with the first side surface of the first source/drain pattern;

a second inner spacer portion in contact with the first side surface of the second source/drain pattern; and an inner extended portion extending from the first and second inner spacer portions to a region on the device isolation layer between the first and second active fins, wherein the buffer layer is located on the inner extended portion and is interposed between the first and second inner spacer portions, and wherein each of the first and second inner spacer portions has a bottommost portion and a topmost portion wider than the bottommost portion.

19. The semiconductor device of claim 17, further comprising:

a second active pattern provided on the substrate and spaced apart from the first active pattern; and an outer fin spacer provided between the first active pattern and second active pattern, which are adjacent to each other, wherein the outer fin spacer comprises:

an outer spacer portion in contact with the second side surface of the first source/drain pattern; and an outer extended portion extending from the outer spacer portion to a region on the device isolation layer between the first and second active patterns.

20. The semiconductor device of claim 19, wherein a highest level of a top surface of the inner fin spacer and a highest level of a top surface of the outer fin spacer are located at substantially a same level as each other, and the buffer layer comprises aluminum oxide and has a thickness of about 1 of to about 50 nm.

* * * * *